(12) United States Patent
Agazzi

(10) Patent No.: US 7,672,368 B2
(45) Date of Patent: Mar. 2, 2010

(54) PHY CONTROL MODULE FOR A MULTI-PAIR GIGABIT TRANSCEIVER

(75) Inventor: Oscar E. Agazzi, Irvine, CA (US)

(73) Assignee: Broadcom Corporation

( * ) Notice: Subject to any disclaimer, the term of this patent is extended or adjusted under 35 U.S.C. 154(b) by 1543 days.

(21) Appl. No.: 10/744,527

(22) Filed: Dec. 23, 2003

(65) Prior Publication Data

US 2005/0041727 A1    Feb. 24, 2005

Related U.S. Application Data

(60) Division of application No. 09/557,274, filed on Apr. 24, 2000, now Pat. No. 6,928,106, which is a continuation-in-part of application No. 09/390,856, filed on Sep. 3, 1999, now Pat. No. 6,289,047, which is a continuation-in-part of application No. 09/143,476, filed on Aug. 28, 1998, now Pat. No. 6,304,598, said application No. 09/557,274 is a continuation-in-part of application No. 09/437,721, filed on Nov. 9, 1999, now Pat. No. 6,363,129.

(60) Provisional application No. 60/107,874, filed on Nov. 9, 1998, provisional application No. 60/108,648, filed on Nov. 16, 1998, provisional application No. 60/108,319, filed on Nov. 13, 1998, provisional application No. 60/130,616, filed on Apr. 22, 1999.

(51) Int. Cl.
*H03H 7/30* (2006.01)
*H03H 7/40* (2006.01)
*H03K 5/159* (2006.01)

(52) U.S. Cl. .................................................... 375/229
(58) Field of Classification Search ......... 375/219–222, 375/229–232, 350; 379/406.1–406.06; 370/286–287
See application file for complete search history.

(56) References Cited

U.S. PATENT DOCUMENTS

| 4,531,220 | A | * | 7/1985 | Brie et al. ................... 375/232 |
| 4,672,665 | A | * | 6/1987 | Nagai et al. ............ 379/406.11 |
| 4,805,215 | A |   | 2/1989 | Miller |
| 4,871,973 | A |   | 10/1989 | Yoshihara |
| 4,878,232 | A | * | 10/1989 | Fisher ......................... 375/362 |

(Continued)

FOREIGN PATENT DOCUMENTS

WO    WO 9809400    3/1998

(Continued)

OTHER PUBLICATIONS

Nicol et al., A Low-Power 128-Tap Digital Adaptive Equalizer for Broadband Modem, IEEE Journal of Solid-State Circuits, vol. 32, No. 11, Nov. 1997, pp. 1777-1789.

(Continued)

*Primary Examiner*—Jean B Corrielus
(74) *Attorney, Agent, or Firm*—McAndrews, Held & Malloy, Ltd.

(57) ABSTRACT

A control module for controlling convergence of cancellers, a decision feedback equalizer (DFE) and a timing recovery module. The control module includes a state machine operable to decouple the timing recovery module from the cancellers and the DFE while converging the cancellers and the DFE at the same time.

6 Claims, 46 Drawing Sheets

U.S. PATENT DOCUMENTS

| | | | |
|---|---|---|---|
| 4,891,598 A | | 1/1990 | Yoshida et al. |
| 4,896,334 A | * | 1/1990 | Sayar .......................... 375/293 |
| 4,964,118 A | * | 10/1990 | Aly et al. .................... 370/291 |
| 4,995,031 A | * | 2/1991 | Aly et al. .................... 370/286 |
| 5,157,690 A | * | 10/1992 | Buttle ........................ 375/232 |
| 5,181,228 A | * | 1/1993 | Takatori ..................... 375/350 |
| RE34,206 E | * | 3/1993 | Sayar .......................... 375/293 |
| 5,255,317 A | * | 10/1993 | Arai et al. .............. 379/399.02 |
| 5,307,405 A | | 4/1994 | Sih |
| 5,388,092 A | | 2/1995 | Koyama et al. |
| 5,406,613 A | | 4/1995 | Peponides et al. |
| 5,450,457 A | * | 9/1995 | Ito et al. ..................... 375/355 |
| 5,454,511 A | * | 10/1995 | Van Ostrand et al. ..... 236/46 R |
| 5,455,819 A | | 10/1995 | Sugiyama |
| 5,517,435 A | | 5/1996 | Sugiyama |
| 5,521,767 A | | 5/1996 | Weng et al. |
| 5,526,347 A | | 6/1996 | Chen et al. |
| 5,539,773 A | | 7/1996 | Knee et al. |
| 5,604,741 A | | 2/1997 | Samueli et al. |
| 5,617,450 A | | 4/1997 | Kakuishi et al. |
| 5,648,964 A | | 7/1997 | Inagaki et al. |
| 5,659,586 A | | 8/1997 | Chun |
| 5,659,609 A | | 8/1997 | Koizumi et al. |
| 5,675,612 A | * | 10/1997 | Solve et al. ................. 375/326 |
| 5,687,229 A | | 11/1997 | Sih |
| 5,719,843 A | | 2/1998 | Nakajima et al. |
| 5,745,564 A | | 4/1998 | Meek |
| 5,796,725 A | | 8/1998 | Muraoka |
| 5,809,086 A | * | 9/1998 | Ariyavisitakul ............. 375/332 |
| 5,854,717 A | * | 12/1998 | Minuhin ..................... 360/65 |
| 5,864,545 A | * | 1/1999 | Gonikberg et al. .......... 370/286 |
| 5,864,592 A | | 1/1999 | Itri |
| 5,867,486 A | | 2/1999 | Sugiyama |
| 5,903,599 A | | 5/1999 | Johnson et al. |
| 5,909,463 A | | 6/1999 | Johnson et al. |
| 5,933,495 A | | 8/1999 | Oh |
| 5,940,455 A | | 8/1999 | Ikeda |
| 5,946,349 A | | 8/1999 | Raghunath |
| 5,974,097 A | | 10/1999 | Julyan et al. |
| 5,986,987 A | | 11/1999 | Taguchi et al. |
| 5,987,078 A | | 11/1999 | Kiyanagi et al. |
| 6,016,080 A | | 1/2000 | Zuta et al. |
| 6,065,073 A | | 5/2000 | Booth |
| 6,098,103 A | | 8/2000 | Dreyer et al. |
| 6,104,915 A | | 8/2000 | Zhang et al. |
| 6,148,037 A | | 11/2000 | Abe |
| 6,229,818 B1 | | 5/2001 | Bell |
| 6,275,501 B1 | | 8/2001 | Lucas et al. |
| 6,278,746 B1 | | 8/2001 | Velez et al. |
| 6,304,598 B1 | | 10/2001 | Agazzi et al. |
| 6,377,640 B2 | * | 4/2002 | Trans .......................... 375/354 |
| 6,385,738 B1 | | 5/2002 | Lo |
| 6,414,990 B1 | * | 7/2002 | Jonsson et al. .............. 375/232 |
| 6,477,199 B1 | | 11/2002 | Agazzi et al. |
| 6,628,704 B1 | | 9/2003 | Long et al. |
| 7,042,939 B1 | | 5/2006 | Samueli et al. |
| 7,110,370 B2 | | 9/2006 | Cioffi et al. |
| 2002/0037031 A1 | | 3/2002 | Agazzi et al. |
| 2004/0219959 A1 | | 11/2004 | Khayrallah et al. |
| 2005/0243903 A1 | * | 11/2005 | Agazzi ....................... 375/219 |

FOREIGN PATENT DOCUMENTS

| | | |
|---|---|---|
| WO | WO 9907077 | 2/1999 |
| WO | WO 9946867 | 9/1999 |

OTHER PUBLICATIONS

Agazzi et al., Two-Phase Decimation and Jitter Compensation in Full-Duplex Data Transceivers, Proceedings of the International Symposium on Circuits and Systems (ISCAS), USA, New York, IEEE, vol. CONF. 25, May 10, 1992, pp. 1717-1720, XP000339277 ISBN: 0-7803-0593-0.

Hatamian et al., Design Considerations for Gigabit Ethernet 1000 base-T Twisted Pair Transceivers, Custom Integrated Circuits Conference, 1998, May 11-14, 1998, pp. 335-342, XP002145256.

PCT/US00/11123, International Search Report dated May 9, 2000.

Physical Coding Sublayer (PCS), Physical Medium Attachment (PMA) sublayer and baseband medium, type 1000BASE-T, pp. 147-248; IEEE Std 802.3-2002, Section Three; CSMA/CD.

Introduction to 1000 MB/s baseband network, pp. 893-963, IEEE Std 802.3, 1998 Edition, CSMA/CD, XP-002145257.

* cited by examiner

| THRESHOLD | VALUE[dB] | FUNCTION |
|---|---|---|
| Thresh.0 | -20 | ENERGY DETECT |
| Thresh.1 | -17 | loc_rcvr_status_OK |
| Thresh.2 | -12 | frequency recovery |
| Thresh.3 (1) | -22.8 (SER=1e-13) | Quality Indicator |
| Thresh.3 (2) | -22.5 (SER=1e-12) | Quality Indicator |
| Thresh.3 (3) | -22.0 (SER=1e-11) | Quality Indicator (default) |
| Thresh.3 (4) | -21.5 (SER=1e-10) | Quality Indicator |

PHY CONTROL MODULE FOR A MULTI-PAIR GIGABIT TRANSCEIVER

CROSS-REFERENCE TO RELATED APPLICATIONS

The present invention is a divisional of U.S. patent application Ser. No. 09/557,274 (now U.S. Pat. No. 6,928,106) entitled "PHY Control Module for a Multi-Pair Gigabit Transceiver" filed Apr. 24, 2000, which is a continuation-in-part of the following applications, the contents of each of which are herein incorporated by reference: Ser. No. 09/390,856 (now U.S. Pat. No. 6,289,047) entitled "Dynamic Regulation of Power Consumption of a High-Speed Communication System" filed on Sep. 3, 1999, which is a continuation-in-part of 09/143,476 (now U.S. Pat. No. 6,304,598) filed on Aug. 28, 1998, and claims the benefit of provisional applications 60/108,319, filed on Nov. 13, 1998, and 60/130,616, filed on Apr. 22, 1999; and Ser. No. 09/437,721 (now U.S. Pat. No. 6,363,129) entitled "Timing Recovery System for a Multi-Pair Gigabit Transceiver" filed on Nov. 9, 1999, which claims the benefit of provisional application 60/107,874 filed on Nov. 9, 1998, and claims benefit of 60/108,648 filed on Nov. 16, 1998.

The present application also claims priority of the following provisional application, the contents of which are herein incorporated by reference: Ser. No. 60/130,616 entitled "Multi-Pair Gigabit Ethernet Transceiver" filed on Apr. 22, 1999.

BACKGROUND OF THE INVENTION

1. Field of the Invention

The present invention generally relates to a PHY Control module in a transceiver. More particularly, the present invention relates to a PHY Control module for controlling operation in a gigabit Ethernet transceiver, which includes more than one constituent transceiver.

2. Description of Related Art

A transceiver includes a transmitter and a receiver. In a traditional half-duplex transceiver, the transmitter and the receiver can operate with a common clock signal since the transmitting and receiving operations do not occur simultaneously.

In a full-duplex transceiver, the transmitting operation occurs simultaneously with the receiving operation. The full-duplex transceiver needs to operate with at least two clock signals, a transmit clock signal (TCLK) and a sampling clock signal. The TCLK signal is used by the transmitter to regulate transmission of data symbols. The sampling clock signal is used by the receiver to regulate sampling of the received signal at an analog-to digital (A/D) converter. At the local receiver, the frequency and phase of the sampling clock signal are adjusted by a timing recovery system of the local receiver in such a way that they track the transmit clock signal of the remote transmitter. The sampled received signal is demodulated by digital signal processing function blocks of the receiver. These digital processing functions blocks may operate in accordance with either the TCLK signal or the sampling clock signal, provided that signals crossing boundaries between the two clock signals are treated appropriately so that any loss of signal or data samples is prevented.

The IEEE 802.3ab standard (also called 1000BASE-T) for 1 gigabit per second (Gb/s) Ethernet full-duplex communication system specifies that there are four constituent transceivers in a gigabit transceiver and that the full-duplex communication is over four twisted pairs of Category-5 copper cables. Since a Gigabit Ethernet transceiver has four constituent transmitters and four constituent receivers, its operation is much more complex than the operation of a traditional full-duplex transceiver. Power consumption is an important problem that must be addressed. The four twisted pairs of cable may introduce different delays on the signals, causing the signals to have different phases. This, in turn, requires the gigabit Ethernet transceiver to have four A/D converters operating in accordance with four respective sampling clock signals. In addition, the problem of switching noise coupled from the digital signal processing blocks of the gigabit Ethernet transceiver to the four A/D converters must also be addressed.

Therefore, there is a need to have an efficient Physical (PHY) Control module for controlling the complex operation of a gigabit Ethernet transceiver.

SUMMARY OF THE INVENTION

A method for controlling operation of a multi-pair gigabit transceiver. The multi-pair gigabit transceiver comprises a Physical Layer Control module (PHY Control), a Physical Coding Sublayer module (PCS) and a Digital Signal Processing module (DSP). The PHY Control receives user-defined inputs from the Serial Management module and status signals and diagnostics signals from the DSP and the PCS and generates control signals, responsive to the user-defined inputs, the status signals and diagnostics signals, to the DSP and the PCS.

BRIEF DESCRIPTION OF THE DRAWINGS

The features of the present invention will become more apparent and the invention will be best understood by reference to the following description and the accompanying drawings, wherein.

DETAILED DESCRIPTION OF THE INVENTION

The present invention provides a PHY Control module for controlling operation of a multi-pair gigabit transceiver.

The present invention provides a method and a timing recovery system for generating a set of clock signals in a processing system. The set of clock signals includes a set of sampling clock signals. The processing system includes a set of processing subsystems, each of which includes an analog section and a digital section. Each of the analog sections operates in accordance with a corresponding sampling clock signals. The digital sections operate in accordance with a receive clock. An example of the-processing system is a gigabit transceiver. In this case, the processing subsystems are the constituent transceivers.

The present invention also provides a method and a system for substantially minimizing system performance degradation caused by coupling of switching noise from the digital sections to the analog sections.

The present invention can be used to generate and distribute clock signals in a gigabit transceiver of a Gigabit Ethernet communication system such that effect of switching noise coupled from one clock domain to another clock domain is minimized. By "clock domain", it is meant the circuit blocks that are operating according to transitions of a particular clock signal. For ease of explanation, the present invention will be described in detail as applied to this exemplary application. However, this is not to be construed as a limitation of the present invention.

In order to appreciate the advantages of the present invention, it will be beneficial to describe the invention in the context of an exemplary bi-directional communication device, such as an Ethernet transceiver. The particular exemplary implementation chosen is depicted in FIG. 1, which is a simplified block diagram of a multi-pair communication system operating in conformance with the IEEE 802.3ab standard (also termed 1000BASE-T) for 1 gigabit (Gb/s) Ethernet full-duplex communication over four twisted pairs of Category-5 copper wires.

Figure 1:
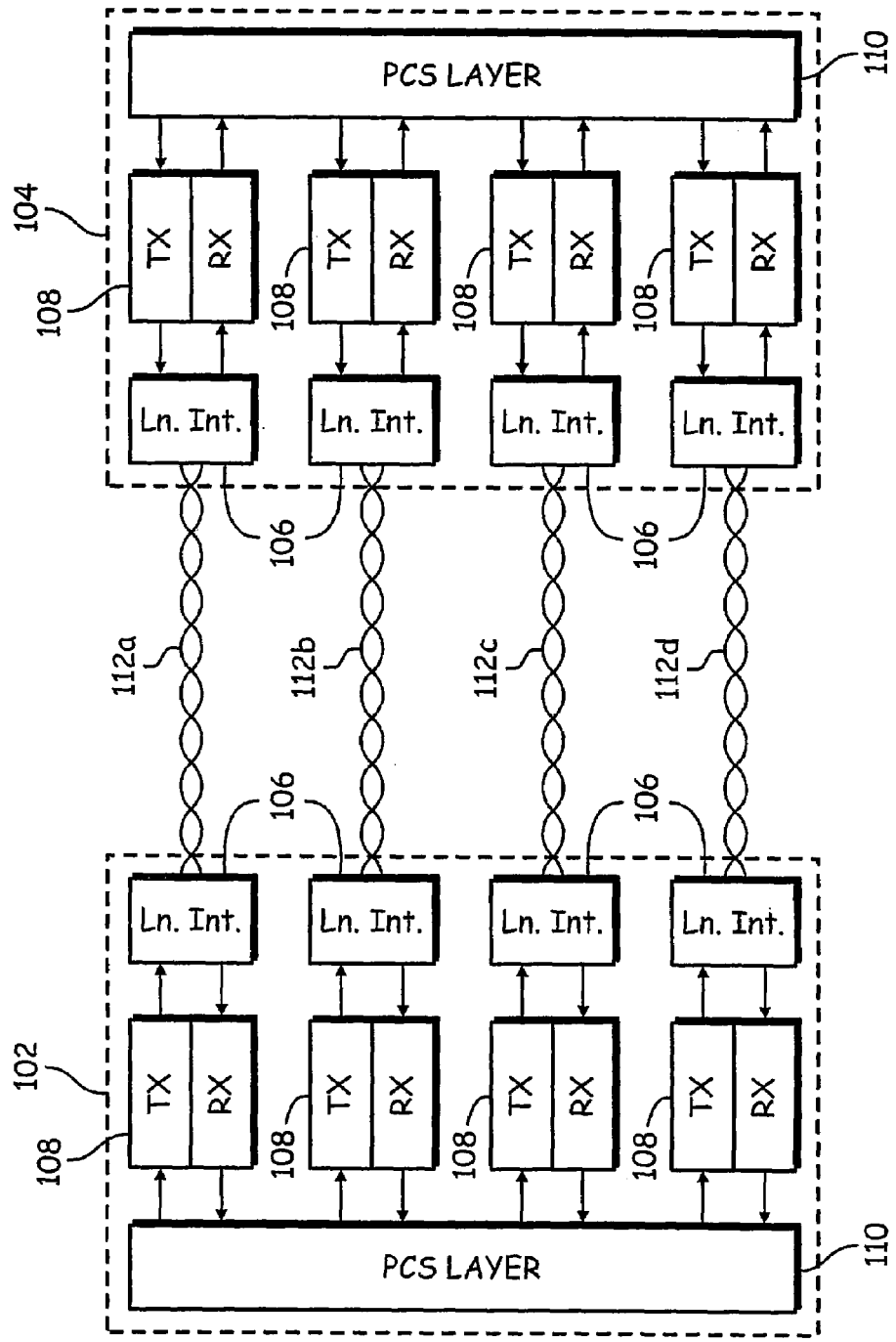
FIG. 1 a simplified block diagram of a multi-pair communication system operating in conformance with the IEEE 802.3ab standard (also termed 1000BASE-T) for 1 gigabit (Gb/s) Ethernet full-duplex communication over four twisted pairs of Category-5 copper wires.

In FIG. 1, the communication system is represented as a point-to-point system in order to simplify the explanation, and includes two main transceiver blocks 102 and 104, coupled together via four twisted-pair cables 112a, b, c and d. Each of the wire pairs 112a, b, c, d is coupled to each of the transceiver blocks 102, 104 through a respective one of four line interface circuits 106. Each of the wire pairs 112a, b, c, d facilitates communication of information between corresponding pairs of four pairs of transmitter/receiver circuits (constituent transceivers) 108. Each of the constituent transceivers 108 is coupled between a respective line interface circuit 106 and a Physical Coding Sublayer (PCS) block 110. At each of the transceiver blocks 102 and 104, the four constituent transceivers 108 are capable of operating simultaneously at 250 megabits of information data per second (Mb/s) each, i.e., 125 Mbaud at 2 information data bits per symbol, the 2 information data bits being encoded in one of the 5 levels of the PAM-5 (Pulse Amplitude Modulation) alphabet. The four constituent transceivers 108 are coupled to the corresponding remote constituent transceivers through respective line interface circuits to facilitate full-duplex bi-directional operation. Thus, 1 Gb/s communication throughput of each of the transceiver blocks 102 and 104 is achieved by using four 250 Mb/s constituent transceivers 108 for each of the transceiver blocks 102, 104 and four pairs of twisted copper cables to connect the two transceiver blocks 102, 104 together.

Figure 2:
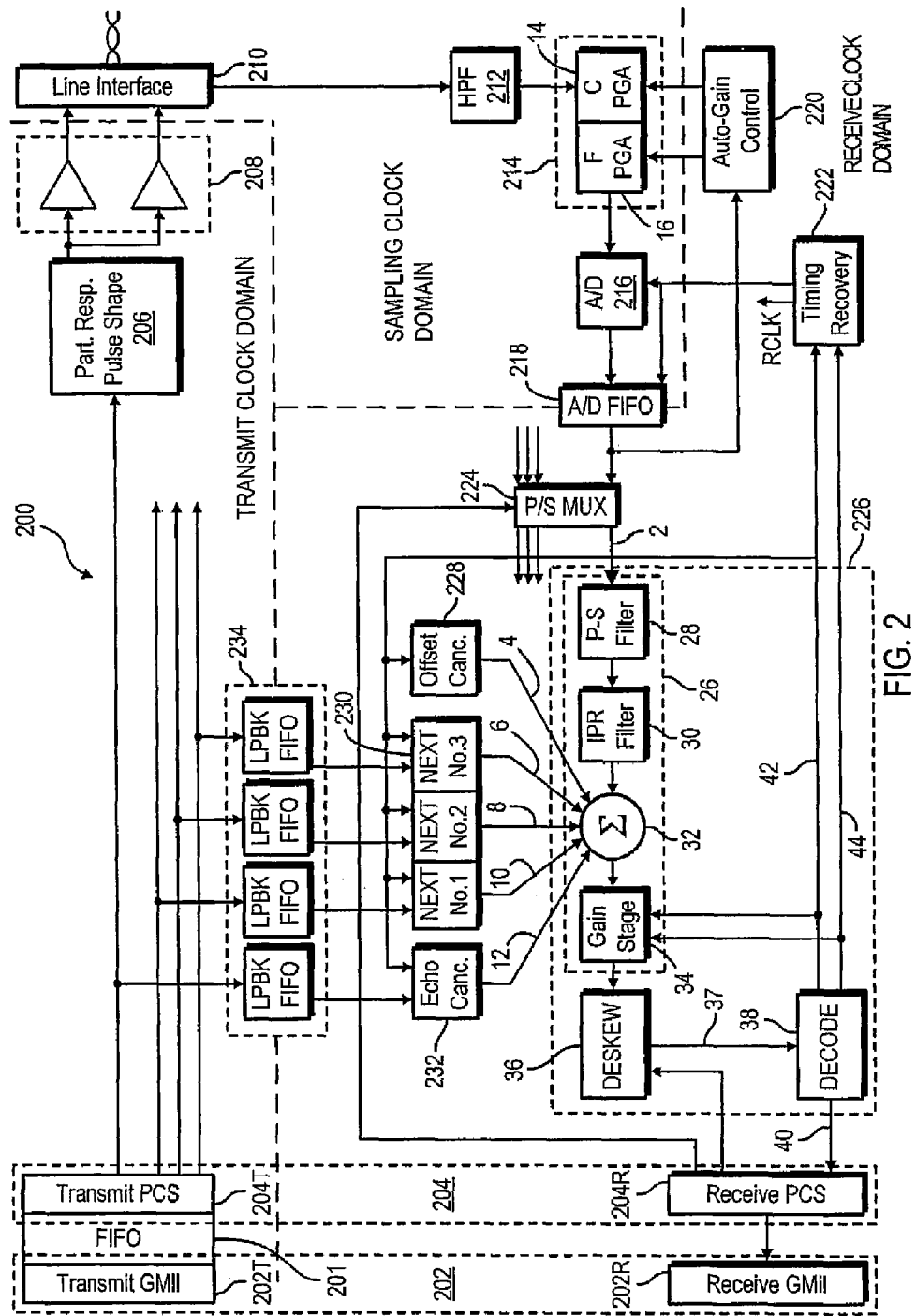
FIG. 2 is a simplified block diagram of the functional architecture and internal construction of an embodiment of a gigabit transceiver of FIG. 1.

FIG. 2 is a simplified block diagram of the functional architecture and internal construction of an exemplary transceiver block, indicated generally at 200, such as transceiver 101 of FIG. 1. Since the illustrative transceiver application relates to gigabit Ethernet transmission, the transceiver will be referred to as the "gigabit transceiver". For ease of illustration and description, FIG. 2 shows only one of the four 250 Mb/s constituent transceivers which are operating simultaneously (termed herein 4-D operation). However, since the operation of the four constituent transceivers are necessarily interrelated, certain blocks and signal lines in the exemplary embodiment of FIG. 2 perform four-dimensional operations and carry four-dimensional (4-D) signals, respectively. By 4-D, it is meant that the data from the four constituent transceivers are used simultaneously. In order to clarify signal relationships in FIG. 2, thin lines correspond to 1-dimensional functions or signals (i.e., relating to only a single constituent transceiver), and thick lines correspond to 4-D functions or signals (relating to all four constituent transceivers).

Referring to FIG. 2, the gigabit transceiver 200 includes a Gigabit Medium Independent Interface (GMII) block 202 subdivided into a receive GMII circuit 202R and a transmit GMII circuit 202T. The transceiver also includes a Physical Coding Sublayer (PCS) block 204, subdivided into a receive PCS circuit 204R and a transmit PCS circuit 204T, a pulse shaping filter 206, a digital-to analog (D/A) converter block 208, and a line interface block 210, all generally encompassing the transmitter portion of the transceiver.

The receiver portion generally includes a highpass filter 212, a programmable gain amplifier (PGA) 214, an analog-to-digital (A/D) converter 216, an automatic gain control (AGC) block 220, a timing recovery block 222, a pair-swap multiplexer block 224, a demodulator 226, an offset canceller 228, a near-end crosstalk (NEXT) canceller block 230 having three constituent NEXT cancellers and an echo canceller 232.

The gigabit transceiver 200 also includes an AID first-in-first-out buffer (FIFO) 218 to facilitate proper transfer of data from the analog clock region to the receive clock region, and a loopback FIFO block (LPBK) 234 to facilitate proper transfer of data from the transmit clock region to the receive clock region. The gigabit transceiver 200 can optionally include an additional adaptive filter to cancel far-end crosstalk noise (FEXT canceller).

In operational terms, on the transmit path, the transmit section 202T of the GMII block receives data from the Media Access Control (MAC) module in byte-wide format at the rate of 125 MHz and passes them to the transmit section 204T of the PCS block via the FIFO 201. The FIFO 201 ensures proper data transfer from the MAC layer to the Physical Coding (PHY) layer, since the transmit clock of the PHY layer is not necessarily synchronized with the clock of the MAC layer. In one embodiment, this small FIFO 201 has from about three to about five memory cells to accommodate the elasticity requirement which is a function of frame size and frequency offset.

The PCS transmit section 204T performs certain scrambling operations and, in particular, is responsible for encoding digital data into the requisite codeword representations appropriate for transmission. In the illustrated embodiment of FIG. 2, the transmit PCS section 204T incorporates a coding engine and signal mapper that implements a trellis coding architecture, such as required by the IEEE 802.3ab specification for gigabit transmission.

In accordance with this encoding architecture, the PCS transmit section 204T generates four 1-D symbols, one for each of the four constituent transceivers. The 1-D symbol generated for the constituent transceiver depicted in FIG. 2 is filtered by the pulse shaping filter 206. This filtering assists in reducing the radiated emission of the output of the transceiver such that it falls within the parameters required by the Federal Communications Commission. The pulse shaping filter 206 is implemented so as to define a transfer function of $0.75+0.25z^{-1}$. This particular implementation is chosen so that the power spectrum of the output of the transceiver falls below the power spectrum of a 100Base-Tx signal. The 100Base-Tx is a widely used and accepted Fast Ethernet standard for 100 Mb/s operation on two pairs of Category-5 twisted pair cables. The output of the pulse shaping filter 206 is converted to an analog signal by the D/A converter 208 operating at 125 MHz. The analog signal passes through the line interface block 210, and is placed on the corresponding twisted pair cable.

On the receive path, the line interface block 210 receives an analog signal from the twisted pair cable. The received analog signal is preconditioned by the highpass filter 212 and the PGA 214 before being converted to a digital signal by the A/D converter 216 operating at a sampling rate of 125 MHz. The timing of the A/D converter 216 is controlled by the output of the timing recovery block 222. The resulting digital signal is properly transferred from the analog clock region to the receive clock region by the A/D FIFO 218. The output of the A/D FIFO 218 is also used by the AGC 220 to control the operation of the PGA 214.

The output of the A/D FIFO 218, along with the outputs from the A/D FIFOs of the other three constituent transceivers are inputted to the pair-swap multiplexer block 224. The pair-swap multiplexer block 224 uses the 4-D pair-swap control signal from the receive section 204R of PCS block to sort out the four input signals and send the correct signals to the respective feedforward equalizers 26 of the demodulator 226. This pair-swapping control is needed for the following reason. The trellis coding methodology used for the gigabit transceivers (101 and 102 of FIG. 1) is based on the fact that a signal on each twisted pair of wire corresponds to a respective 1-D constellation, and that the signals transmitted over four twisted pairs collectively form a 4-D constellation. Thus, for the decoding to work, each of the four twisted pairs must be uniquely identified with one of the four dimensions. Any undetected swapping of the four pairs would result in erroneous decoding. In an alternate embodiment of the gigabit transceiver, the pair-swapping control is performed by the demodulator 226, instead of the combination of the PCS receive section 204R and the pair-swap multiplexer block 224.

The demodulator 226 includes a feed-forward equalizer (FFE) 26 for each constituent transceiver, coupled to a deskew memory circuit 36 and a decoder circuit 38, implemented in the illustrated embodiment as a trellis decoder. The deskew memory circuit 36 and the trellis decoder 38 are common to all four constituent transceivers. The FFE 26 receives the received signal intended for it from the pair-swap multiplexer block 224. The FFE 26 is suitably implemented to include a precursor filter 28, a programmable inverse partial response (IPR) filter 30, a summing device 32, and an adaptive gain stage 34. The FFE 26 is a least-mean-squares (LMS) type adaptive filter which is configured to perform channel equalization as will be described in greater detail below.

The precursor filter 28 generates a precursor to the input signal 2. This precursor is used for timing recovery. The transfer function of the precursor filter 28 might be represented as $-\gamma+z^{-1}$, with $\gamma$ equal to $\frac{1}{16}$ for short cables (less than 80 meters) and $\frac{1}{8}$ for long cables (more than 80 m). The determination of the length of a cable is based on the gain of the coarse PGA 14 of the programmable gain block 214.

The programmable IPR filter 30 compensates the ISI (intersymbol interference) introduced by the partial response pulse shaping in the transmitter section of a remote transceiver which transmitted the analog equivalent of the digital signal 2. The transfer function of the IPR filter 30 may be expressed as $1/(1+Kz-1)$. In the present example, K has an exemplary value of 0.484375 during startup, and is slowly ramped down to zero after convergence of the decision feedback equalizer included inside the trellis decoder 38. The value of K may also be any positive value strictly less than 1.

The summing device 32 receives the output of the IPR filter 30 and subtracts therefrom adaptively derived cancellation signals received from the adaptive filter block, namely signals developed by the offset canceller 228, the NEXT cancellers 230, and the echo canceller 232. The offset canceller 228 is an adaptive filter which generates an estimate of signal offset introduced by component circuitry of the transceiver's analog front end, particularly offsets introduced by the PGA 214 and the A/D converter 216.

The three NEXT cancellers 230 may also be described as adaptive filters and are used, in the illustrated embodiment, for modeling the NEXT impairments in the received signal caused by interference generated by symbols sent by the three local transmitters of the other three constituent transceivers. These impairments are recognized as being caused by a crosstalk mechanism between neighboring pairs of cables, thus the term near-end crosstalk, or NEXT. Since each receiver has access to the data transmitted by the other three local transmitters, it is possible to approximately replicate the NEXT impairments through filtering. Referring to FIG. 2, the three NEXT cancellers 230 filter the signals sent by the PCS block to the other three local transmitters and produce three signals replicating the respective NEXT impairments. By subtracting these three signals from the output of the IPR filter 30, the NEXT impairments are approximately cancelled.

Due to the bi-directional nature of the channel, each local transmitter causes an echo impairment on the received signal of the local receiver with which it is paired to form a constituent transceiver. In order to remove this impairment, an echo canceller 232 is provided, which may also be characterized as an adaptive filter, and is used, in the illustrated embodiment, for modeling the signal impairment due to echo. The echo canceller 232 filters the signal sent by the PCS block to the local transmitter associated with the receiver, and produces an approximate replica of the echo impairment. By subtracting this replica signal from the output of the IPR filter 30, the echo impairment is approximately cancelled.

The adaptive gain stage 34 receives the processed signal from the summing circuit 32 and fine tunes the signal path gain using a zero-forcing LMS algorithm. Since this adaptive gain stage 34 trains on the basis of error signals generated by the adaptive filters 228, 230 and 232, it provides a more accurate signal gain than the one provided by the PGA 214 in the analog section.

The output of the adaptive gain stage 34, which is also the output of the FFE 26, is inputted to the deskew memory circuit 36. The deskew memory 36 is a four-dimensional function block, i.e., it also receives the outputs of the three FFEs of the other three constituent transceivers. There may be a relative skew in the outputs of the four FFEs, which are the four signal samples representing the four symbols to be decoded. This relative skew can be up to 50 nanoseconds, and is due to the variations in the way the copper wire pairs are twisted. In order to correctly decode the four symbols, the four signal samples must be properly aligned. The deskew memory aligns the four signal samples received from the four FFEs, then passes the deskewed four signal samples to a decoder circuit 38 for decoding.

In the context of the exemplary embodiment, the data received at the local transceiver was encoded before transmission, at the remote transceiver. In the present case, data might be encoded using an 8-state four-dimensional trellis code, and the decoder 38 might therefore be implemented as a trellis decoder. In the absence of intersymbol interference (ISI), a proper 8-state Viterbi decoder would provide optimal decoding of this code. However, in the case of Gigabit Ethernet, the Category-5 twisted pair cable introduces a significant amount of ISI. In addition, the partial response filter of the remote transmitter on the other end of the communication channel also contributes some ISI. Therefore, the trellis decoder 38 must decode both the trellis code and the ISI, at the high rate of 125 MHz. In the illustrated embodiment of the gigabit transceiver, the trellis decoder 38 includes an 8-state Viterbi decoder, and uses a decision-feedback sequence estimation approach to deal with the ISI components.

The 4-D output of the trellis decoder 38 is provided to the PCS receive section 204R. The receive section 204R of the PCS block de-scrambles and decodes the symbol stream, then passes the decoded packets and idle stream to the receive section 202T of the GMII block which passes them to the MAC module. The 4-D outputs, which are the error and tentative decision, respectively, are provided to the timing recovery block 222, whose output controls the sampling time of the A/D converter 216. One of the four components of the error and one of the four components of the tentative decision correspond to the receiver shown in FIG. 2, and are provided to the adaptive gain stage 34 of the FFE 26 to adjust the gain of the equalizer signal path. The error component portion of the decoder output signal is also provided, as a control signal, to adaptation circuitry incorporated in each of the adaptive filters 230 and 232. Adaptation circuitry is used for the updating and training process of filter coefficients.

Figure 3:
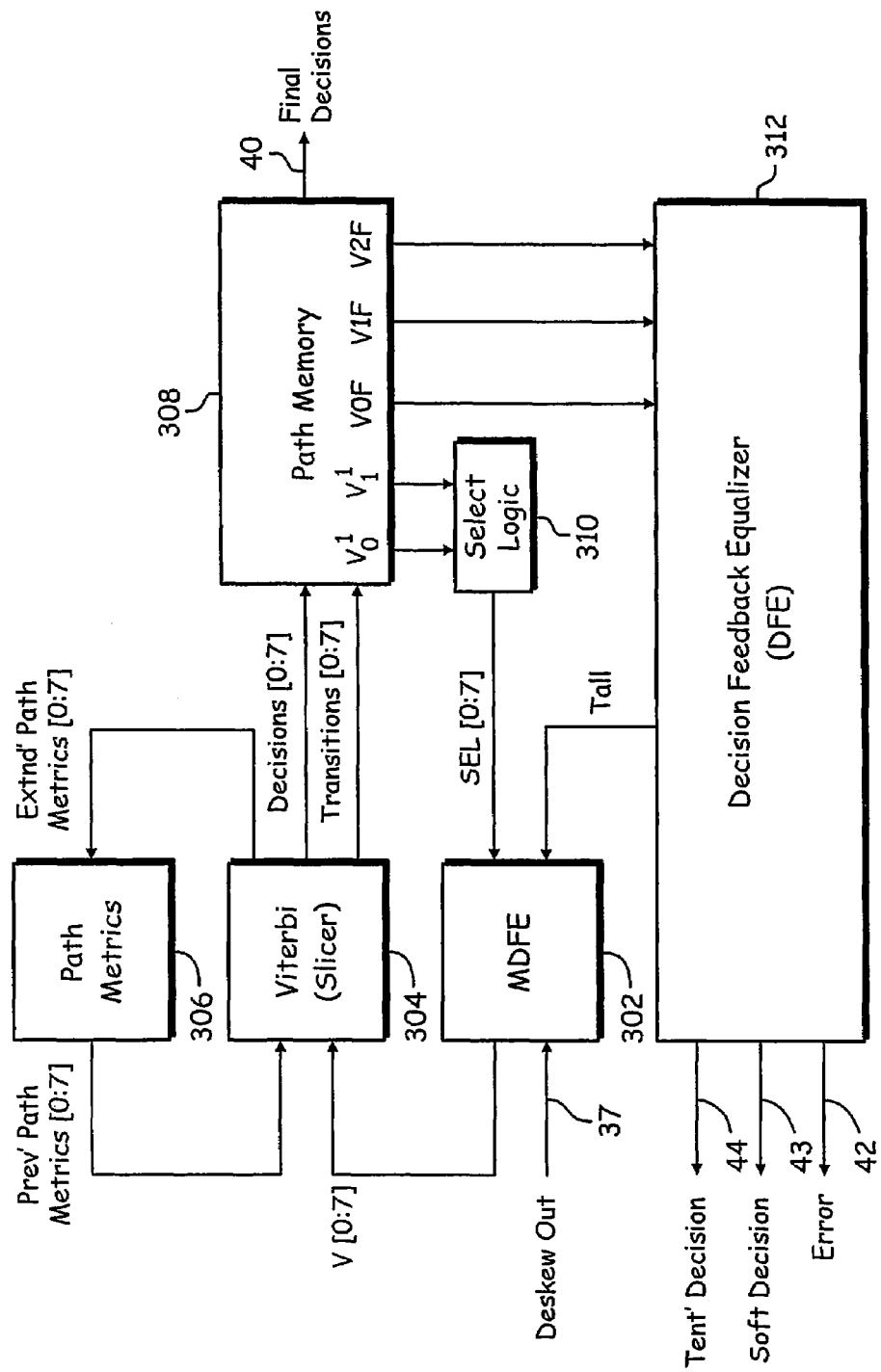
FIG. 3 is a simplified block diagram of an embodiment of the trellis decoder 38 of FIG. 2.

FIG. 3 is a block diagram of the trellis decoder 38 of FIG. 2. The trellis decoder 38 includes a multiple decision feedback equalizer (MDFE) 302, a Viterbi decoder 304, a path metrics module 306, a path memory module 308, a select logic 310, and a decision feedback equalizer 312.

The Viterbi decoder 304 performs 4D slicing of the Viterbi inputs provided by the MDFE 302 and computes the branch metrics. Based on the branch metrics and the previous path metrics received from the path metrics module 306, the Viterbi decoder 304 extends the paths and computes the extended path metrics. The Viterbi decoder 304 selects the best path incoming to each of the 8 states, updates the path memory stored in the path memory module 308 and the path metrics stored in the path metrics module 306.

The computation of the final decision and the tentative decisions are performed in the path memory module 308 based on the 4D symbols stored in the path memory for each state. At each iteration of the Viterbi algorithm, the best of the 8 states, i.e., the one associated with the path having the lowest path metric, is selected, and the 4D symbol from the associated path stored at the last level of the path memory is selected as the final decision 40 and provided to the receive section of the PCS 204R (FIG. 2). Symbols at lower depth levels are selected as tentative decisions, which are used to feed the delay line of the DFE 312.

The number of the outputs $V_i$ to be used as tentative decisions depends on the required accuracy and speed of decoding operation. A delayed version of $V_{0F}$ is provided as the 4D tentative decision 44 (FIG. 2) to the Feed-Forward Equalizers 26 of the 4 constituent transceivers and the timing recovery block 222 (FIG. 2).

Based on the symbols $V_{0F}$, $V_{1F}$, and $V_{2F}$, the DFE 612 produces the intersymbol interference (ISI) replica associated with all previous symbols except the two most recent (since it was derived without using the first two taps of the DFE 612). The ISI replica is fed to the MDFE 302 (this ISI replica is denoted as the "tail component" in FIG. 6). The MDFE 302 computes the ISI replica associated with all previous symbols including the two most recent symbols, subtracts it from the output 37 of the deskew memory block 36 (FIG. 2) and provides the resulting Viterbi inputs to the Viterbi decoder 304.

The DFE 312 also computes an ISI replica associated with the two most recent symbols, based on tentative decisions $V_{0F}$, $V_{1F}$, and $V_{2F}$. This ISI replica is subtracted from a delayed version of the output 37 of the de-skew memory block 36 to provide the soft decision 43. The tentative decision $V_{0F}$ is subtracted from the soft decision 43 to provide the error 42. There 3 different versions of the error 42, which are 42enc, 42ph and 42dfe. The error 42enc is provided to the echo cancellers and NEXT cancellers of the constituent transceivers. The error 42ph is provided to the FFEs 26 (FIG. 2) of the 4 constituent transceivers and the timing recovery block 222. The error 42dfe is used for the adaptation of the coefficients of the DFE 312. The tentative decision 44 shown in FIG. 3 is a delayed version of $V_{0F}$. The soft decision 43 is only used for display purposes.

For the exemplary gigabit transceiver system 200 described above and shown in FIG. 2, there are design considerations regarding the allocation of boundaries of the clock domains. These design considerations are dependent on the clocking relationship between transmitters and receivers in a gigabit transceiver. Therefore, this clocking relationship will be discussed first.

During a bidirectional communication between two gigabit transceivers 101, 102 (FIG. 1), through a process called "auto-negotiation", one of the gigabit transceivers assumes the role of the master while the other assumes the role of the slave. When a gigabit transceiver assumes one of the two roles with respect to the remote gigabit transceiver, each of its constituent transceivers assumes the same role with respect to the corresponding one of the remote constituent transceivers. Each constituent transceiver 108 is constructed such that it can be dynamically configured to act as either the master or the slave with respect to a remote constituent transceiver 108 during a bidirectional communication. The clocking relationship between the transmitter and receiver inside the constituent transceiver 108 depends on the role of the constituent transceiver (i.e., master or slave) and is different for each of the two cases.

Figure 4:
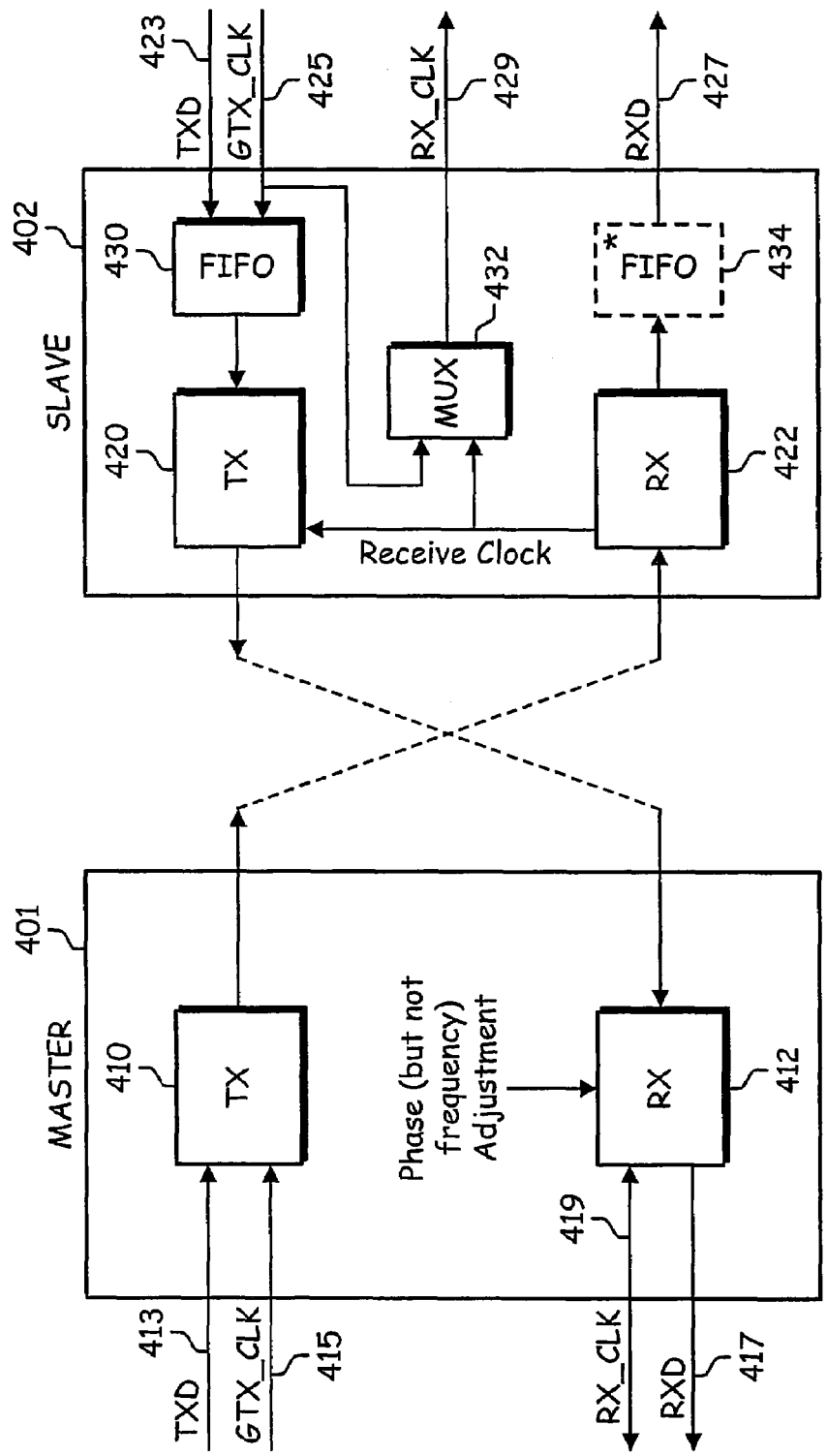
FIG. 4 illustrates the general clocking relationship between the transmitter and the receiver inside each of the four constituent transceivers 108 of the gigabit Ethernet transceiver (101 or 102) of FIG. 1.

FIG. 4 illustrates the general clocking relationship on the conceptual level between the transmitter and the receiver of the gigabit Ethernet transceiver (101 or 102) of FIG. 1. For this conceptual FIG. 4, the transmitter TX represents the four constituent transmitters and the receiver RX represents the four constituent receivers.

Referring to FIG. 4, the gigabit transceiver 401 acts as the master while the gigabit transceiver 402 acts as the slave. The master 401 includes a transmitter 410 and a receiver 412. The slave 402 includes a transmitter 420 and a receiver 422. The transceiver 401 (respectively, 402) receives from the GMII 202T (FIG. 2) the data to be transmitted TXD via its input 413 (respectively, 423), and the GMII transmit clock GTX_CLK (this clock is also called "gigabit transmit clock" in the IEEE 802.3ab standard) via its input 415 (respectively, 425). The transceiver 401 (respectively, 402) sends to the GMII 202R (FIG. 2) the received data RXD via its output 417 (respectively, 427), and the GMII receive clock RX_CLK (this clock is also called "gigabit receive clock" in the IEEE 802.3ab standard) via its output 419 (respectively, 429). It is noted that the clocks GTX_CLK and RX_CLK may be different from the transmit clock TCLK and receive clock RCLK, respectively, of a gigabit transceiver.

The receiver 422 of the slave 402 synchronizes its receive clock to the transmit clock of the transmitter 410 of the master 401 in order to properly receive the data transmitted by the transmitter 410. The transmit clock of the transmitter 420 of the slave 402 is essentially the same as the receive clock of the receiver 422, thus it is also synchronized to the transmit clock of the transmitter 410 of the master 401.

The receiver 412 of the master 401 is synchronized to the transmit clock of the transmitter 420 of the slave 402 in order to properly receive data sent by the transmitter 420. Because of the synchronization of the receive and transmit clocks of the slave 402 to the transmit clock of transmitter 410 of the master 401, the receive clock of the receiver 412 is synchronized to the transmit clock of the transmitter 410 with a phase delay (due to the twisted pairs of cables). Thus, in the absence of jitter, after synchronization, the receive clock of receiver 412 tracks the transmit clock of transmitter 410 with a phase delay. In other words, in principle, the receive clock of receiver 412 has the same frequency as the transmit clock of transmitter 410, but with a fixed phase delay.

However, in the presence of jitter or a change in the cable response, these two clocks may have different instantaneous frequencies (frequency is derivative of phase with respect to time). This is due to the fact that, at the master 401, the receiver 412 needs to dynamically change the relative phase of its receive clock with respect to the transmit clock of transmitter 410 in order to track jitter in the incoming signal from the transmitter 420 or to compensate for the change in cable response. Thus, in practice, the transmit and receive clocks of the master 401 may be actually independent. At the master, this independence creates an asynchronous boundary between the transmit clock domain and the receive clock domain. By "transmit clock domain", it is meant the region where circuit blocks are operated in accordance with transitions in the transmit clock signal TCLK. By "receive clock domain", it is meant the region where circuit blocks are operated in accordance with transitions in the receive clock signal RCLK. In order to avoid any loss of data when data cross the asynchronous boundary between the transmit clock domain and the receive clock domain inside the master 401, FIFOs are used at this asynchronous boundary. For the exemplary structure of the gigabit transceiver shown in FIG. 2, FIFOs 234 (FIG. 2) are placed at this asynchronous boundary. Since a constituent transceiver 108 (FIG. 1) is constructed such that it can be configured as a master or a slave, the FIFOs 234 (FIG. 2) are also included in the slave 402 (FIG. 4).

At the slave 402, the transmit clock TCLK of transmitter 420 is phase locked to the receive clock RCLK of receiver 422. Thus, TCLK may be different from GTX_CLK, a FIFO 430 is needed for proper transfer of data TXD from the MAC (not shown) to the transmitter 420. The depth of the FIFO 430 must be sufficient to absorb any loss during the length of a data packet. The multiplexer 432 allows to use either the GTX_CLK or the receive clock RCLK of receiver 422 as the signal RX_CLK 429. When the GTX_CLK is used as the RX_CLK 429, the FIFO 434 is needed to ensure proper transfer of data RXD 427 from the receiver 422 to the MAC.

For the conceptual block diagram of FIG. 4, there are one transmit clock TCLK and one receive clock RCLK for a gigabit transceiver. The transmit clock TCLK is common to all four constituent transceivers since data transmitted simultaneously on all four twisted pairs of cable correspond to 4D symbols. Since data received from the four twisted pairs of cable are to be decoded simultaneously into 4D symbols, it is an efficient design to have all the digital processing blocks clocked by one clock signal RCLK However, due the different cable responses of the four twisted pairs of cable, the A/D converter 216 (FIG. 2) of each of the four constituent transceivers requires a distinct sampling clock signal. Thus, in addition to the signals TCLK and RCLK, the gigabit transceiver system 200 requires four sampling clock signals.

There is an alternative structure for the gigabit transceiver where the partition of clock domains is different than the one shown in FIG. 2. This alternative structure (not shown explicitly) is similar to the one shown in FIG. 2 and only differs in that its transmit clock domain includes both the transmit clock domain and the receive clock domain of FIG. 2, and that the FIFO block 234 is not needed. In other words, in this alternative structure, the receive clock RCLK is the same as the transmit clock TCLK, and the transmit clock TCLK is used to clock both the transmitter and most of the receiver. The advantage of this alternative structure is that there is no asynchronous boundary between the transmit region and most of the receive region, thus allowing the echo canceller 232 and NEXT cancellers 230 to work with only one clock signal. The disadvantage of this alternative structure is that there is a potential for a performance penalty at the master when the constituent transceivers are tracking jitter. As a result of tracking jitter, the relative phase of a sampling clock signal with respect to the transmit clock TCLK may vary dynamically. This could cause the A/D converter to sample at noisy instants where transistors in circuit blocks operating according to the clock signal TCLK are switching. Thus, the alternative structure is not as good as the structure shown in FIG. 2, with respect to the switching noise problem.

The exemplary gigabit transceiver system 200 previously described and shown in FIGS. 2 and 3 also includes a PHY Control module which provides control signals to the blocks shown in FIG. 2, including the timing recovery block 222, to control their functions. The PHY Control module will be described after the description of the timing recovery block 222.

Figure 5:
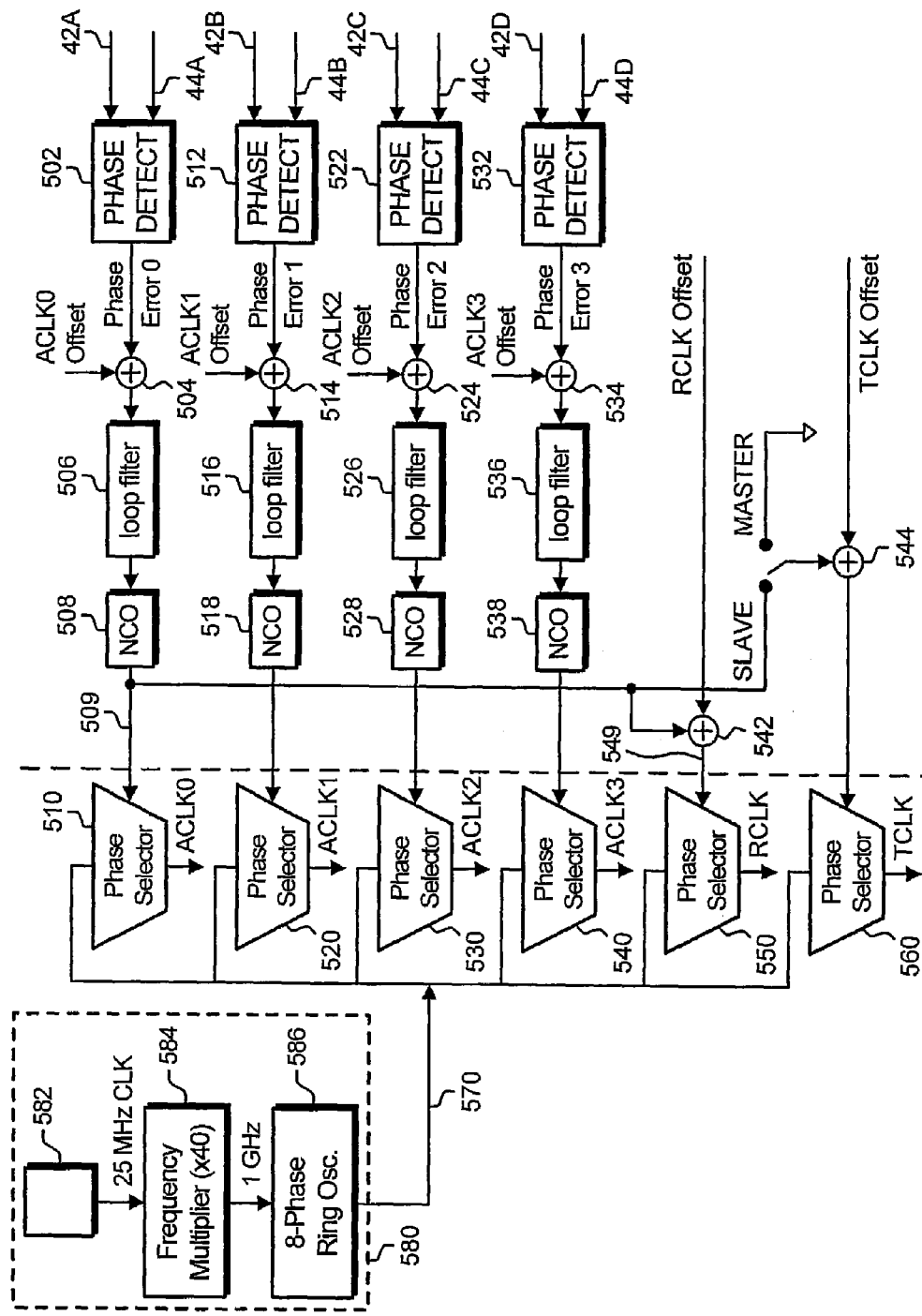
FIG. 5 is a simplified block diagram of an embodiment of the timing recovery system constructed according to the present invention.

FIG. 5 is a simplified block diagram of an embodiment of the timing recovery system constructed according to the present invention and applied to the gigabit transceiver architecture of FIG. 2. The timing recovery system 222 (FIGS. 2 and 6) generates the different clock signals for the exemplary gigabit transceiver shown in FIG. 2, namely, the sampling clock signals ACLK0, ACLK1, ACLK2, ACLK3, the receive clock signal RCLK, and the transmit clock signal TCLK.

The timing recovery system 222 includes a set of phase detectors 502, 512, 522, 532, a set of loop filters 506, 516, 526, 536, a set of numerically controlled oscillators (NCO) 508, 518, 528, 538 and a set of phase selectors 510, 520, 530, 540, 550, 560. The adders 504, 514, 524, 534 are shown for conceptual illustration purpose only. In practice, these adders are implemented within the respective phase detectors 502, 512, 522, 532. The RCLK Offset is used to adjust the phase of the receive clock signal RCLK in order to reduce the effects of switching noise on the sampling operations of the corresponding A/D converters 216 (FIG. 2). Three of the four signals ACLK0 Offset, ACLK1 Offset, ACLK2 Offset, ACLK3 Offset are used to slightly adjust the phases of the respective sampling clocks ACLK0 through ACLK4 in order to further reduce these effects of switching noise. The phase adjustments of the receive clock RCLK and the sampling clocks ACLK0-3 are not a necessary function of the timing recovery system 222. However, the method and system for generating these phase adjustment signals constitute another novel aspect of the present invention and will be described in detail later.

Each of the phase detectors 502, 512, 522, 532 receives the corresponding ID component of the 4D slicer error 42 (FIGS. 2 and 3) and the corresponding ID component of the 4D tentative decision 44 (FIGS. 2 and 3) from the decoder 38 (FIG. 2) to generate a corresponding phase error. The phase errors 0 through 3 are inputted to the loop filters 506, 516, 526, 536, respectively. The loop filters 506, 516, 526, 536 generate and output filtered phase errors to the NCOs 508, 518, 528, 538. The loop filters 506, 516, 526, 536 can be of any order. In one embodiment, the loop filters are of second order. The NCOs 508, 518, 528, 538 generate phase control signals from the filtered phase errors. The phase selectors 510, 520, 530, 540 receive corresponding phase control signals from the NCOs 508, 518, 528, 538, respectively. Each of the phase selectors 510, 520, 530, 540 selects one out of several phases of the multi-phase signal 570 based on the value of the corresponding phase control signal, and outputs the corresponding sampling clock signal. In one embodiment of the invention, the multi-phase signal has 64 phases.

The multi-phase signal 570 is generated by a clock generator 580. In the exemplary embodiment illustrated in FIG. 5, the clock generator 580 includes a crystal oscillator 582, a frequency multiplier 584 and an 8-phase ring oscillator 586. The crystal oscillator 582 produces a 25 MHz clock signal. The frequency multiplier 584 multiplies the frequency of the 25 MHz clock signal by 40 and produces a 1 GHz clock signal. From the 1 GHz clock signal, the 8-phase ring oscillator 586 produces the 8 GHz 64-phase signal 570.

The receive clock signal RCLK, which is used to clock all the circuit blocks in the receive clock domain (which include all the digital signal processing circuit blocks in FIG. 2), can be generated independently of the sampling clock signals ACLK0 through ACLK3. However, for design efficiency, RCLK is chosen to be related to one of the sampling clock signals ACLK0 through ACLK3. For the exemplary embodiment illustrated in FIG. 5, the receive clock signal RCLK is related to the sampling clock signal ACLK0. The receive clock signal RCLK is generated by inputting the sum of the phase control signal outputted from the NCO 508 and the RCLK Offset via an adder 542 to the phase selector 550. Based on this sum, the phase selector 550 selects one of the 64 phases of the multi-phase signal 570 and outputs the receive clock signal RCLK. Thus, when the RCLK Offset is zero, the receive clock signal RCLK is the same as the sampling clock ACLK0.

As discussed previously in relation to FIG. 4, when the constituent transceiver is configured as the master, its transmit clock TCLK is practically independent of its receive clock RCLK. In FIG. 5, when the constituent transceiver is the master, the transmit clock signal TCLK is generated by inputting the signal TCLK Offset, generated by the PHY Control system of the gigabit transceiver, to the phase selector 560. Based on the TCLK Offset, the phase selector 560 selects one of the 64 phases of the multi-phase signal 570 and produces the transmit clock signal TCLK. When the constituent transceiver is the slave, the transmit clock signal TCLK is generated by inputting the sum of the output of the NCO 508 and the signal TCLK Offset, via the adder 542, to the phase selector 560. Based on this sum, the phase selector 560 selects one of the 64 phases of the multi-phase signal 570 and produces the transmit clock signal TCLK. Thus, at the slave, the transmit clock signal TCLK and the receive clock signal RCLK are phase-locked (as discussed previously in relation to FIG. 4). In one embodiment of the present invention, the TCLK Offset is set equal to zero.

It is important to note that, referring to FIG. 5, the function performed by the combination of an NCO (508, 518, 528, 538) followed by a phase selector (610, 620, 630, 640, 650, 660) can be implemented by analog circuitry. The analog circuitry can be described as follows. Each of the filtered phase errors outputted from the loop filters (506, 516, 526, 536) would be inputted to a D/A converter to be converted to analog form. Each of the analog filtered phase errors would then be inputted to a voltage-controlled oscillator (VCO). The VCOs would produce the clock signals. The VCOs can be implemented with well-known analog techniques such as those using varactor diodes.

Figure 6:
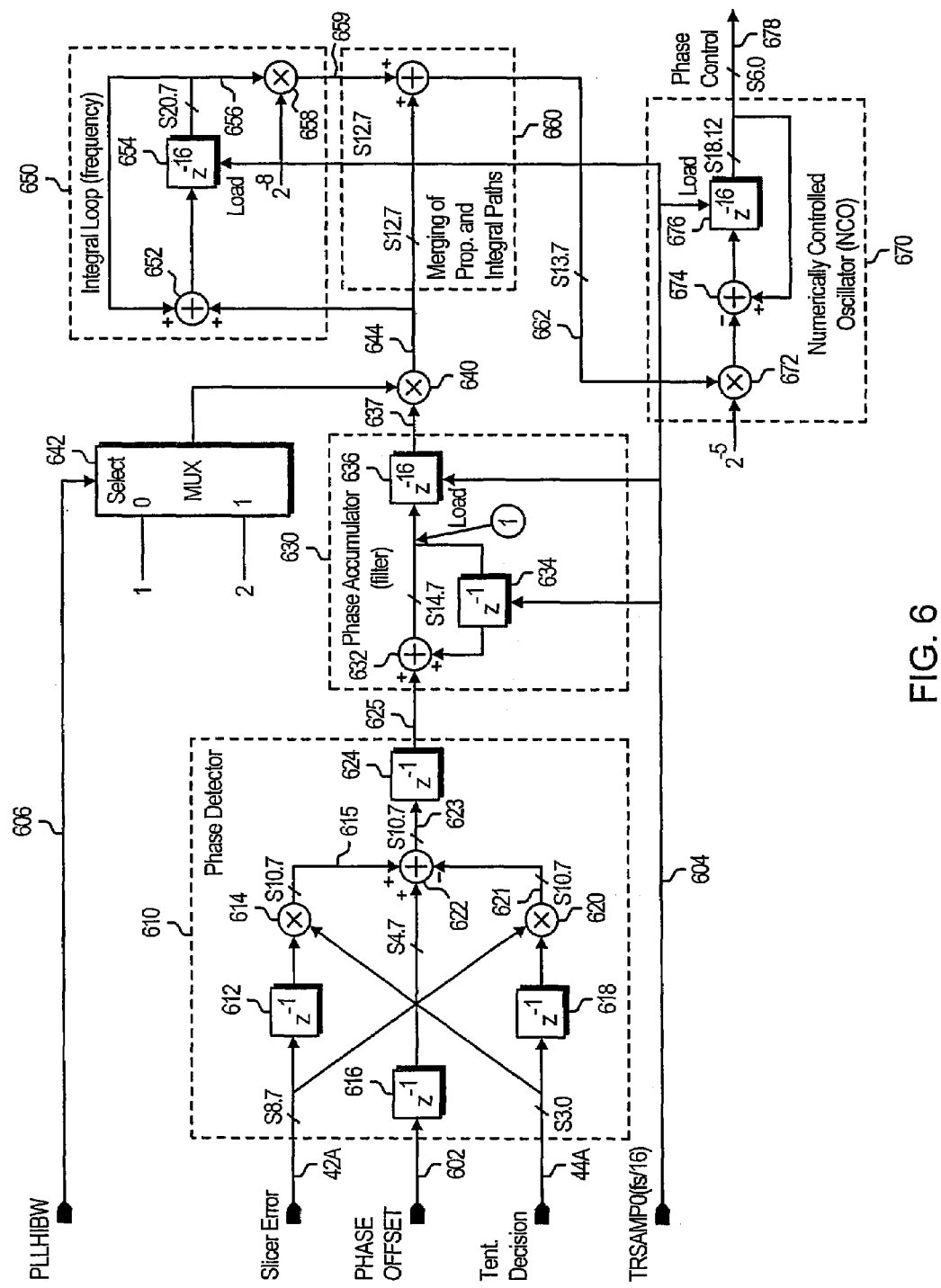
FIG. 6 is a block diagram of an exemplary implementation of the system of FIG. 5.

FIG. 6 is a block diagram illustrating a detailed implementation of the phase detectors 502, 512, 522, 532, the loop filters 506, 516, 526, 536, and the NCOs 508, 518, 528, 538 of FIG. 5.

It is important to note that the 4D path connecting the phase detectors 502, 512, 522, 532, the loop filters 506, 516, 526, 536, the NCOs 508, 518, 528, 538 and the phase selectors 510, 520, 530, 540 (FIG. 5) can be thought of as the 4D forward path of a phase locked loop whose 4D feedback path goes from, referring now to FIG. 2, the A/D converters 216 to the demodulator 226 then back to the timing recovery 222. The input to this phase locked loop is actually phase information embedded in the slicer error 42 and tentative decision 44, and the phase locked loop output is the phases of the sampling clock signals. This phase locked loop is digital but can be approximated by a continuous-time phase locked loop for practical design analysis purpose, as long as the sampling rate is much larger than the bandwidth of the loop. The theoretical transfer function of a continuous-time second-order phase locked loop is:

$$\frac{\Phi(s)}{\Theta(s)} = \frac{K_L \cdot s + K_L \cdot K_1}{s^2 + K_L \cdot s + K_L \cdot K_1}$$

where the transfer function of the loop filter is:

$$L(s) = K_L \cdot \left(1 + \frac{K_1}{s}\right) = K_v \cdot K_d \cdot \left(1 + \frac{K_1}{s}\right)$$

where $K_v$ is the gain of the voltage-controlled oscillator, $K_d$ is the gain of the phase detector, $K_L = K_V \cdot K_d$ and $K_I$ is the gain of the integrator inside the loop filter. For the digital phase locked loop of the present invention, the gain parameters $K_v$ and $K_I$ can be computed from the word lengths and scale factors used in implementing the NCO and the integrator of the loop filter. However, the gain of the phase detector $K_d$ is more conveniently computed by simulation. The gain parameters are used for the design and analysis of the digital phase locked loop.

FIG. 6 shows a phase detector 610, a first filter 630, a second filter 650, an adder 660 and an NCO 670. The phase detector 610 is an exemplary embodiment of the phase detectors 502, 512, 522, 532 of FIG. 5. The combination of the first filter 630, the second filter 650 and the adder 660 is an exemplary embodiment of the loop filters 506, 516, 526, 536 of FIG. 5. The NCO 670 is an exemplary embodiment of the NCOs 508, 518, 528, 538 of FIG. 5.

Figure 7:
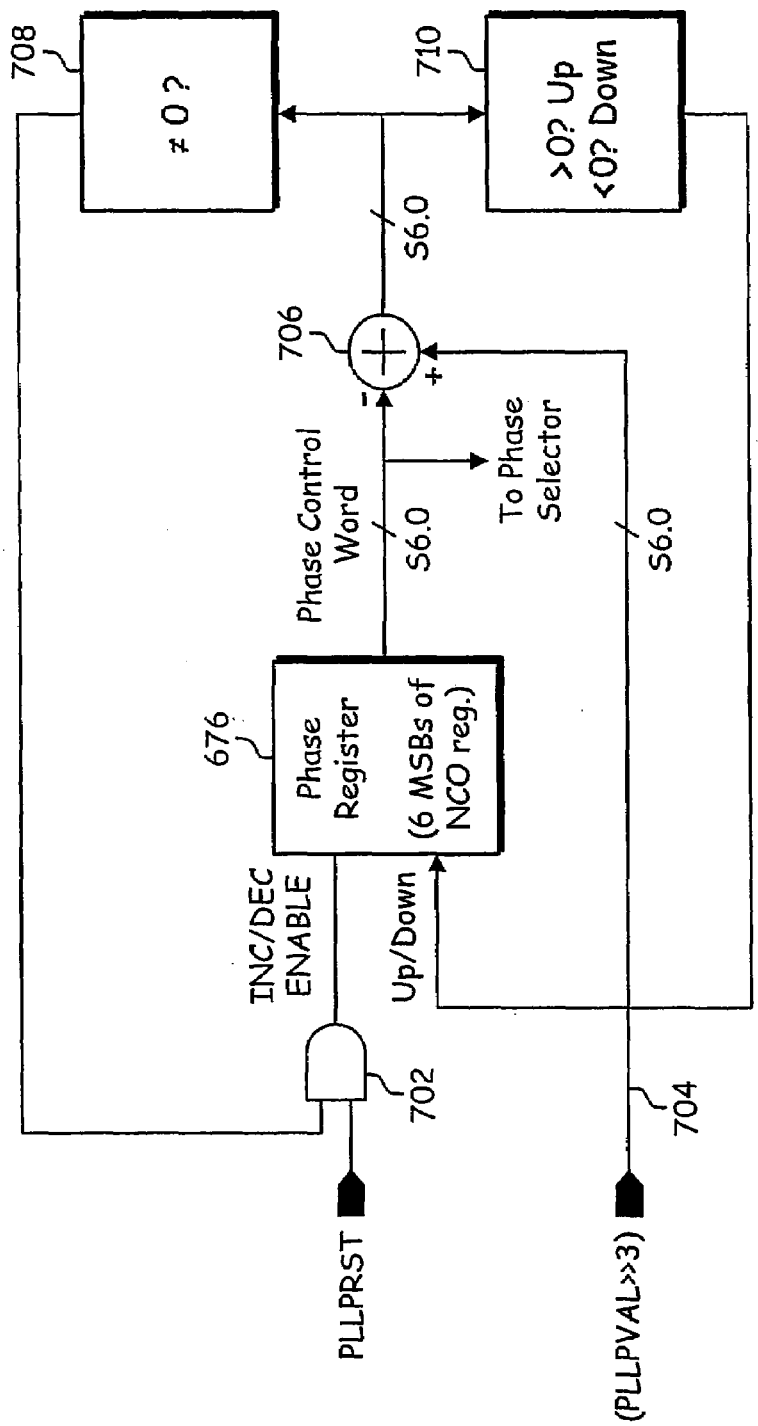
FIG. 7 is a block diagram of an exemplary embodiment of the phase reset logic block used for resetting the register of the NCO of FIG. 6 to a specified value.
Figure 8:
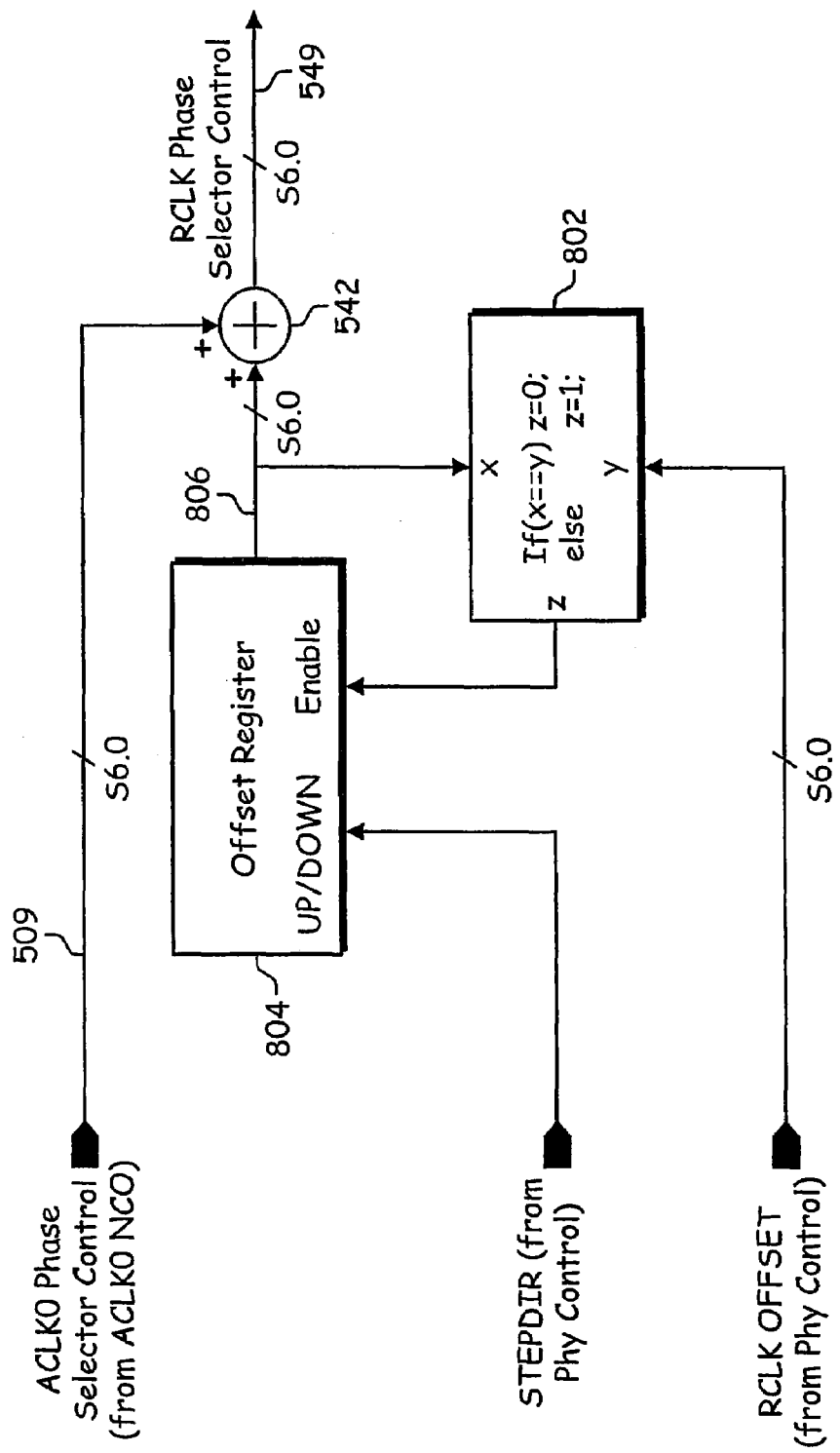
FIG. 8 is a block diagram of an exemplary phase shifter logic block used for the phase control of the receive clock signal RCLK.

In FIGS. 6 through 8, the numbers in the form "Sn.k" indicate the format of the data, where S denotes a signed number, "n" denotes the total number of bits and "k" denotes the number of bits after the decimal point.

The phase detector 610 includes a lattice structure having two delay elements 612, 618, two multipliers 614, 620 and an adder 622. The phase detector 610 receives as inputs the corresponding 1D component of the 4D slicer error 42 (FIGS. 2 and 3) and the corresponding 1D component of the 4D tentative decision 44 (FIGS. 2 and 3) from the trellis decoder 38 (FIGS. 2 and 3). For simplicity, in FIG. 6, these two 1D components are labeled as 42A and 44A, respectively. It is understood that, for the phase detector of each of the four constituent transceivers of the gigabit transceiver, a distinct 1D component of the slicer error 42 and a distinct 1D component of the tentative decision 44 are used as inputs. On the upper branch of the lattice structure, the slicer error 42 is delayed by one unit of time (here, one symbol period) via the delay element 612, then multiplied by the tentative decision 44A to produce a pre-cursor phase error 615. The pre-cursor phase error 615, when accumulated over time, represents the correlation between a past slicer error and a present tentative decision, thus indicates the sampling phase error with respect to the zero-crossing point at the start of the signal pulse (this zero-crossing point is part of the pre-cursor introduced by design to the signal pulse by the precursor filter 28 of the FFE 26 in FIG. 2). On the lower branch of the lattice structure, the tentative decision 44A is delayed by one unit of time via the delay element 618, then multiplied by the slicer error 42A to produce a post-cursor phase error 621. The post-cursor phase error 621, when accumulated over time, represents the correlation between a present slicer error and a past tentative decision, thus indicates the sampling phase error with respect to the level-crossing point in the tail end of the signal pulse. In one embodiment, this level-crossing point is determined by the first tap coefficient of the DFE 312 of FIG. 3. At the zero-crossing point at the start of the signal pulse, the slope of the signal pulse is positive, while at the level-crossing point at the tail end of the signal pulse, the slope of the signal pulse is negative. Thus, the pre-cursor phase error 615 and the post-cursor phase error 621 must be combined with opposite signs in the adder 622. The combination of the pre-cursor 615 and post-cursor phase errors 621 produces the phase error associated with one of the sampling clock signals ACLK0-ACLK3. This is the phase error indicated as one of the phase errors 0 through 3 in FIG. 5.

The phase offset 602 is one of the sampling clock offset signals ACLK0 Offset through ACLK3 Offset in FIG. 5. The phase offset 602, when needed, is generated by the PHY Control system of the gigabit transceiver. The phase offset 602 is delayed by one unit of time then is added to the combination of the pre-cursor error 615 and post-cursor 621 via the adder 622 to produce an adjusted phase error. The adjusted phase error 623 is stored in the delay element 624 and outputted to the first filter 630 at the next clock transition. The delay element 624 is used to prevent the propagation delay of the adder 622 from concatenating with the propagation delay of the adder 632 in the first filter 630.

The first filter 630, termed "phase accumulator", accumulates the phase error 625 outputted by the phase detector 610 over a period of time then outputs the accumulated result at the end of the period of time. In the exemplary embodiment shown in FIG. 6, this period of time is 16 symbol periods. The first filter 630 is an "accumulate-and-dump" filter which includes the adder 632, a delay element (i.e., register) 634, and a 16-units-of-time register 636. The register 626 outputs a lowpass filtered phase error 627 at the rate of one per period of the TRSAMP0 604 clock, that is, one every 16 symbol periods. When the register 626 outputs the lowpass filtered phase error 627, the register 634 is cleared and the accumulation of phase error 625 restarts. It is noted that, downstream from the register 626, circuits are clocked at one sixteenth of the symbol rate.

The filtered phase error 637 is inputted to a multiplier 640 where it is multiplied by a factor different than 1 when it is desired that the bandwidth of the phase locked loop be different than its normal value (which is determined by the design of the filter). In the exemplary embodiment depicted in FIG. 6, filtered phase error 637 is multiplied by the value 2 outputted from a multiplexer 642 when the select signal 606 indicates that the loop filter bandwidth must be larger than normal value. This occurs, for example, during startup of the gigabit transceiver. Similarly, although not shown in FIG. 6, when it is desired that the loop filter bandwidth be narrower than normal value, the filtered phase error 637 can be multiplied by a value less than 1.

The output 644 of the multiplier 640 is inputted to the second filter 650 which is an integrator and to the adder 660. The integrator 650 is an IIR filter having an adder 652 and a register 654, operating at one sixteenth of the symbol rate. The integrator 650 integrates the signal 644 (which is essentially the filtered phase error 637) to produce an integrated phase error 656. The purpose of the phase locked loop is to generate a resulting phase for a sampling clock signal such that the phase error is equal to zero. The purpose of the integrator 650 in the phase locked loop is to keep the phase error of the resulting phase equal to zero even when there is static frequency error. Without the integrator 650, the static frequency error would result in a static phase error which would be attenuated but not made exactly zero by the phase locked loop. With the integrator 650 in the phase locked loop, any static phase error would be integrated to produce a large growing input signal to the NCO 670, which would cause the phase locked loop to correct the static phase error. The integrated phase error 656 is scaled by a scale factor via a multiplier 658. This scale factor contributes to the determination of the gain of the integrator 650. The scaled result 659 is added to the signal 644 via an adder 660.

The output 662 of the adder 660 is inputted to the NCO 670. The output 662 is scaled by a scale factor, e.g., $2^{-5}$, via a multiplier 672. The resulting scaled signal is recursively filtered by an IIR filter formed by an adder 674 and a register 676. The IIR filter operates at one sixteenth of the symbol rate. The signal 678, outputted every 16 symbol periods, is used as the phase control signal to one of the phase selectors 510, 520, 530, 540, 550, 560 (FIG. 5).

For the embodiment shown in FIG. 6, the gain parameters discussed above are as follows. $K_v$, the gain of the NCO, is $2^{-11}$ for normal bandwidth mode, $2^{-10}$ for high bandwidth mode. $K_I$, the gain of the integrator 650, is equal to the product of the scaling of the integrator register 654 ($2^{-8}$ in FIG. 6) and the ratio of the phase locked loop sampling rate to the symbol rate ($2^{-4}$ in FIG. 6). For the word lengths and scaling indicated in FIG. 6, $K_I$ is equal to $2^{-12}$. The gain $K_d$ of the phase detector 610 is computed by simulations and is equal to 2.2. These parameters are used to compute the theoretical transfer function of the phase locked loop (PLL) which is then compared with the PLL transfer function obtained by simulation. The match is near perfect, confirming the validity of the design parameters.

One embodiment of the system 600 of FIG. 6 further includes the external control signals PLLFRZ, PLLPVAL, PLLPRST, PLLFVAL, PLLFRST, PLLPRAMP, which are not shown explicitly in FIG. 6.

The control signal PLLFRZ, when applied, forces the phase error to zero at point 1 of the first filter 630, therefore causes freezing of updates of the frequency change and/or phase change, except for any phase change caused by a non-zero value in the frequency register 654 of the integrator 650.

The control signal PLLPVAL is a 3-bit signal provided by the PHY Control system. It is used to specify the reset value of the NCO register 676 of the NCO 670, and is used in conjunction with the control signal PLLPRST.

The control signal PLLPRST, when applied to the NCO register 676 in conjunction with the signal PLLPVAL, resets the 6 most significant bits of the NCO register 676 to a value specified by 8 times PLLPVAL. The reset is performed by stepping up or down the 6 MSB field of the NCO register 676 such that the specified value is reached after a minimum number of steps. Details of the phase reset logic block used to reset the value of the register 676 of the NCO 670 are shown in FIG. 7 and will be discussed later.

PLLFVAL is a 3-bit signal provided by the PHY Control system. It is to be interpreted as a 3-bit two's complement signed integer in the range [-4,3]. It is used to specify the reset value of the frequency register 654 of the integrator 650 and is used in conjunction with the control signal PLLFRST.

The control signal PLLFRST, when applied to the frequency register 654 of the integrator 650 in conjunction with the signal PLLFVAL, resets the frequency register 654 to the value 65536 times PLLFVAL.

The control signal PLLPRAMP loads the fixed number -2048 into the frequency register 654 of the integrator 650. This causes the phase of a sampling clock signal (and receive clock RCLK) to ramp at the fixed rate of -2 ppm. This is used during startup at the master constituent transceiver. PLLPRAMP overrides PLLFRST. In other words, if both PLLPRAMP and PLLFRST are both applied, the value loaded into the frequency register 654 is -2048, regardless of the value that PLLFRST tries to load.

FIG. 7 is a block diagram illustrating the phase reset logic block 700 to the NCO 670. The control signal PLLPRST is applied to the AND gate 702. The output of the AND gate 702 is applied to the increment/decrement enable input of the register 676. The 3-bit value PLLPVAL from the PHY Control System of the gigabit transceiver is shifted left by 3 bits to form a 6-bit value 704. The current output of the register 676 of the NCO 670 (FIG. 6), which is the phase control signal inputted to the corresponding phase selector (FIG. 5), is subtracted from this shifted value of PLLPVAL via an adder 706. Module 708 determines whether the output of adder 706 is non-zero. If it is non-zero, then module 708 outputs a "1" to the AND gate 702 to enable the enable input of register 676. If it is zero, module 706 outputs a zero to the AND gate 708 to disable the enable input of the register 676. Module 710 determines whether the output of adder 706 is positive or negative. If it is positive, module 710 outputs a count up indicator to the register 676. If it is negative, module 710 outputs a count down indicator to register 676.

The subtraction at adder 706 finds the shortest path from the current value of the NCO register 676 to the shifted PPLVAL 704. For example, suppose the current phase value of register 676 is 20. If the shifted PPLVAL 704 (which is the desired value) is 32, the difference is 12, which is positive, therefore, the register 676 is incremented. If the desired phase value is 56, the difference is 36 or "100100" which is interpreted as -28, so the register 676 will be decremented 28 consecutive times. The phase steps occur at the rate of one every 16 symbol periods. This single stepping is needed because of the way the phase selector operates. The phase selector can only increment or decrement from its current setting.

FIG. 8 is a block diagram of an exemplary phase shifter logic block used for the phase control of the receive clock signal RCLK. The phase shifter logic block 800 is needed when the signal RCLK Offset (FIG. 5) is used to adjust the phase of the receive clock signal RCLK. The signal RCLK Offset is a 6-bit signal provided by the PHY Control system, and specifies the amount by which the phase of RCLK must shifted. Even if the signal RCLK Offset indicates a large amount of phase shift, this phase shift must be transferred to the input of the phase selector 550 (FIG. 5) one step at a time due to the way the phase selector operates. The change of phase of RCLK must occur in the direction indicated by a control signal STEPDIR generated by the PHY Control system.

The phase shifter logic block 800 includes a comparator 802, an offset register 804 and the adder 542 (the same adder indicated in FIG. 5). The comparator 802 compares the output 806 of the offset register 804 with the signal RCLK Offset. If the two signals are equal, then the comparator 802 outputs a "0" to the enable input of the offset register 804 to disable the up/down counting of the offset register 804, thus keeping the output 806 the same for the next time period. If the two signals are not equal, the comparator 802 outputs a "1" to the enable input of the offset register 804 to enable the up/down counting, causing the output 806 to be incremented or decremented at the next time period. The signal STEPDIR from the PHY Control system is inputted to the up/down input of the offset register 804 to control the counting direction. The output 806 from the offset register 804 is added to the phase control signal 509 produced by the NCO 508 (FIG. 5) via the adder 542 to generate the phase control signal 549 (FIGS. 8 and 5) for the RCLK phase selector 550 (FIG. 5).

The coupling of switching noise from the digital signal processor that implements the transceiver functions to each of the A/D converters is an important problem that needs to be addressed. Switching noise occurs when transistors switch states in accordance with transitions in the clock signal (or signals) that controls their operation. Switching noise in the digital section of the transceiver can be coupled to the analog section of the transceiver. Switching noise can cause severe degradation to the performance of an A/D converter if it occurs right at or near the instant the A/D converter is sampling the received signal. The present invention, in addition to providing a timing recovery method and system, also provides a method and system for minimizing the degradation of the performance of the A/D converters caused by switching noise.

The effect of switching noise on an A/D converter can be reduced if the switching noise is synchronous (with a phase delay) with the sampling clock of the A/D converter. If, in addition, it is possible to adjust the phase of the sampling clock of the A/D converter with respect to the phase of the switching noise, then the phase of the sampling clock of the A/D converter can be optimized for minimum noise. It is noted that, for a local gigabit transceiver, the sampling clock signals ACLK0, ACLK1, ACLK2, ACLK3 are synchronous to each other (i.e., having the same frequency) because they are synchronous to the 4 transmitters of the remote transceiver and these 4 remote transmitters are clocked by a same transmit clock signal TCLK. It is also important to note that the local receive clock signal RCLK is synchronous to the local sampling clock signals ACLK0, ACLK1, ACLK2, ACLK3.

Referring to FIGS. 2 and 5, the four A/D converters 216 of the four constituent transceivers are sampled with the sampling clock signals ACLK0, ACLK1, ACLK2, ACLK3. Each of the phases of these sampling clock signals is determined by the subsystem 600 (FIG. 6) of the timing recovery system 222 in response to the phase of the corresponding received signal, which depends on the remote transmitter and the line characteristics. Thus, the phases of the sampling clock signals change from line to line, and are not under the control of the system designer.

However, the relative phase of the receive clock signal RCLK with respect to the sampling clock signals ACLK0, ACLK1, ACLK2, ACLK3 can be controlled by adjusting the signal RCLK Offset (FIG. 5). The signal RCLK Offset can be used to select the RCLK phase that would cause the least noise coupling to the A/D converters 216 of FIG. 2. The underlying principle is the following. Referring to FIG. 2 and the boundaries of the clock domain, the entire digital signal processing, control and interface functions of the receiver operate in accordance with transitions in the receive clock signal RCLK. In other words, most of the digital logic circuits switch states on a transition of RCLK (more specifically, on a rising edge of RCLK). Only a small portion of the transceiver operates in accordance with transitions in the transmit clock signal TCLK. Therefore, most of the switching noise is synchronous with the receive clock signal RCLK. Since the receive clock signal RCLK is synchronous with the sampling clock signals ACLK0, ACLK1, ACLK2, ACLK3, it follows that most of the switching noise is synchronous with the sampling clock signals ACLK0, ACLK1, ACLK2, ACLK3. Therefore, if the phase of the receive clock signal RCLK is adjusted such that a transition in the signal RCLK occurs as far as possible in time from each of the sampling clock signals ACLK0, ACLK1, ACLK2, ACLK3, then the switching noise coupling to the A/D converters will be minimized.

The process for adjusting the phase of the receive clock signal RCLK can be summarized as follows. The process performs an exhaustive search over all the RCLK phases that, by design, can possibly exist in one symbol period. For each phase, the process computes the sum of the mean squared errors (MSEs) of the 4 pairs (i.e., the 4 constituent transceivers). At the end of the search, the process selects the RCLK phase that minimizes the sum of the MSEs of the four pairs. The following is a description of one embodiment of the RCLK phase adjustment process, where there are 64 possible RCLK phases.

Figure 9A:
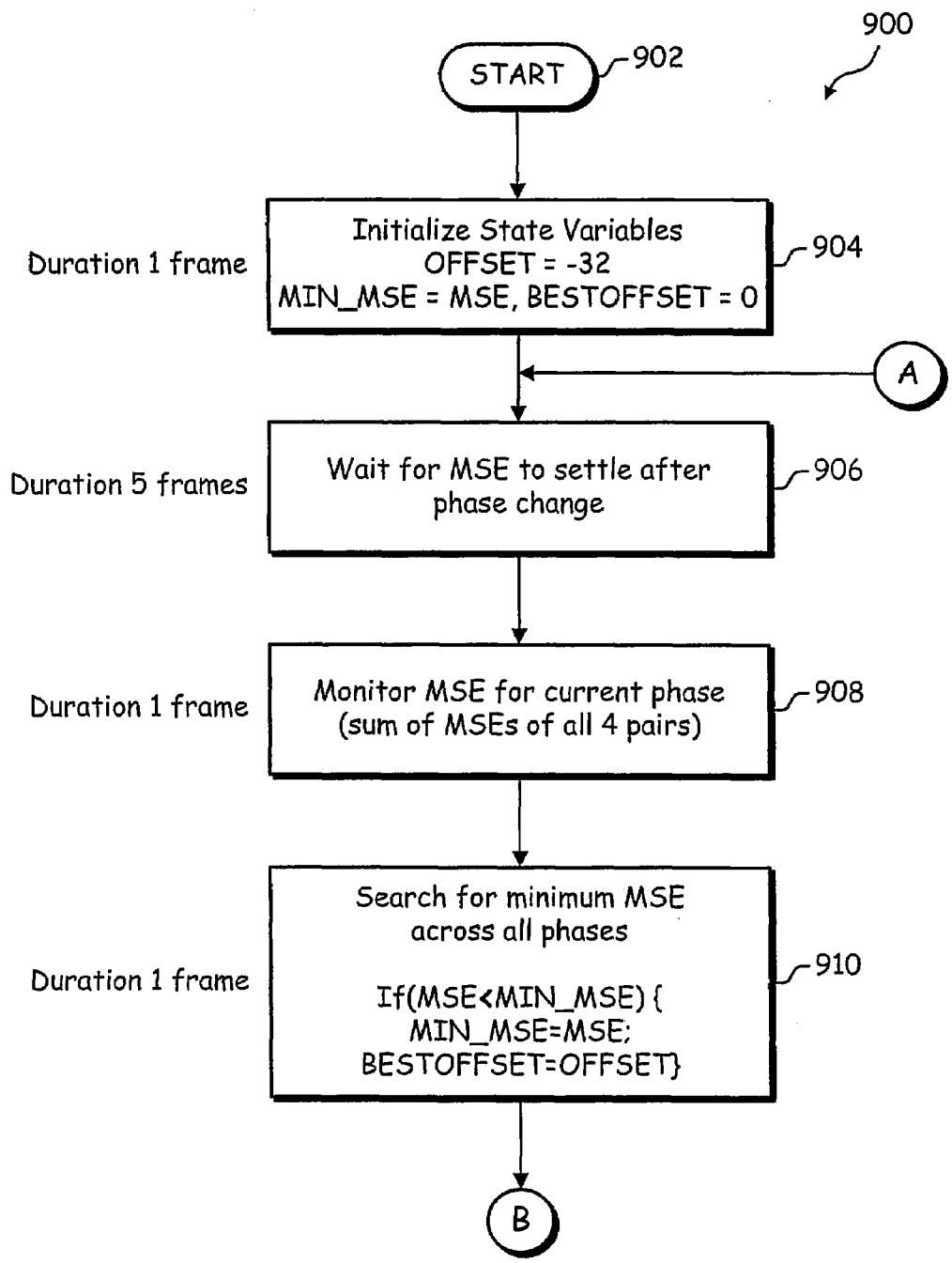
FIG. 9 is a flowchart of an embodiment of the process for adjusting the phase of the receive clock signal RCLK.
Figure 9B:
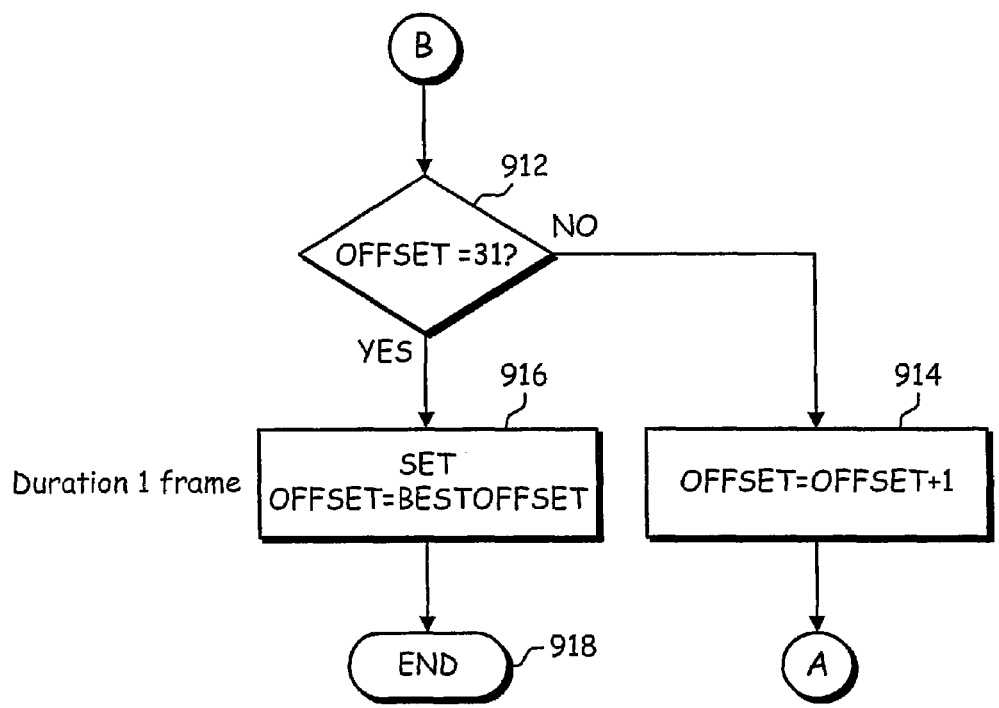

FIGS. 9a and 9b comprise a flowchart illustrating the process 900 for adjusting the phase of the receive clock signal RCLK. Upon Start (block 902), process 900 initializes all the state variables (which include counters, registers), sets Offset to −32 (block 904), sets Min_MSE equal to the MSE of the gigabit transceiver before any RCLK phase change, and sets BestOffset equal to zero. The MSE of the gigabit transceiver is the sum of the mean squared errors (MSEs) of the 4 constituent transceivers. The MSE of a constituent transceiver is the mean squared error of the corresponding 1D component of the 4D slicer error 42 (FIG. 2), and is outputted by a MSE computation block 1200 (FIG. 12) for every frame. Each frame is equal to 1024 symbol periods. This initialization is done within a duration of 1 frame. Process 900 then waits for the effect of the RCLK phase change on the system to settle (block 906). The duration of this waiting is 5 frames. Process 900 then computes MSE (by summing the MSEs of all four constituent transceivers outputted by the corresponding MSE computation block 1200 of FIG. 12) which corresponds to the current setting of RCLK Offset (block 908). The duration of block 908 is one frame. In block 910, process 900 compares the new MSE with Min_MSE. If the new MSE is strictly less than Min_MSE, then Min-MSE is set to the value of the new MSE and BestOffset is set to the value of Offset. In block 912, process checks whether Offset is equal to 31, i.e., whether all possible 64 phase offsets have been searched. If Offset is not equal to 31, then process 900 increments Offset by 1 (block 914) then continues the search for the best RCLK Offset by going back to block 906. If Offset is equal to 31, that is, if process 900 has searched all possible 64 phase offsets, then process 900 sets Offset equal to the value of BestOffset (block 916) then terminates (block 918). The duration of each of blocks 914 and 916 is 1 frame.

After adjustment of the receive clock RCLK phase, small adjustments can be made to the phases of the sampling clocks ACLK1, ACLK2, ACLK3 to further reduce the coupling of switching noise to the A/D converters. Since the timing recovery system 222 of FIG. 5 without the ACLK0-3 Offsets, through the phase locked loop principle, already sets the sampling clocks at the optimal sampling positions with respect to the pulse shape of incoming signals from the remote transceivers, the small phase adjustments made to the sampling clocks could cause some loss of performance of the A/D converters. However, the net result is still better than performing no phase adjustment of the sampling clocks and allowing the A/D converters to sample the incoming signals at a noisy instant where the transistors in the digital section are switching states. In the embodiment depicted in FIG. 5, phase adjustment is not made to the sampling clock ACLK0 because, by design of the structure of the embodiment, the phase difference between ACLK0 and RCLK is equal to RCLK Offset. Thus, in this embodiment, any adjustment to the phase of ACLK0 will also move RCLK away from the optimal position determined by process 900 above by the same amount of phase adjustment.

Figure 10A:
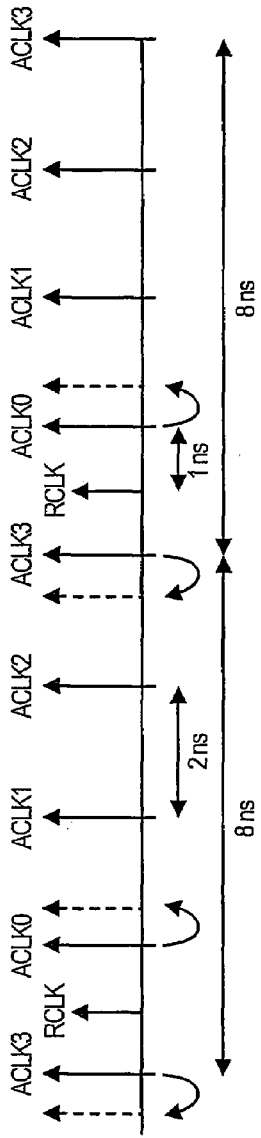
FIG. 10A is a first example of clock distribution where the transitions of the four sampling clock signals ACLK0-3 are evenly distributed within the symbol period.
Figure 10B:
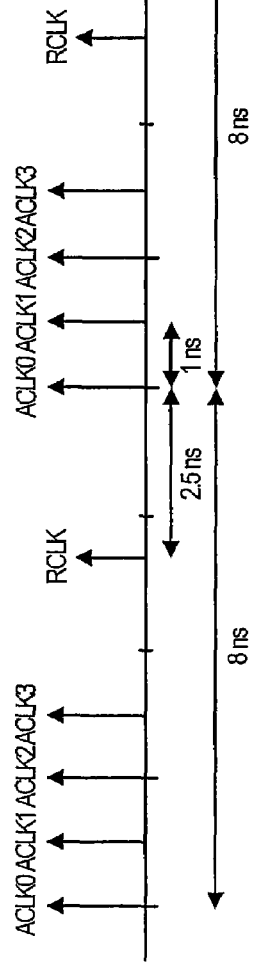
FIG. 10B is a second example of clock distribution where the transitions of the four sampling clock signals ACLK0-3 are distributed within the symbol period of 8 nanoseconds (ns) such that each ACLK clock transition is 1 ns apart from an adjacent ACLK clock transition.
Figure 10C:
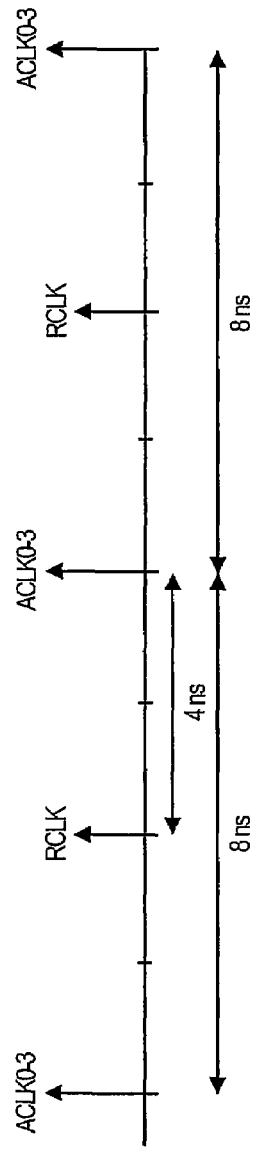
FIG. 10C is a third example of clock distribution where the transitions of the four sampling clock signals ACLK0-3 occur at the same instant within the symbol period.

FIGS. 10a, 10b, 10c illustrate three examples of distribution of the transitions of clock signals within a symbol period to further clarify the concept of phase adjustment of the clock signals. It is noted that, in these examples, the four sampling clock signals ACLK0-3 are shown as occurring in their consecutive order within a symbol period for illustrative purpose only. It is understood that the sampling clock signals AGLK0-3 can occur in any order.

FIG. 10a is a first example of clock distribution where the transitions of the four sampling clock signals ACLK0-3 are evenly distributed within the symbol period of 8 nanoseconds (ns). Thus, each ACLK clock transition is 2 ns apart from an adjacent transition of another ACLK clock. Therefore, for this clock distribution example, a transition of the receive clock RCLK can only be placed at most 1 ns away from an adjacent ACLK transition. This "distance" (phase delay) may not be enough to reduce the coupling of switching noise to the two A/D converters associated with the two adjacent sampling clock signals (ACLK3 and ACLK0, in the example). In this case, it may be desirable to slightly adjust the phase of the two adjacent sampling clock signals to move their respective transitions further away from a RCLK transition, as illustrated by their new transition occurrences within a symbol period in FIG. 10A.

FIG. 10b is a second example of clock distribution where the transitions of the four sampling clock signals ACLK0-3 are distributed within the symbol period of 8 nanoseconds (ns) such that each ACLK clock transition is 1 ns apart from an adjacent transition of another ACLK clock. For this clock distribution example, a transition of the receive clock RCLK can be positioned midway between the last ACLK transition of one symbol period (ACLK3 in FIG. 10B) and the first ACLK transition of the next symbol period (ACLK0 in FIG. 10B) so that the RCLK transition is 2.5 ns from an adjacent ACLK transition. This "distance" (phase delay) may be enough to reduce the coupling of switching noise to the two A/D converters associated with the two adjacent sampling clock signals (ACLK3 and ACLK0, in the example). In this case, phase adjustment of the two adjacent sampling clock signals to move their respective transitions further away from a RCLK transition may not be needed.

FIG. 10c is a third example of clock distribution where the transitions of the four sampling clock signals ACLK0-3 occur at the same instant within the symbol period of 8 nanoseconds (ns). In this clock distribution example, a transition of the receive clock RCLK can be positioned at the maximum possible distance of 4 ns from an adjacent ACLK transition. This is the best clock distribution that allows maximum reduction of coupling of switching noise to the four A/D converters associated with the sampling clock signals. In this case, there is no need for phase adjustment of the sampling clock signals.

For the embodiment shown in FIG. 5 of the timing recovery system 222 (FIG. 2), the following phase adjustment process is applied to the three sampling clock signals ACLK1, ACLK2, ACLK3. It is understood that, in a different embodiment of the timing recovery system 222 (FIG. 2) where the receive clock signal RCLK is not tied to one of the sampling clock signals ACLK0-3, the following phase adjustment process can be applied to all of the sampling clock signals.

The process for adjusting the phase of a sampling clock signal ACLKx ("x" in ACLKx denotes one of 0,1,2,3) can be summarized as follows. The process performs a search over a small range of phases around the initial ACLKx phase. For each phase, the process logs the mean squared error MSE of the associated constituent transceivers. At the end of the search, the process selects the ACLKx phase that minimizes the MSE of the associated constituent transceiver.

Whenever the phase of a sampling clock signal ACLKx changes, the coefficients of the echo canceller 232 and of the NEXT cancellers 230 change. Thus, to avoid degradation of performance, the phase steps of the sampling clocks should be small so that the change they induce on the coefficients is also small. When the phase adjustment requires multiple consecutive phase steps, the convergence of the coefficients of the echo canceller 232 and of the NEXT cancellers 230 should be fast in order to avoid a buildup of coefficient mismatch.

Figure 11A:
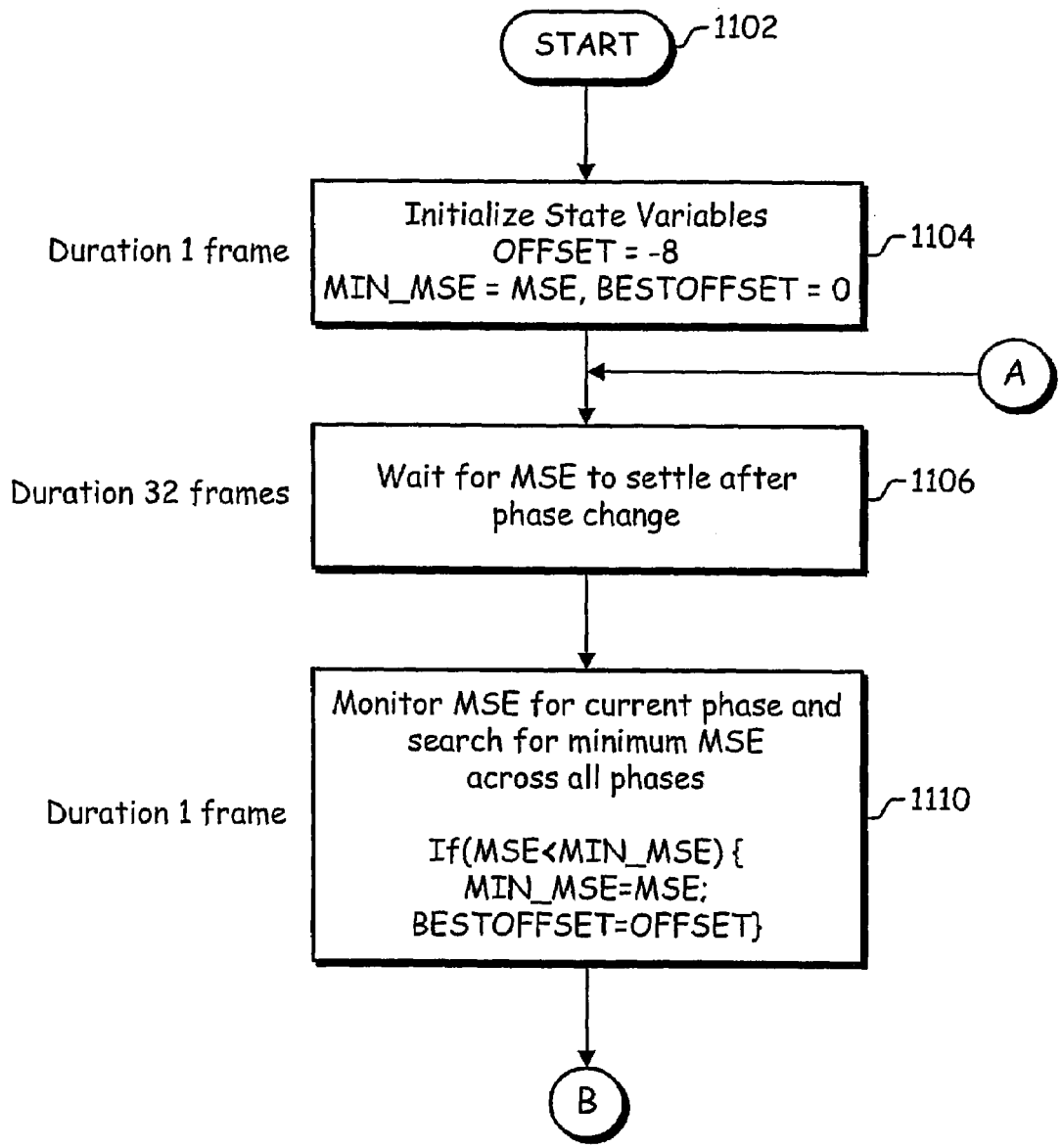
FIG. 11 is a flowchart of an embodiment of the process for adjusting the phase of a sampling clock signal ACLKx associated with one of the constituent transceivers.
Figure 11B:
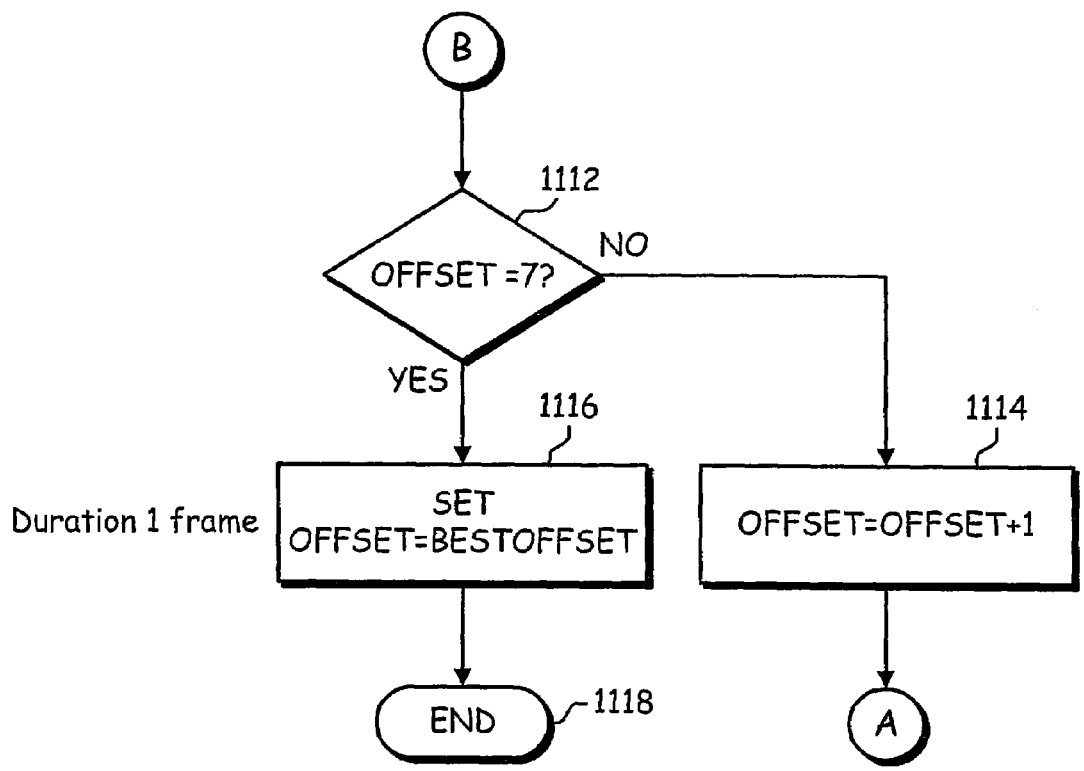

FIGS. 11a and 11b comprise a flowchart illustrating an embodiment of the process for adjusting the phase of a sampling clock signal ACLKx associated with one of the constituent transceivers, where the search is over a range of 16 phases around the initial ACLKx phase. For each of the constituent transceivers, the process of FIGS. 11a and 11b is run independently of and concurrently with the other constituent transceivers. Upon Start (block 1102), process 1100 initializes all the state variables (which include counters, registers), sets Offset to −8 (block 1104), sets Min_MSE equal to the MSE of the associated constituent transceiver before any RCLK phase change, and sets BestOffset equal to zero. The MSE of the associated constituent transceiver is the mean squared error of the corresponding 1D component of the 4D slicer error 42 (FIG. 2). This initialization is done within a duration of 1 frame. Process 1100 then waits for the effect of the ACLK phase change on the system to settle (block 1106). The duration of this waiting is 32 frames. (block 1108). The duration of block 1108 is one frame. In block 1110, process 1100 compares the new MSE (outputted by the corresponding MSE computation block 1200 of FIG. 12) which corresponds to the current setting of ACLKx Offset with Min_MSE. If the new MSE is strictly less than Min_MSE, then Min-MSE is set to the value of the new MSE and BestOffset is set to the value of Offset. In block 1112, process 1100 checks whether Offset is equal to 7, i.e., whether all 16 phase offsets in the range have been searched. If Offset is not equal to 7, then process 1200 increments Offset by 1 (block 1114) then continues the search for the best ACLKx Offset by looping back to block 1106. If Offset is equal to 7, that is, if process 1100 has searched all the 16 phase offsets in the range, then process 1100 sets Offset equal to the value of BestOffset (block 1116) then terminates (block 1118). The duration of each of blocks 1114 and 1116 is 1 frame.

Figure 12:
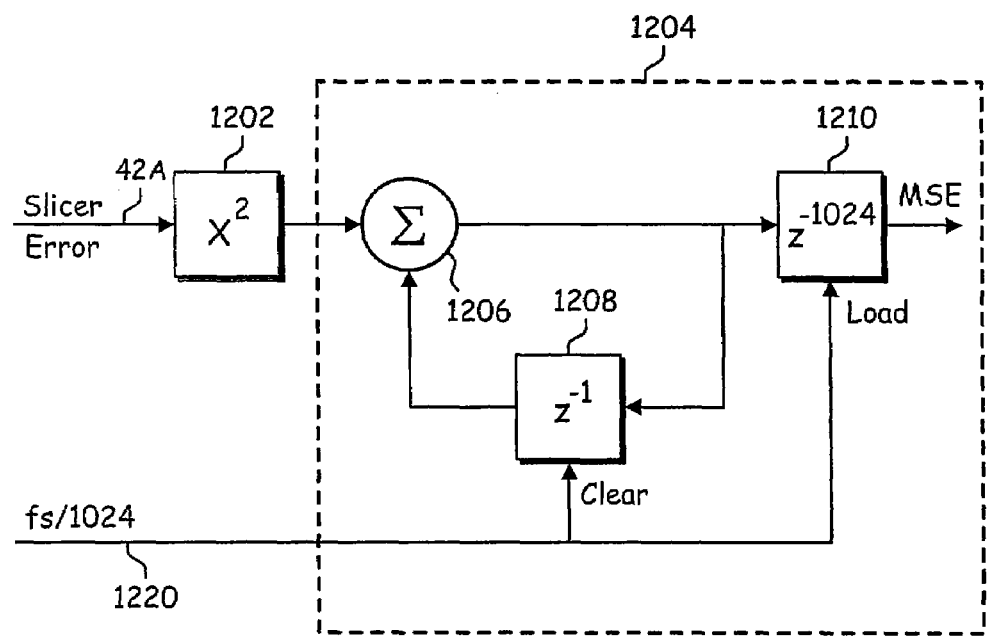
FIG. 12 is a block diagram of an embodiment of the MSE computation block used for computing the mean squared error of a constituent transceiver.

FIG. 12 is a block diagram of an exemplary implementation of the MSE computation block used for computing the mean squared error of a constituent transceiver. In one embodiment of the gigabit transceiver, there are four MSE computation blocks, one for each of the four constituent transceivers. The four MSE computation blocks are run independently and concurrently for the four constituent transceivers. The MSE computation block 1200 includes a squaring module 1202 and an infinite impulse response (IIR) filter 1204. The IIR filter 1204 includes an adder 1206, a feedback delay element 1208 and a forward delay element 1210. The squaring module 1202 receives the corresponding 1D component of the 4D slicer error 42 (FIG. 2), which is denoted as 42A for simplicity, and out puts the squared error value to the filter 1204. The filter 1204 accumulates the squared error values by adding via the adder 1206 the current squared error value to the previous squared error value stored in the feedback delay element 1208. The accumulated value is stored in the forward register 1210. In the exemplary embodiment shown in FIG. 12, the squared error values are accumulated for 1024 symbol periods (which is one frame of the PHY Control system). Since the accumulation period is sufficiently long, the accumulated value practically corresponds to the mean squared error. At the end of the accumulation period, the clock signal 1220 from the PHY Control system clears the contents of the feedback delay element, and clocks the forward delay element 1210 so that the forward delay element 1210 outputs the accumulated value MSE and resets to zero.

Figure 13:
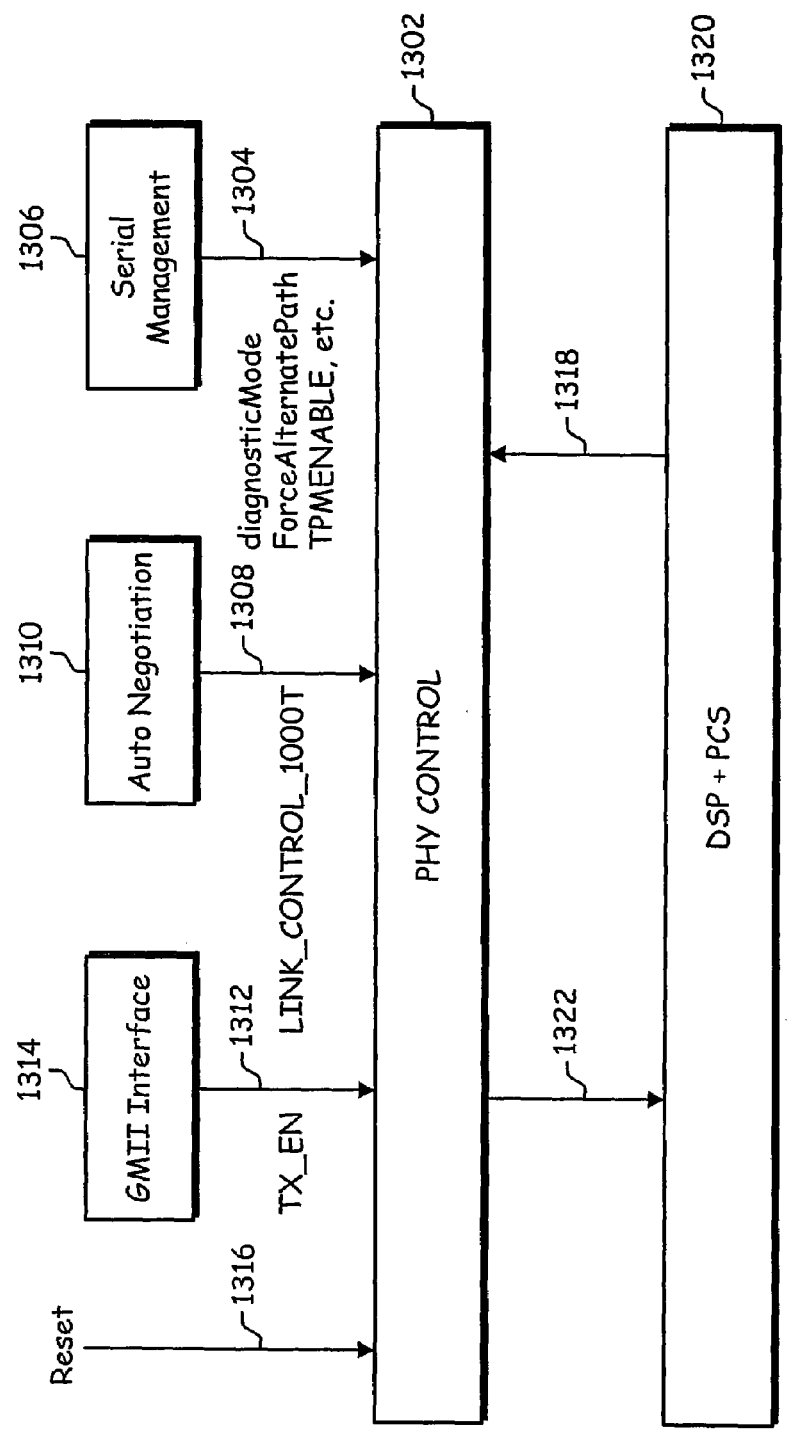
FIG. 13 is a high-level block diagram of the gigabit transceiver illustrating the interactions between the PHY Control module and other modules of the gigabit transceiver.

FIG. 13 is a high-level block diagram of the gigabit transceiver illustrating the interactions between the PHY Control module and other modules of the gigabit transceiver. The PHY Control module 1302 receives user-defined signals 1304 from the Serial Management module 1306, the link control signal 1308 from the Auto Negotiation module 1310, the transmit enable signal from the GMII module 1314, and status signals 1318 from the Digital Signal Processing (DSP) module and the Physical Coding Sublayer (PCS) module. The PHY Control module 1302 can also receive a reset signal 1316 directly from a user to reset all state machines of the PHY Control module and to reset the DSP and PCS modules.

Based on the signals it receives and its internal states, the PHY Control module 1302 outputs control signals 1322 to the DSP and PCS modules to control operations of these two modules. The DSP module includes all the blocks that are in the Receive Clock domain as shown in FIG. 2, except the Receive PCS 204R and the Receive GMII 202R.

Inputs to the Serial Management module 1306 are provided by a user or by software, and, for simplicity of design, can be stored and read out serially as the user-defined signals 1304. Examples of user-defined signals are DiagnosticMode (to operate the gigabit transceiver in diagnostic mode), ForceAlternatePath (to force a state machine of the PHY Control to take an alternate path) and TPMENABLE (to enable Tap Power Management).

The Link_Control_1000T signal 1308 from the Auto Negotiation module indicates whether a link is to be established with a remote transceiver. The transmit enable signal 1312 from the GMII module indicates whether transmission of packets can start.

The PHY Control module can reset the DSP and PCS modules. By reset, it is meant initializing everything, including clearing all registers.

The PHY Control module controls the convergence of the Echo cancellers 232 and NEXT cancellers 230 (FIG. 2), the DFE 312 (FIG. 3) and the Timing Recovery block 222 (FIG. 2). The PHY Control module also controls the ramping down of the parameter k of the Inverse Partial Response (IPR) filter 30 (FIG. 2) during the startup of the gigabit transceiver.

The PHY Control module controls the alignment function of the Receive PCS 204R. As stated previously, the PCS aligns the four signals received over the four pairs and deskews them before they are provided to the decoder 38 (FIG. 2).

The PHY Control module controls the operation of the Tap Power Management which is a sub-module of the PHY Control module. The Tap Power Management enables part of the Echo cancellers 232 and NEXT cancellers 230 (FIG. 2) during the startup. After startup, the Tap Power Management activates or deactivates certain taps in accordance to a criterion to optimize the tradeoff between power consumption and system performance. The tap activation or deactivation is staggered across the four pairs to avoid large power surges. The Tap Power Management will be described in detail later.

The PHY Control module optimizes the phase of the receive clock RCLK relative to the phases of the four sampling clocks ACLK0-ACLK3 to minimize the effect of switching noise on the four A/D converters 216 (FIG. 2). This has been described previously in relation to the flowchart of FIG. 9.

The PHY Control module performs small adjustments to the phases of the four sampling clocks ACLK0-ACLK3 to further optimize the system performance. This has been described previously in relation to the flowchart of FIG. 11.

The PHY Control module re-centers the A/D FIFO 218 and the FIFOs 234 (FIG. 2) after timing acquisition and phase adjustments of the receive clock RCLK and sampling clocks ACLK0-ACLK3.

The PHY Control module implements various test modes such as Diagnostic Mode, Alternate Path and Loopback. In Loopback mode, referring to FIG. 2, signals outputted from the Transmit PCS 204T pass through the FIFOs 234 then loop back directly to the Receive PCS 204R without passing through any other block.

The PHY Control module monitors performance of the receiver during normal operation. If the receiver performance drops below a pre-specified level, the PHY Control module retrains the receiver.

Figure 14:
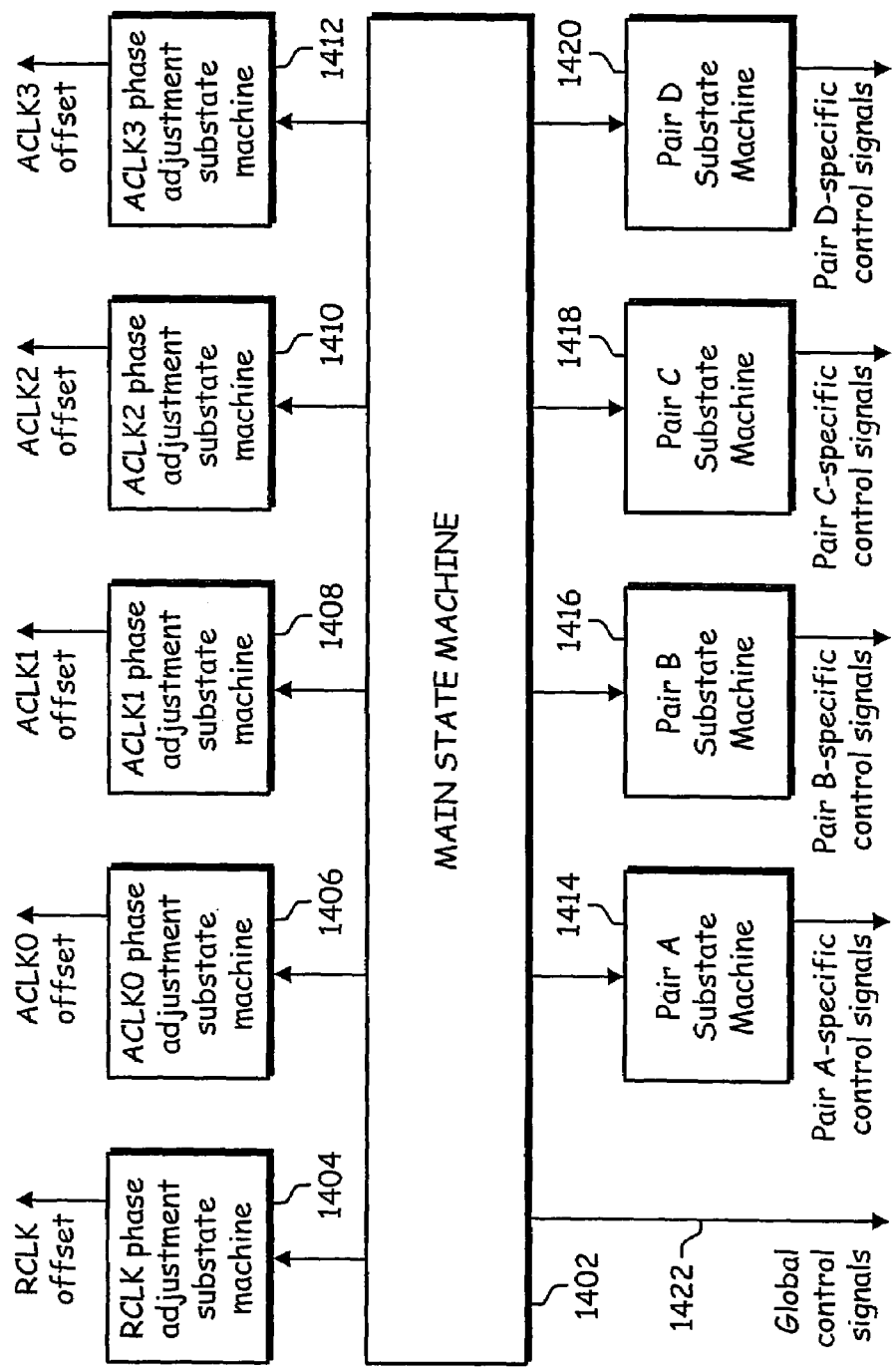
FIG. 14 illustrates the hierarchical structure of the PHY Control module.

FIG. 14 illustrates the hierarchical structure of the PHY Control module. The PHY Control module includes a main state machine 1402 which controls operations of a set of substate machines.

The RCLK phase adjustment substate machine outputs the control signal RCLK offset to the Timing Recovery block 222 (FIG. 2) to adjust the phase of the receive clock RCLK. The RCLK phase adjustment substate machine corresponds to the flowchart shown in FIG. 9 and is as described above in relation to FIG. 9. Each of the ACLKx (x=0, . . . , 3) phase adjustment substate machines 1406, 1408, 1410, 1412 outputs a respective ACLKx offset to adjust the phase of the corresponding sampling clock ACLKx (x=0, . . . , 3). These substate machines correspond to the flowchart shown in FIG. 11 and are as described above in relation to FIG. 11.

The main state machine 1402 controls four pair-specific substate machines 1414, 1416, 1418, 1420, each of which is specific to one of the four constituent transceivers (also called pairs) A, B, C, D. Each of these four substate machines outputs control signals that are specific to the corresponding constituent transceiver. The main state machine 1402 also outputs global control signals 1422 to all four pairs.

The four constituent receivers converge independently. Each one is controlled by a separate pair-specific substate machine (1414, 1416, 1418, 1420). This allows retries of the convergence of one constituent receiver in case it fails the first try, without having to reset the constituent receivers that succeed. Within each pair-specific substate machine, different substate machines are used for convergence of the Master Echo/NEXT cancellers, convergence of the Master DFE, convergence of the Slave Echo/NEXT cancellers, convergence of the Slave DFE. These substate machines are described below in relation to FIGS. 18 through 21.

Except for the Tap Power Management which runs at the sampling clock rate of $f_s$=125 MHz, most parts of the PHY Control module can run at much lower clock rates to reduce power dissipation in the PHY Control module. For example, most of the PHY Control module can run at the clock rate of $f_s/1024$, i.e., 122 kHz. The clock rate for RCLK offset is $f_s/16$. The clock rate for the control signal for AGC 220 (FIG. 2) is $f_s/128$. The clock rate for control signal TRSAMP0 (FIG. 6) for the phase locked loop of the Timing Recovery block is $f_s/16$. The clock rate for the control signal which updates the Offset canceller 228 is $f_s/4$.

The PHY Control module includes a mean square error (MSE) computation block for each constituent transceiver to compute the MSE of the respective constituent transceiver. This MSE computation block is as shown in FIG. 12 and described above. The MSE is compared with different thresholds to provide control signals EnergyDetect, MSEOK1, MSEOK2, MSEOK3 which are used by the main state machine and the substate machines of the PHY Control module.

Figure 15:
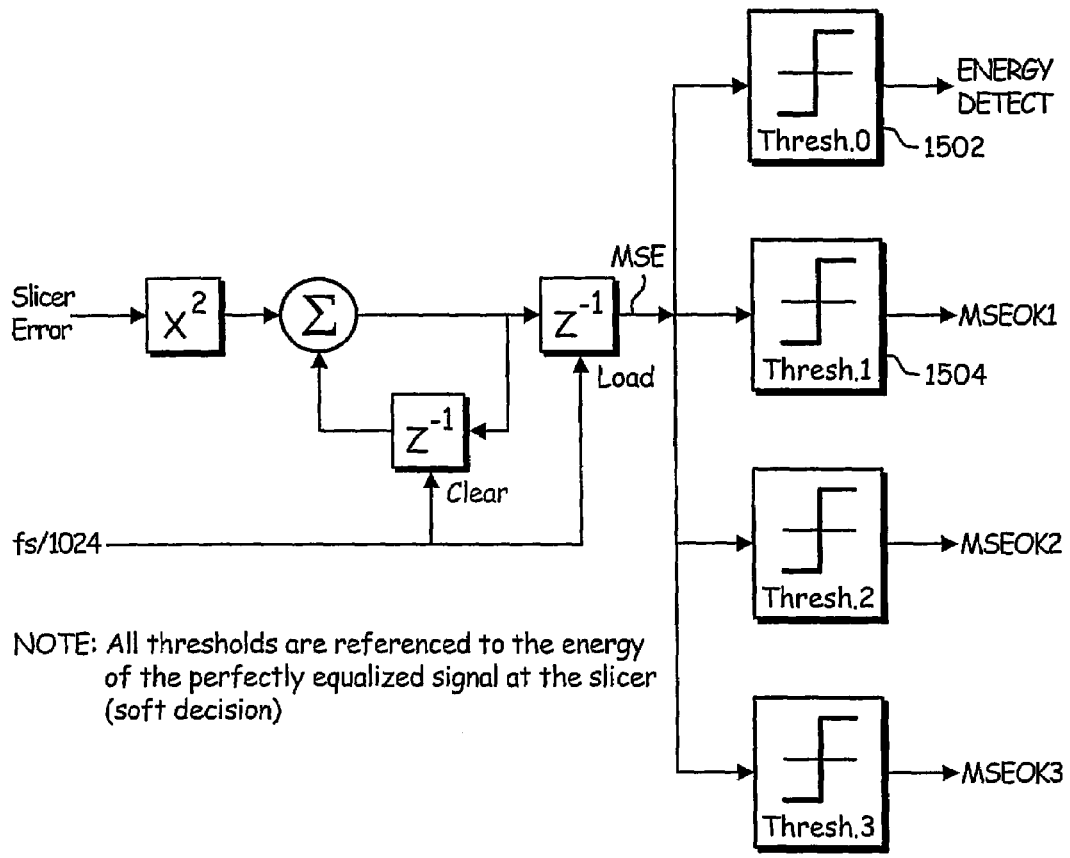
FIG. 15 shows the generation of the control signals EnergyDetect, MSEOK1, MSEOK2, MSEOK3.
Figure 16A:
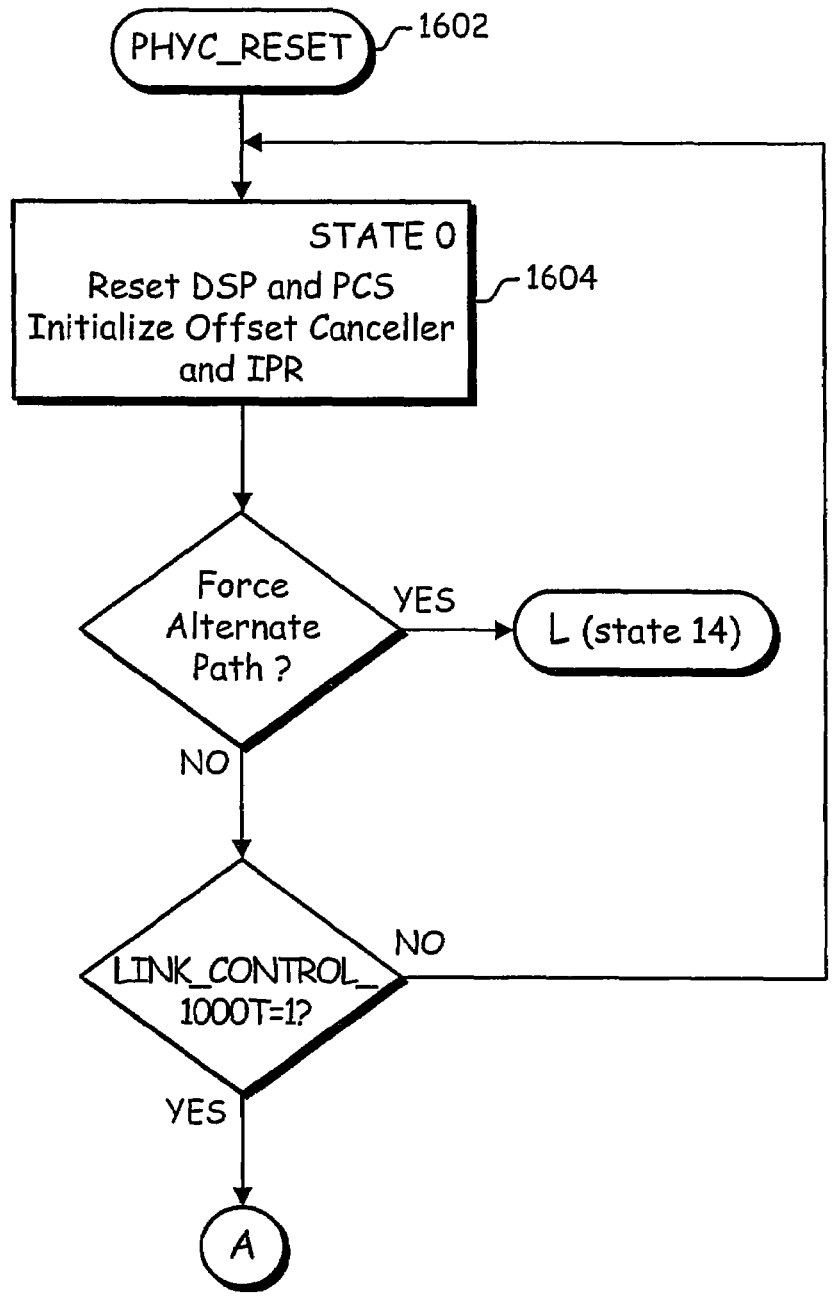
FIGS. 16A through 16G shows the flowchart for the main state machine 1402 (FIG. 14) when the local gigabit transceiver is assuming the Master role in a bi-directional communication.
Figure 16B:
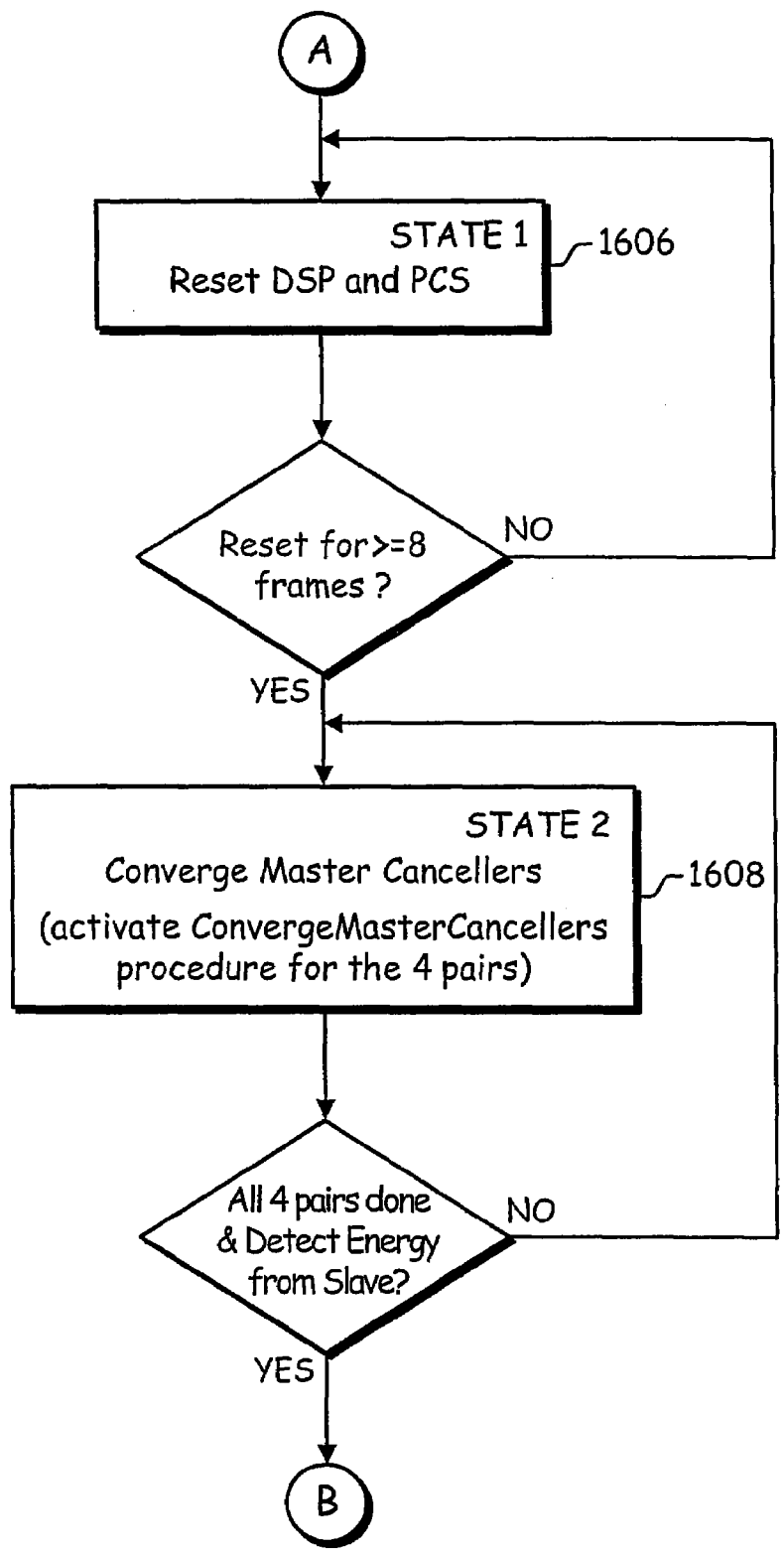
Figure 16C:
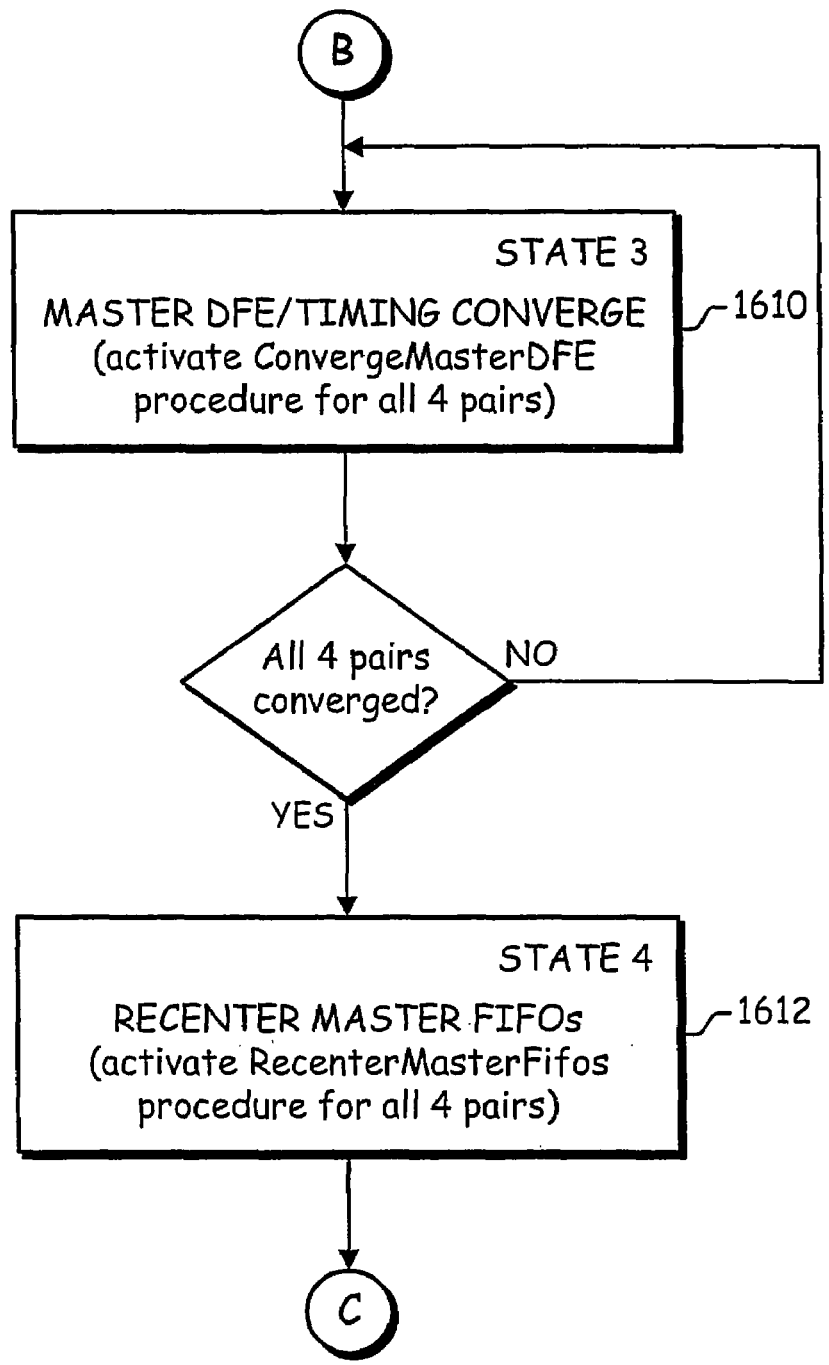
Figure 16D:
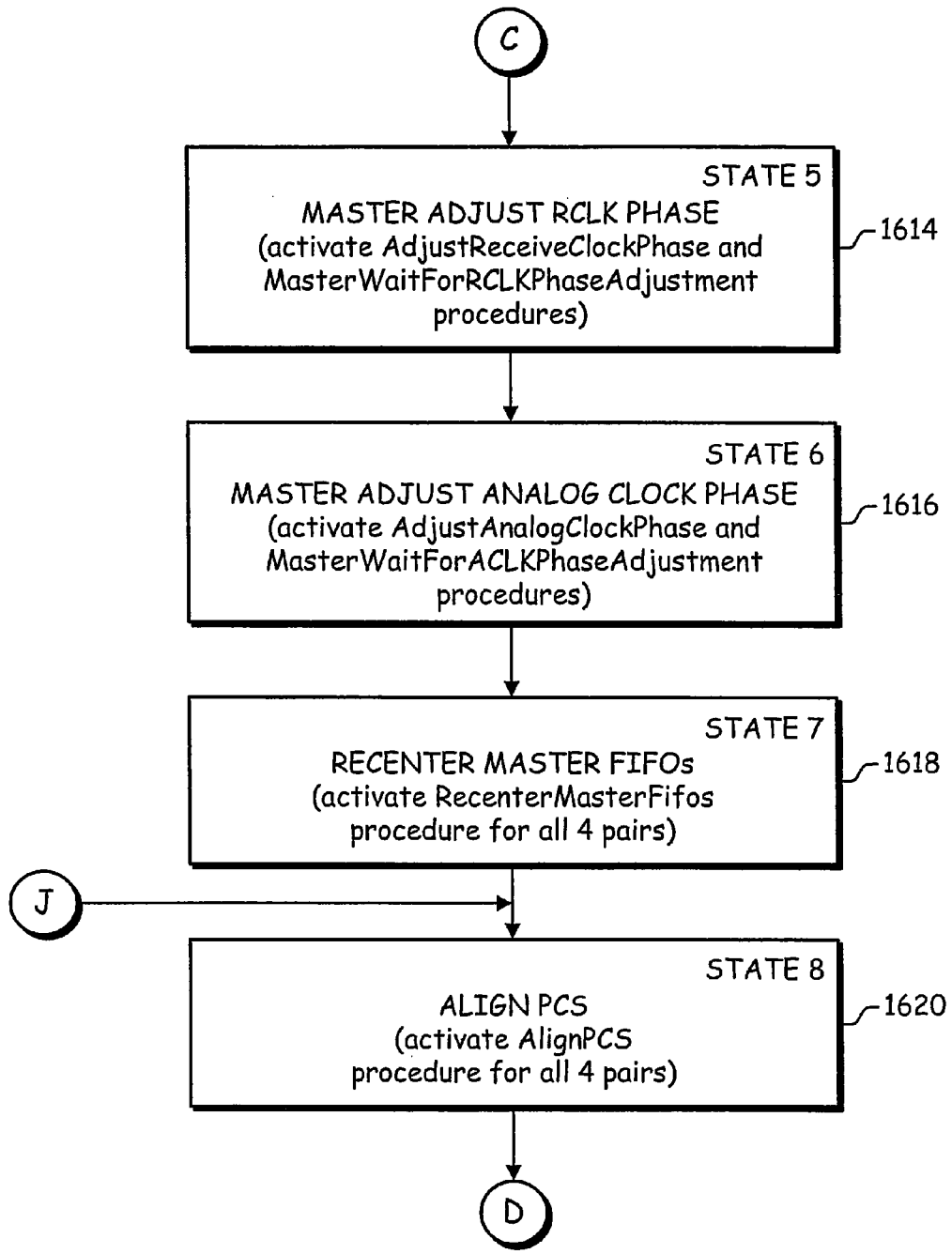
Figure 16E:
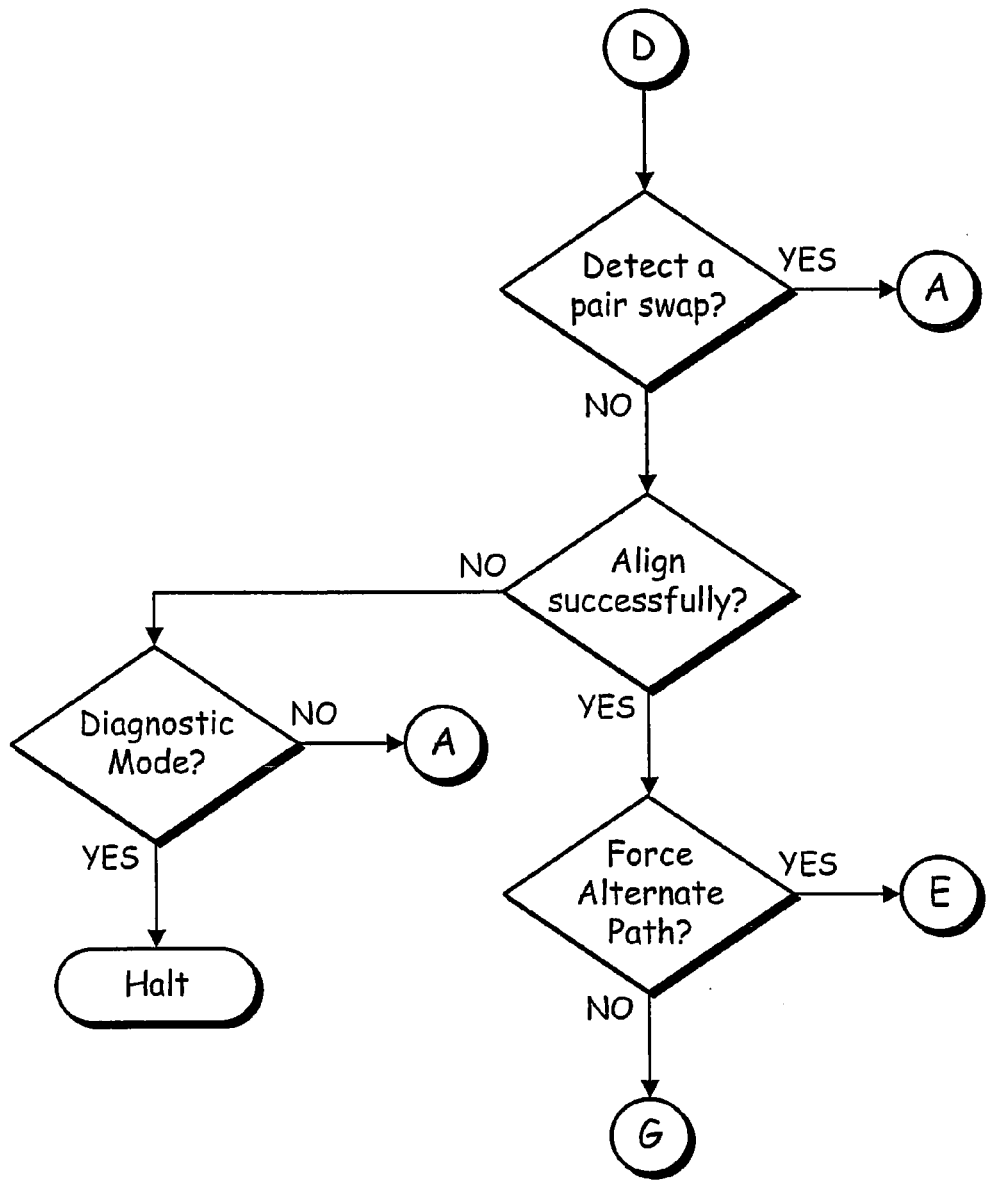
Figure 16F:
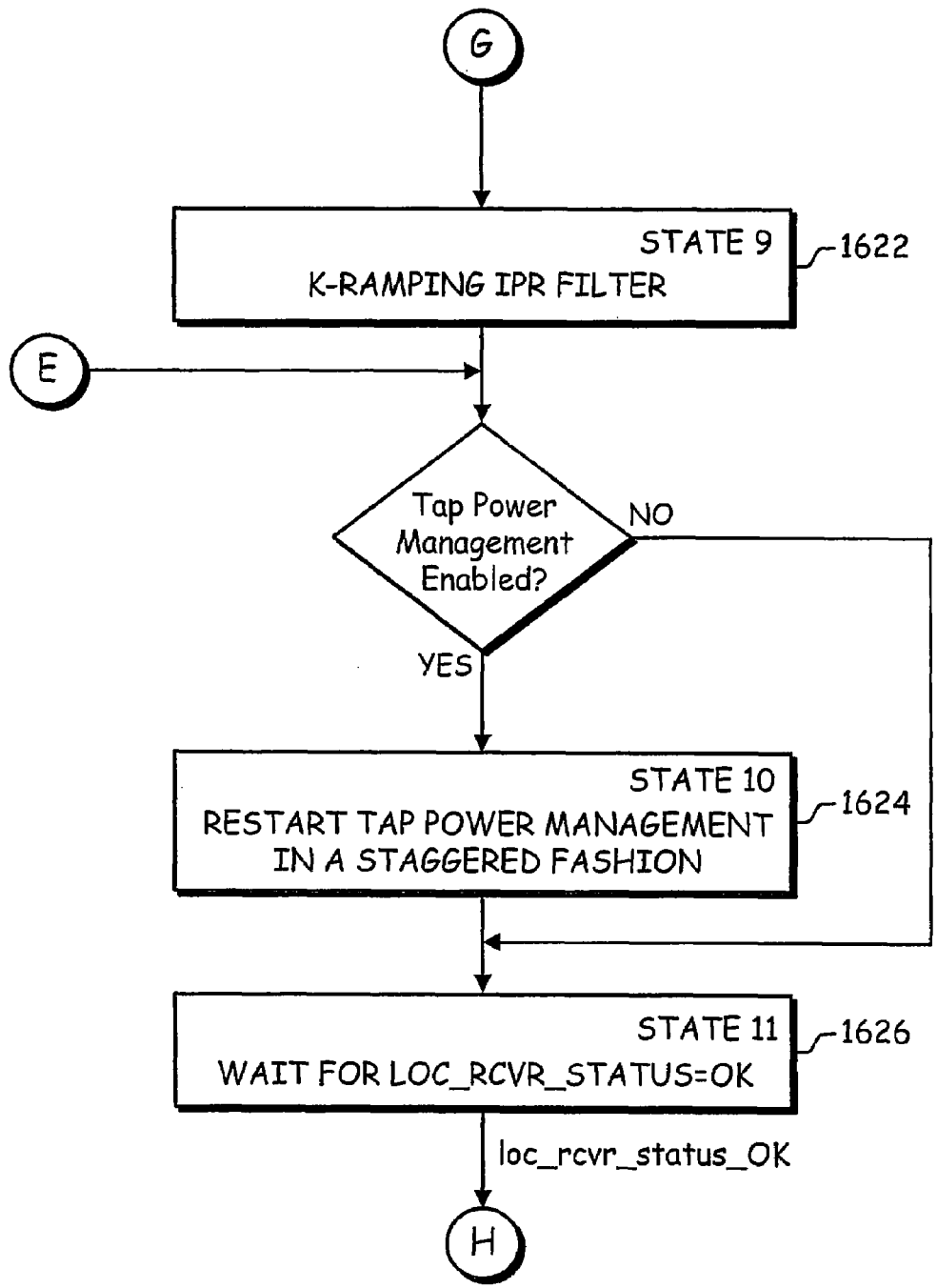
Figure 16G:
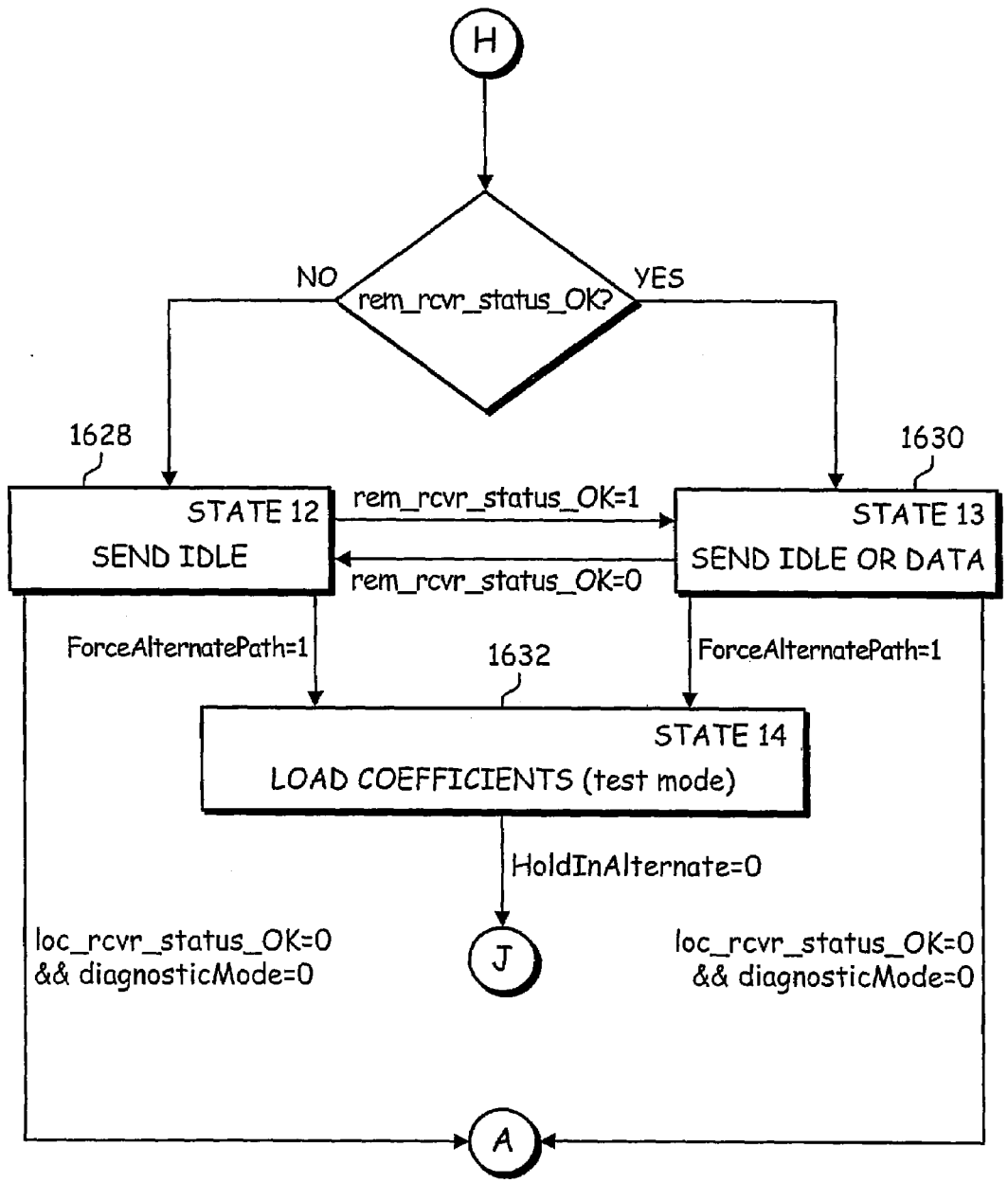
Figure 17A:
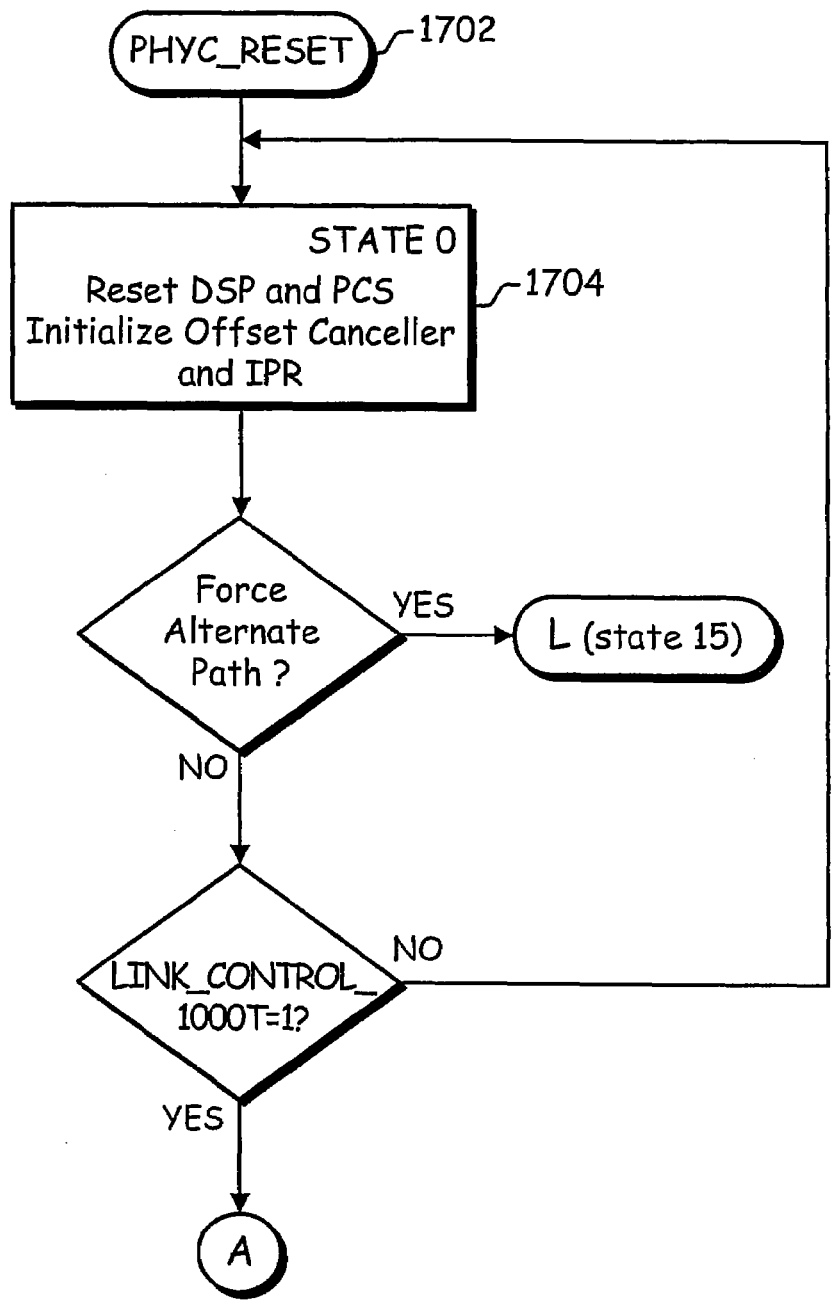
FIGS. 17A through 17G shows the flowchart for the main state machine 1402 (FIG. 14) when the local gigabit transceiver is assuming the Slave role in a bi-directional communication.
Figure 17B:
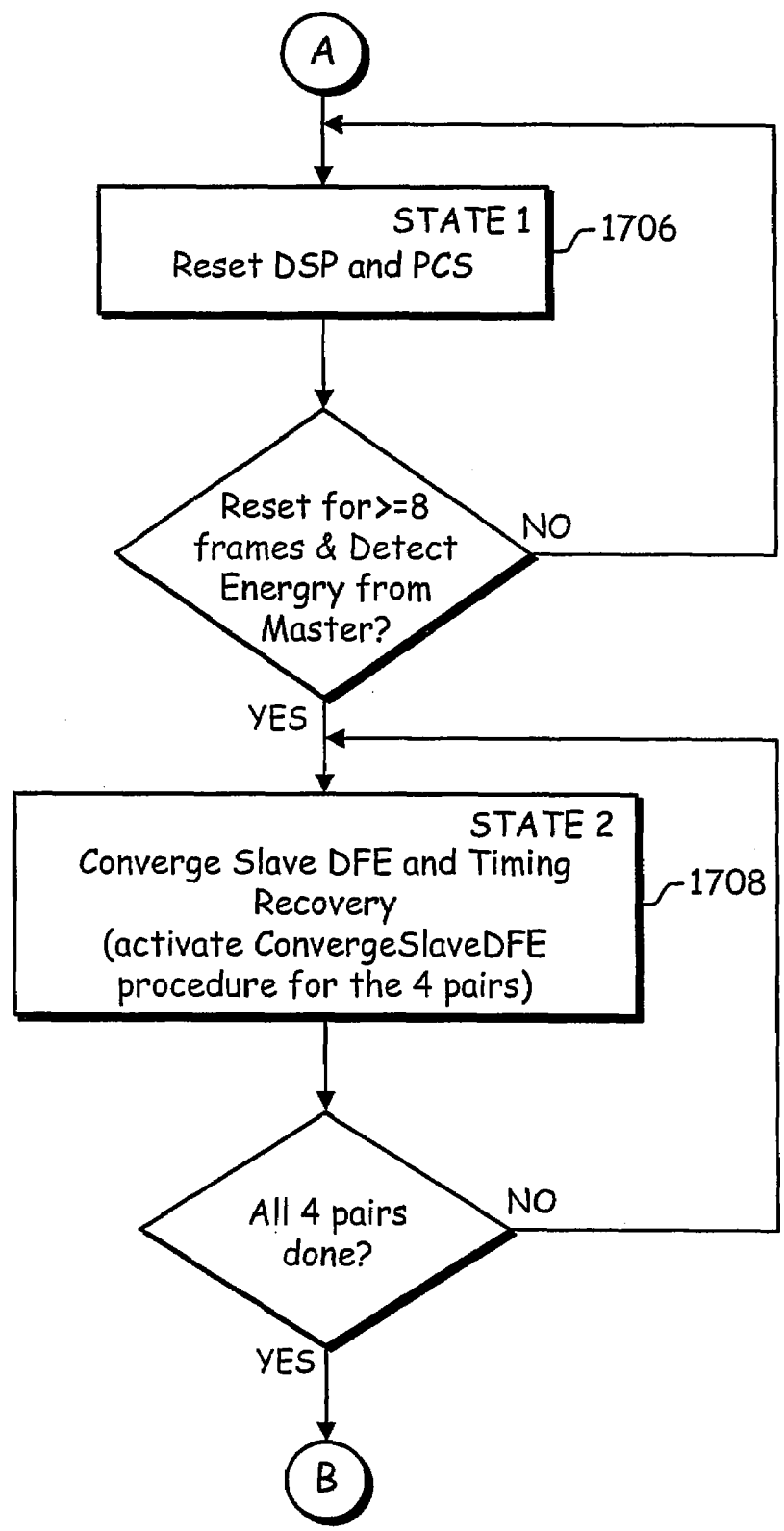
Figure 17C:
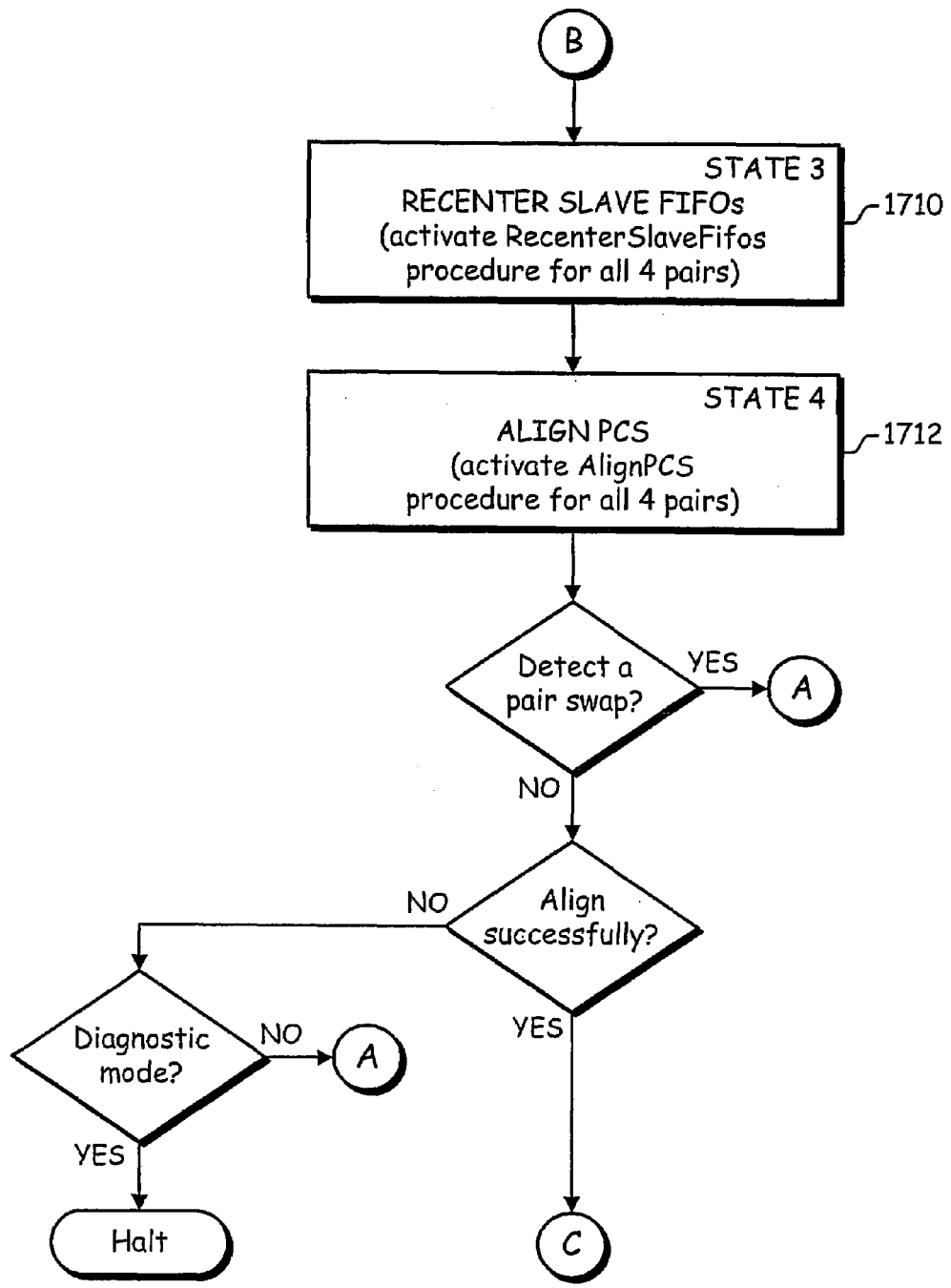
Figure 17D:
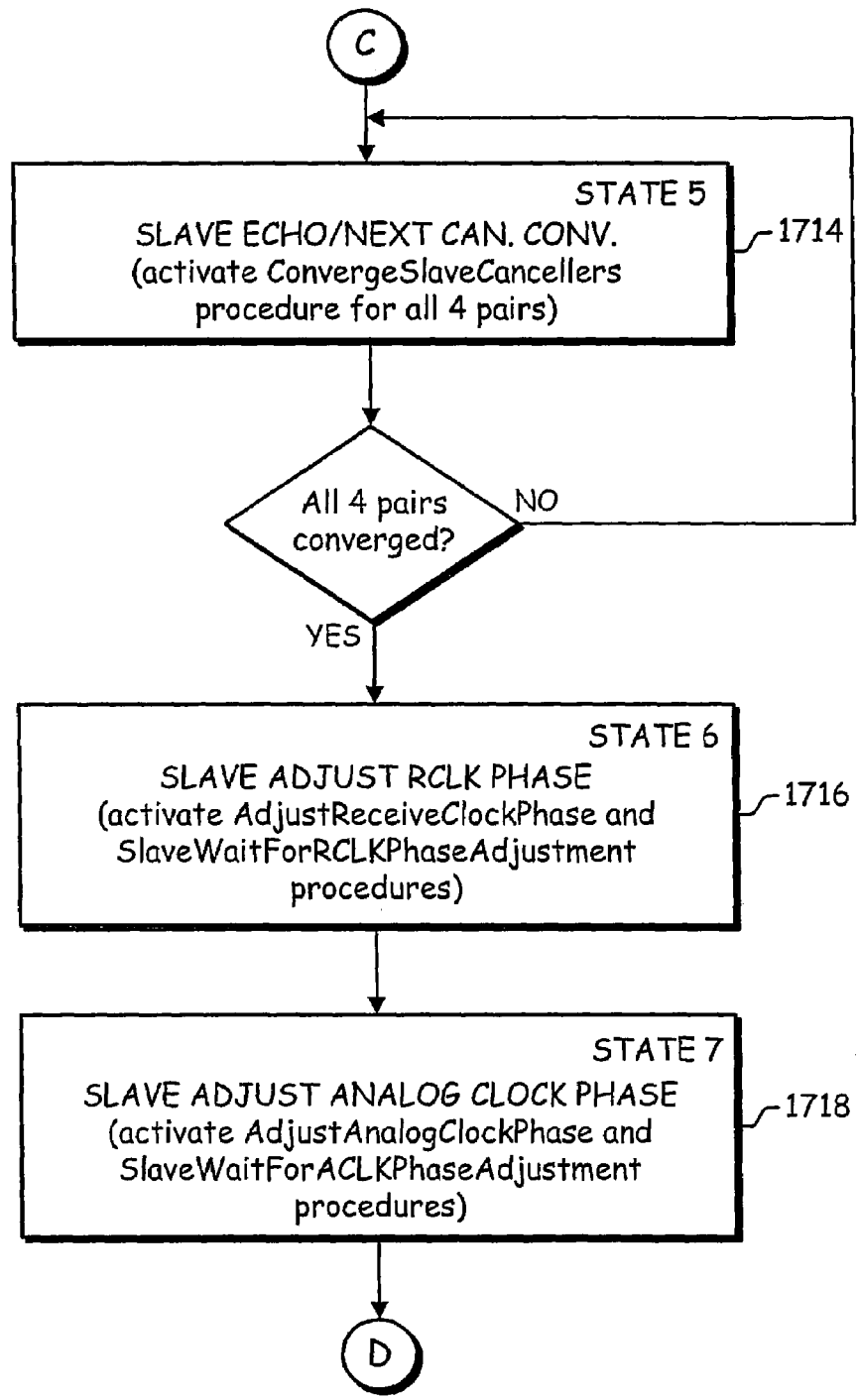
Figure 17E:
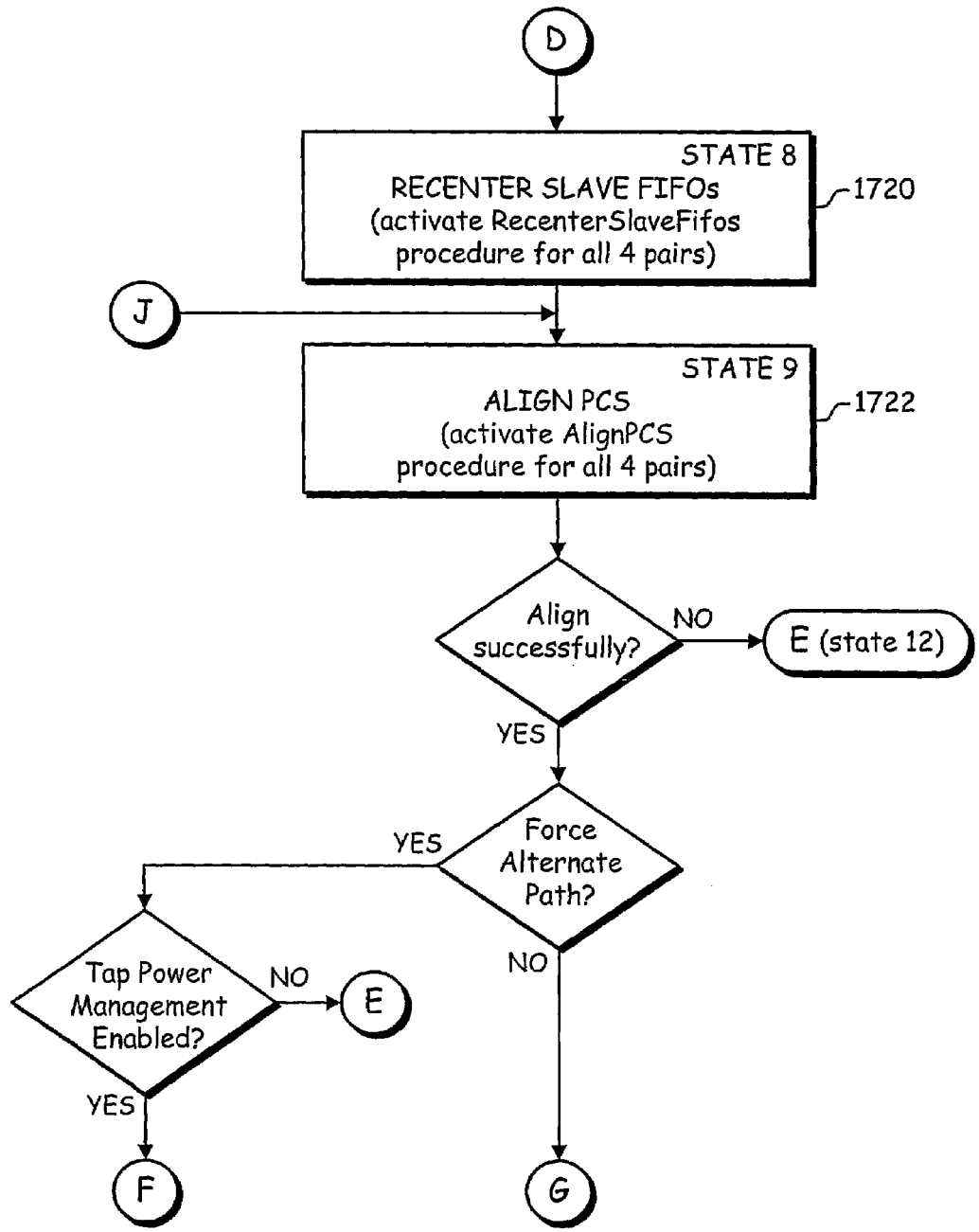
Figure 17F:
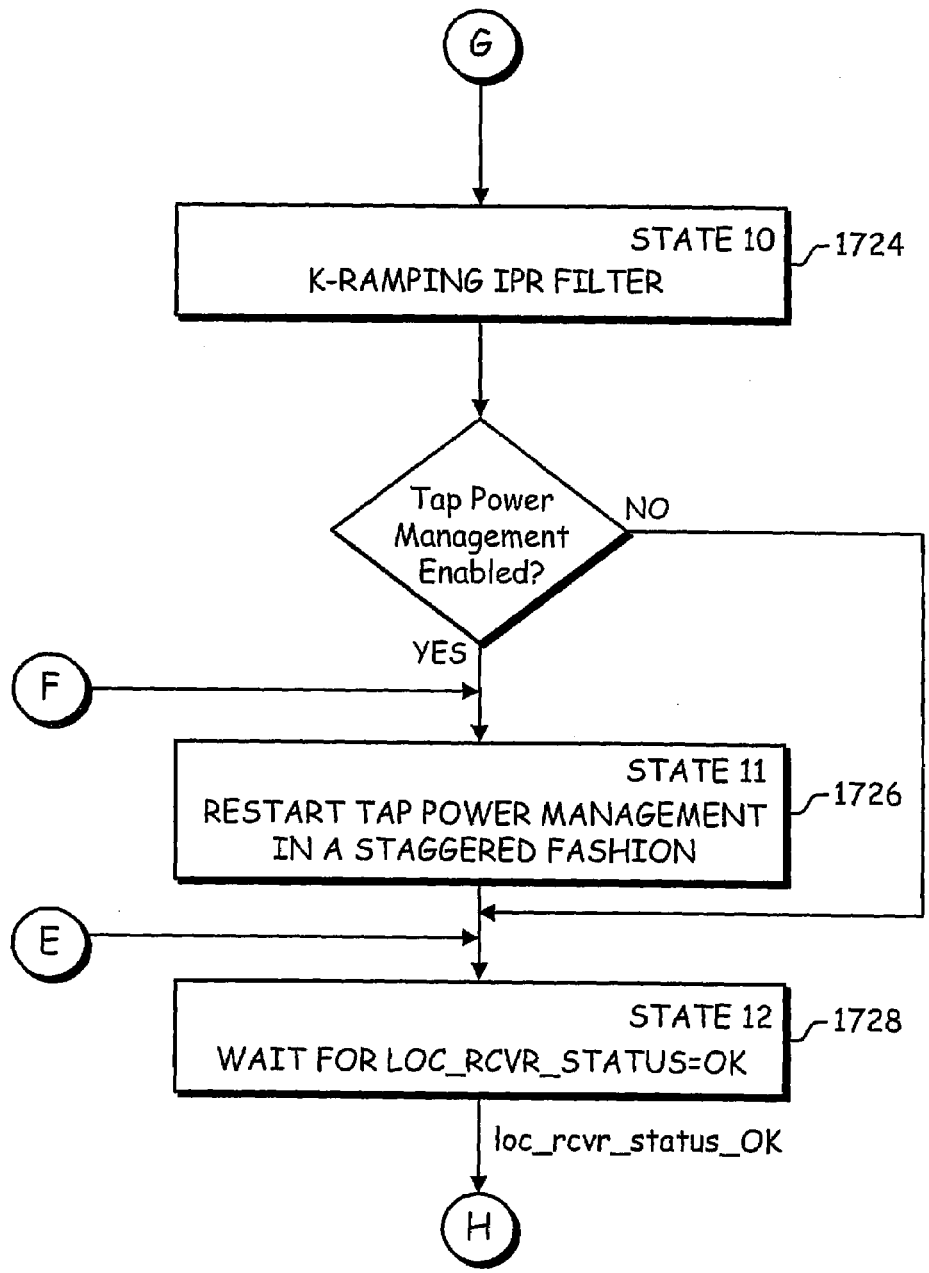
Figure 17G:
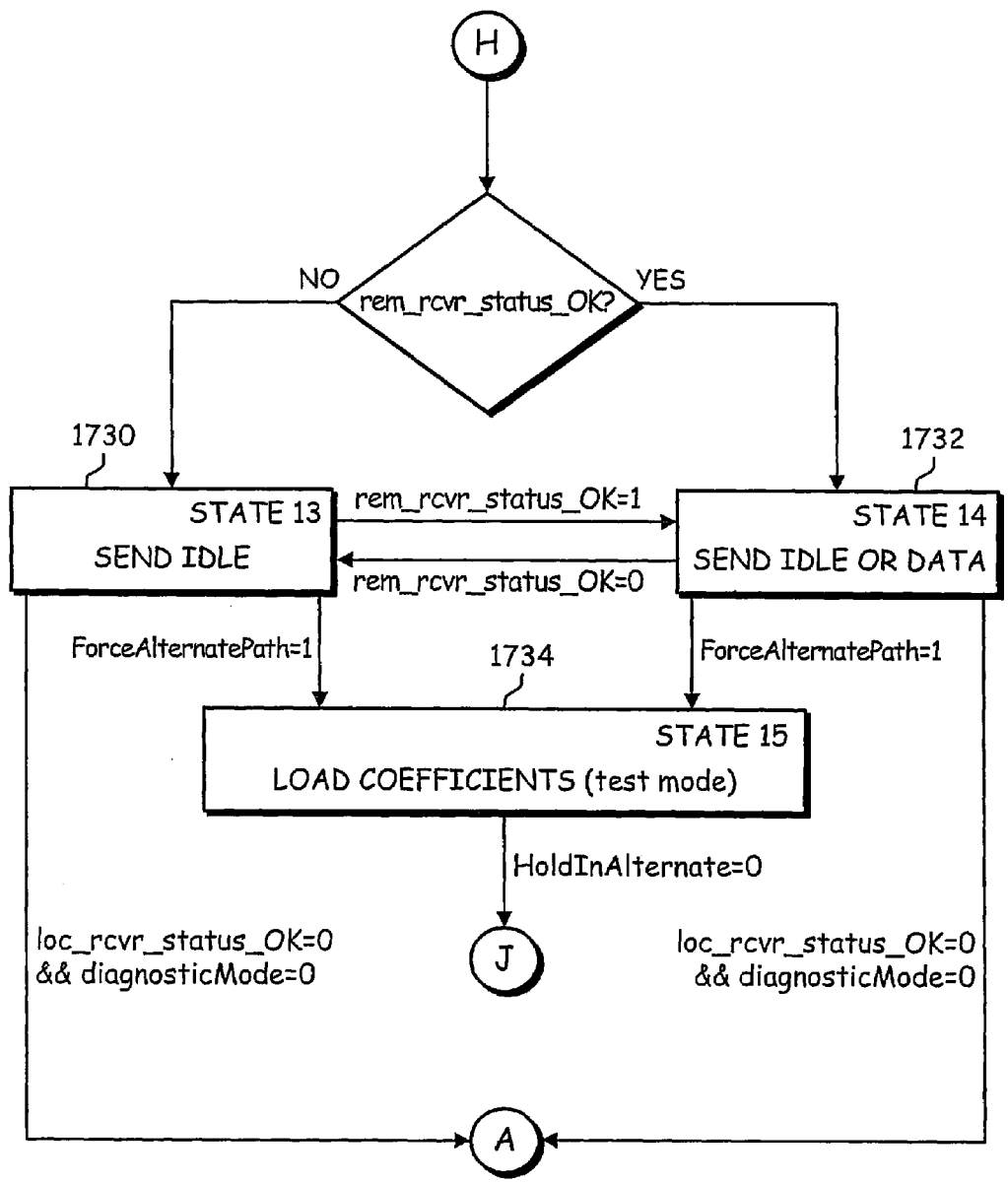

FIG. 15 shows the generation of the control signals EnergyDetect, MSEOK1, MSEOK2, MSEOK3, which are generated by comparing the MSE with thresholds Thresh.0, Thresh.1, Thresh.2, Thresh.3, respectively. In one embodiment, Thresh.0 is set to −20 dB, Thresh.1 is set to −17 dB, Thresh.2 is set to −12 dB, and Thresh.3 is set to one of four programmable values {−22.8, −22.5, −22.0, −21.5} selectable by software.

The control signal EnergyDetect indicates whether energy is detected from the remote transmitter. Detection of energy from the remote transmitter is required to begin convergence of the local receiver, for the following reason. The AGC 220 (FIG. 2) acquires a coarse gain during an initial period (during convergence of the local receiver) and then the coarse gain is frozen. If the AGC 220 acquired a coarse gain before the remote transmitter started, it would acquire an incorrect gain and would not recover. In one embodiment of the PHY Control module, the energy detection threshold Thresh.0 is set at −20 dB. In order to prevent the energy detector 1502 from being triggered by offset, the energy is required to be above the threshold for a large number (for example, 32) of consecutive frames in all four constituent transceivers. This requirement allows enough time for the Offset canceller 228 (FIG. 2) to converge and the offset from the A/D converter 216 to be cancelled, thus prevents the energy detector 1502 from being falsely triggered by offset. It is noted that one frame is one period for the PHY Control module and is equal to 1024 symbol periods.

Detector 1504 compares the MSE of a constituent transceiver with the threshold Thresh.1. If the MSE is below the threshold, then MSEOK1 is set to 1. There are four MSEOK1 for the four constituent transceivers. One of the conditions required to set the control signal loc_rcvr_status_OK to 1, which indicates that the local receiver is converged, is that MSEOK1 is 1 for all four constituent transceivers for five consecutive frames.

The PHY Control module sets the value of the control signal loc_rcvr_status_OK as follows.

The control signal FineAGCOK is set to 0 if the status signal FAGCOVFLW received from one of the four AGC 220 (FIG. 2) indicates that the respective fine gain control saturates, i.e., overflows. The control signal FineAGCOK is set to 1 if none of the fine gain controls of the four AGC 220 overflows. For the control signal loc_rcvr_status_OK to be set to 1, either the control signal fake_loc_rcvr_status is set to 1 (which indicates a test mode) or all of the following conditions must be satisfied. The four MSEOK1 must be 1 for five consecutive frames. The status signal ALIGN_OK must be 1, indicating that the PCS has completed its alignment function succesfully. The status signal KRDONE must be 1, indicating that the ramping down the value of parameter k of the IPR filter 30 (FIG. 2) is completed. The control signal FineAGCOK must be 1, indicating that none of the AGC overflows.

The control signal loc_rcvr_status_OK is set to 0 when the control signal fake_loc_rcvr_status is 0 and one of the following conditions is satisfied. One of the four MSEOK1 is 0 for five consecutive frames. The status signal ALIGN_OK is 0, indicating that the PCS has not completed its alignment function. The status signal KRDONE is 0, indicating that the ramping down the value of parameter k of the IPR filter 30 (FIG. 2) is not completed. The control signal FineAGCOK is 0, indicating that one of the AGC overflows.

It is noted that the control signal fake_loc_rcvr_status is used to force the control signal loc_rcvr_status_OK to be 1 even when other conditions are not satisfied.

In other situations, i.e., when the conditions for the control signal loc_rcvr_status_OK to be set to 1 or 0 are not satisfied, the control signal loc_rcvr_status_OK is unchanged.

FIGS. 16A through 16G shows the flowchart for the main state machine 1402 (FIG. 14) when the local gigabit transceiver is assuming the Master role in a bi-directional communication.

Upon receiving the control signal PHYC_RESET (block 1602), the Master main state machine enters state 0 (block 1604). In state 0, the Master main state machine resets the DSP and PCS modules (FIG. 13), and initializes the Offset canceller 228 (FIG. 2) and the IPR filter 30 (FIG. 2). The duration of state 0 is greater or equal to one frame. If the control signal ForceAlternatePath received from the Serial Management 1306 (FIG. 13) is set to 1 then the Master main state machine enters state 14, i.e., block 1632. Otherwise, the Link_Control__1000T signal received from Auto Negotiation module 1310 (FIG. 13) or from manual startup is checked. If the Link_Control__1000T is not equal to 1, indicating that there is no established link with the remote gigabit transceiver, the Master main state machine stays in state 0 (block 1604). If the Link_Control__1000T is equal to 1, indicating that there is established link with the remote gigabit transceiver, the Master main state machine resets the DSP and PCS modules (state 1, block 1606). The Master main state machine then checks whether the resetting has been done for greater than or equal to 8 frames. If not, the Master main state machine stays in state 1 (block 1606). If the resetting has been done for at least 8 frames, the Master main state machine controls convergence of all cancellers by activating the ConvergeMasterCancellers substate machine for the 4 pairs, i.e., constituent transceivers (block 1608). If cancellers of all 4 constituent transceivers are converged and energy is detected from the Slave gigabit transceiver, then the Master main state machine enters state 3 (block 1610). Otherwise, it stays in state 2 (block 1608). In state 3 (block 1610), the Master main state machine controls convergence of the DFE 312 (FIG. 3) and the Timing Recovery 222 (FIG. 2) by activating the ConvergeMasterDFE substate machine for all four pairs. If the DFE and Timing Recovery converge for all four pairs then the Master main state machine enters state 4 (block 1612). Otherwise, it stays in state 3 (block 1610).

In state 4 (block 1612), the Master main state machine re-centers all FIFOs by activating the RecenterMasterFifos substate machine for all four pairs.

The Master main state machine then adjusts the phase of the receive clock RCLK signal by activating the substate machines AdjustReceiveClockPhase and MasterWaitForRCLKPhaseAdjustment (state 5, block 1614).

The Master main state machine then adjusts the phase of the sampling clock ACLKx signals by activating the substate machines AdjustAnalogClockPhase and MasterWaitForACLKPhaseAdjustment (state 6, block 1616).

The Master main state machine then re-centers all the FIFOs by activating RecenterMasterFifos substate machine for all four pairs (state 7, block 1618).

The Master main state machine then controls the alignment function of the PCS by activating the AlignPCS substate machine for all four pairs (state 8, block 1620). The alignment function of the PCS includes detection of a pair swap, skew compensation, polarity compensation, and initialization of de-scrambler (all bits in the de-scrambler must have correct values in order to de-scramble the received data). The pair swap information is preserved in order to compensate for the pair swap. Thus, when the AlignPCS substate machine is reactivated after the first time, no pair swap will be detected.

If a pair swap is detected, the Master main state machine goes back to state 1 (block 1606). If no pair swap is detected, but PCS alignment is not successful, then the Master main state machine checks whether a Diagnostic mode control signal is received from the Serial Management 1306 (FIG. 13), indicating that the gigabit transceiver is operating in diagnostic mode. If the gigabit transceiver is operating in diagnostic mode, then the Master main state machine stops. At this point, all contents of all registers are intact, allowing a user to conduct diagnostics. If the gigabit transceiver is not operating in diagnostic mode then the Master main state machine reenters state 1 (block 1606).

If the PCS alignment is successful and the ForceAlternatePath from the Serial Management is not set to 1, then the Master main state machine controls the ramping down of the k parameter of the IPR filter 30 (FIG. 2) in state 9 (block 1622). If the ForceAlternatePath is set then the Master main state machine skips state 9 (i.e., block 1622).

If the Tap Power Management is enabled then the Master main state machine restarts the Tap Power Management in a staggered fashion (state 10, block 1624). Otherwise, the Master main state machine skips state 10.

The Master main state machine then waits for the control signal loc_rcvr_status_OK to be set to 1 which indicates that the local receiver is converged (state 11, block 1626).

If the control signal rem_rcvr_status_OK is set to 0, indicating that the remote receiver is not converged, then Master main state machine allows transmitting of idle symbols only (state 12, block 1628).

If the control signal rem_rcvr_status_OK is set to 1, indicating that the remote receiver is converged, then Master main state machine allows transmitting of idle or data symbols (state 13, block 1630).

While the Master main state machine in state 12 (block 1628), if the control signal rem_rcvr_status_OK is changed to 1, indicating that the remote receiver is now converged, the Master main state machine will enter state 13 (block 1630). While the Master main state machine in state 12 (block 1628), if the control signal rem_rcvr_status_OK is changed to 0, indicating that the remote receiver is now not converged, the Master main state machine will enter state 12 (block 1628).

While in state 12 (block 1628) or state 13 (block 1630), if the control signal ForceAlternatePath is set, then the Master main state machine enters state 14 (block 1632) where it loads coefficients for the test mode. If the control signal HoldInAlternate is set to 0, then the Master main state machine reenters state 8 (block 1620). Otherwise, it stays in state 14 (block 1632).

While in state 12 (block 1628) or state 13 (block 1630), if the control signal loc_rcvr_status_OK is 0 (indicating that the local receiver status is now not fine) and diagnosticMode is 0 (indicating that gigabit transceiver is not operating in diagnostic mode), then the Master main state machine reenters state 1 (block 1606).

FIGS. 17A through 17G shows the flowchart for the main state machine 1402 (FIG. 14) when the local gigabit transceiver is assuming the Slave role in a bi-directional communication. The flowchart is slightly different from the one in FIGS. 16A-16G.

Upon receiving the control signal PHYC_RESET (block 1702), the Slave main state machine enters (block 1704). In state 0, the Slave main state machine resets the DSP and PCS modules (FIG. 13), and initializes the Offset canceller 228 (FIG. 2) and the IPR filter 30 (FIG. 2). The duration of state 0 is greater or equal to one frame. If the control signal ForceAlternatePath received from the Serial Management 1306 (FIG. 13) is set to 1 then the Slave main state machine enters state 15, i.e., block 1734. Otherwise, the Link_Control_1000T signal received from Auto Negotiation module 1310 (FIG. 13) or from manual startup is checked. If the Link_Control_1000T is not equal to 1, indicating that there is no established link with the remote gigabit transceiver, the Slave main state machine stays in state 0 (block 1704). If the Link_Control_1000T is equal to 1, indicating that there is established link with the remote gigabit transceiver, the Slave main state machine resets the DSP and PCS modules (state 1, block 1706). The Slave main state machine checks whether the resetting has been done for greater than or equal to 8 frames. If not, the Slave main state machine stays in state 1 (block 1706). If the resetting has been done for at least 8 frames, the Slave main state machine controls convergence of the Slave DFE and Timing Recovery by activating the ConvergeSlaveDFE substate machine for the 4 pairs, i.e., 4 constituent transceivers (block 1708). If the DFE and Timing Recovery are converged for all 4 pairs, then the Slave main state machine enters state 3 (block 1710). Otherwise, it stays in state 2 (block 1708).

In state 3 (block 1710), the Slave main state machine re-centers all FIFOs by activating the RecenterSlaveFifos substate machine for all four pairs.

In state 4 (block 1712), the Slave main state machine controls the alignment function of the PCS by activating the AlignPCS substate machine for all four pairs (state 4, block 1712). The alignment function of the PCS includes detection of a pair swap, skew compensation, polarity compensation, and initialization of de-scrambler (all bits in the de-scrambler must have correct values in order to de-scramble the received data). The pair swap information is preserved in order to compensate for the pair swap. Thus, when the AlignPCS substate machine is reactivated after the first time, no pair swap will be detected.

If a pair swap is detected, the Slave main state machine goes back to state 1 (block 1706). If no pair swap is detected, but PCS alignment is not successful, then the Slave main state machine checks whether the Diagnostic Mode control signal received from the Serial Management 1306 (FIG. 13) is set to 1, indicating that the gigabit transceiver is operating in diagnostic mode. If the gigabit transceiver is operating in diagnostic mode, then the Slave main state machine stops. At this point, all contents of all registers are intact, allowing a user to conduct diagnostics. If the gigabit transceiver is not operating in diagnostic mode then the Slave main state machine reenters state 1 (block 1706).

If the PCS alignment is successful, then the Slave main state machine enters state 5 (block 1714). In state 5, the Slave main state machine controls convergence of all Echo/NEXT cancellers by activating the ConvergeSlaveCancellers substate machine for the 4 pairs (block 1714). If the cancellers of all 4 pairs are converged, then the Slave main state machine enters state 6 (block 1716). Otherwise, it stays in state 5 (block 1714).

In state 6 (block 1716), the Slave main state machine adjusts the phase of the receive clock RCLK signal by activating the substate machines AdjustReceiveClockPhase and SlaveWaitForRCLKPhaseAdjustment. The Slave main state machine then enters state 7 (block 1718).

In state 7, block 1718, the Slave main state machine adjusts the phase of the sampling clock ACLKx signals by activating the substate machines AdjustAnalogClockPhase and SlaveWaitForACLKPhaseAdjustment.

The Slave main state machine then re-centers all the FIFOs by activating RecenterSlaveFifos substate machine for all four pairs (state 8, block 1720).

The Slave main state machine then controls the alignment function of the PCS by activating the AlignPCS substate machine for all four pairs (state 9, block 1722).

If the PCS alignment is not successful, the Slave main state machine goes to state 12 (block 1728).

If the. PCS alignment is successful and the ForceAlternatePath from the Serial Management is not set to 1, then the Slave main state machine enters state 10 (block 1724). In state 10, the Slave main state machine controls the ramping down of the k parameter of the IPR filter 30 (FIG. 2).

If the ForceAlternatePath is set to 1 and the Tap Power Management is enabled then the Slave main state machine skips state 10 (block 1622) and goes to state 11 (block 1726). If the ForceAlternatePath is set to 1 and the Tap Power Management is not enabled then the Slave main state machine skips states 10 (block 1724) and state 11 (block 1726) and goes to state 12 (block 1728).

From state 10 (block 1724), if the Tap Power Management is enabled then the Slave main state machine enters state 11 (block 1726) where it restarts the Tap Power Management in a staggered fashion. Otherwise, the Slave main state machine skips state 11 (block 1726) and enters state 12 (block 1728).

In state 12, (block 1728), the Slave main state machine waits for the control signal loc_rcvr_status_OK to be set to 1 which indicates that the local receiver is converged.

If the control signal rem_rcvr_status_OK is set to 0, indicating that the remote receiver is not converged, then Slave main state machine allows transmission of idle symbols only (state 13, block 1730).

If the control signal rem_rcvr_status_OK is set to 1, indicating that the remote receiver is converged, then Slave main state machine allows transmitting of idle or data symbols (state 14, block 1732).

While the Slave main state machine in state 13 (block 1730), if the control signal rem_rcvr_status_OK is changed to 1, indicating that the remote receiver is now converged, the Slave main state machine will enter state 14 (block 1732). While the Slave main state machine in state 14 (block 1732), if the control signal rem_rcvr_status_OK is changed to 0, indicating that the remote receiver is now not converged, the Slave main state machine will enter state 13 (block 1730).

While in state 13 (block 1730) or state 14 (block 1732), if the control signal ForceAlternatePath is set to 1, then the Slave main state machine enters state 15 (block 1734) where it loads coefficients in the test mode. If the control signal HoldInAlternate is set to 0, then the Slave main state machine reenters state 9 (block 1722). Otherwise, it stays in state 15 (block 1734).

While in state 13 (block 1730) or state 14 (block 1732), if the control signal loc_rcvr_status_OK is 0 (indicating that the local receiver status is now not fine) and diagnosticMode is 0 (indicating that gigabit transceiver is not operating in diagnostic mode), then the Slave main state machine reenters state 1 (block 1706).

Figure 18:
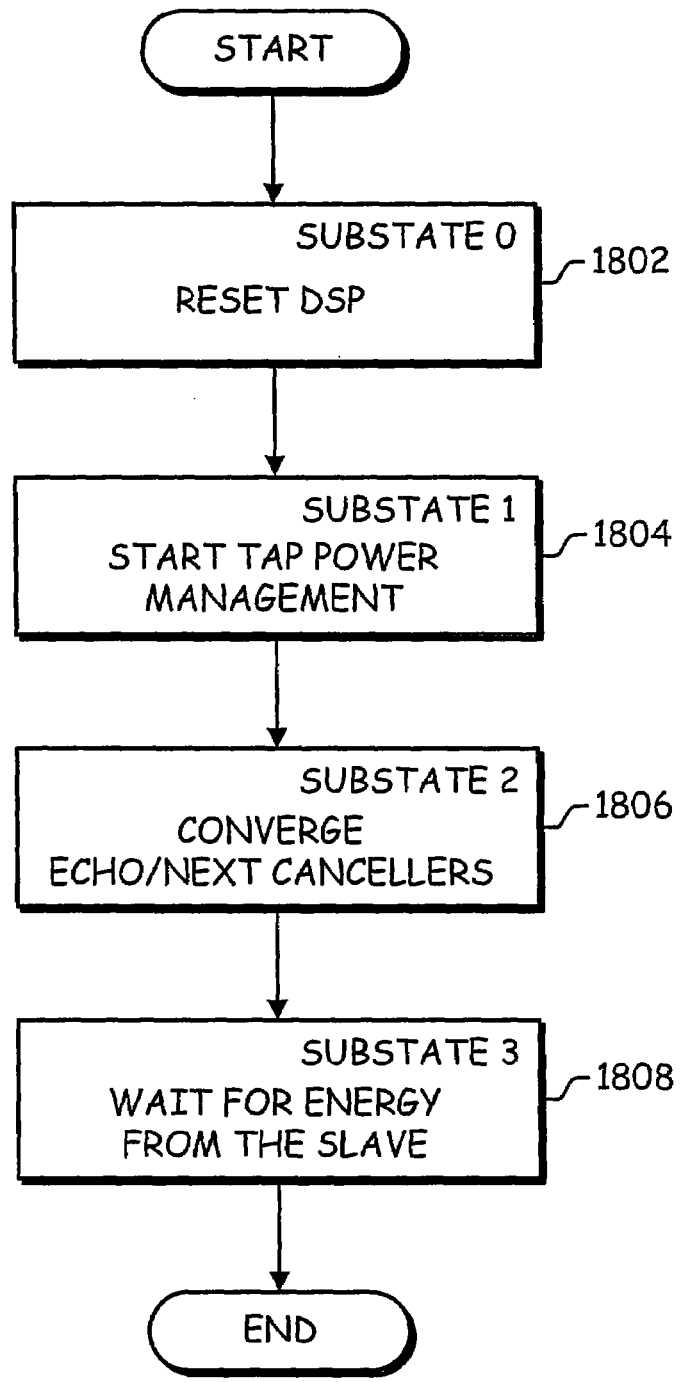
FIG. 18 shows a flowchart for the ConvergeMasterCancellers substate machine.

FIG. 18 shows a flowchart for the ConvergeMasterCancellers substate machine. Upon start, the ConvergeMasterCancellers substate machine resets the DSP module (block 1802). It then starts the Tap Power Management state machine (block 1804). Then it controls convergence of the Echo/NEXT cancellers (block 1806). Then it waits for detection of energy from the Slave gigabit transceiver (block 1808). It then terminates.

Figure 19A:
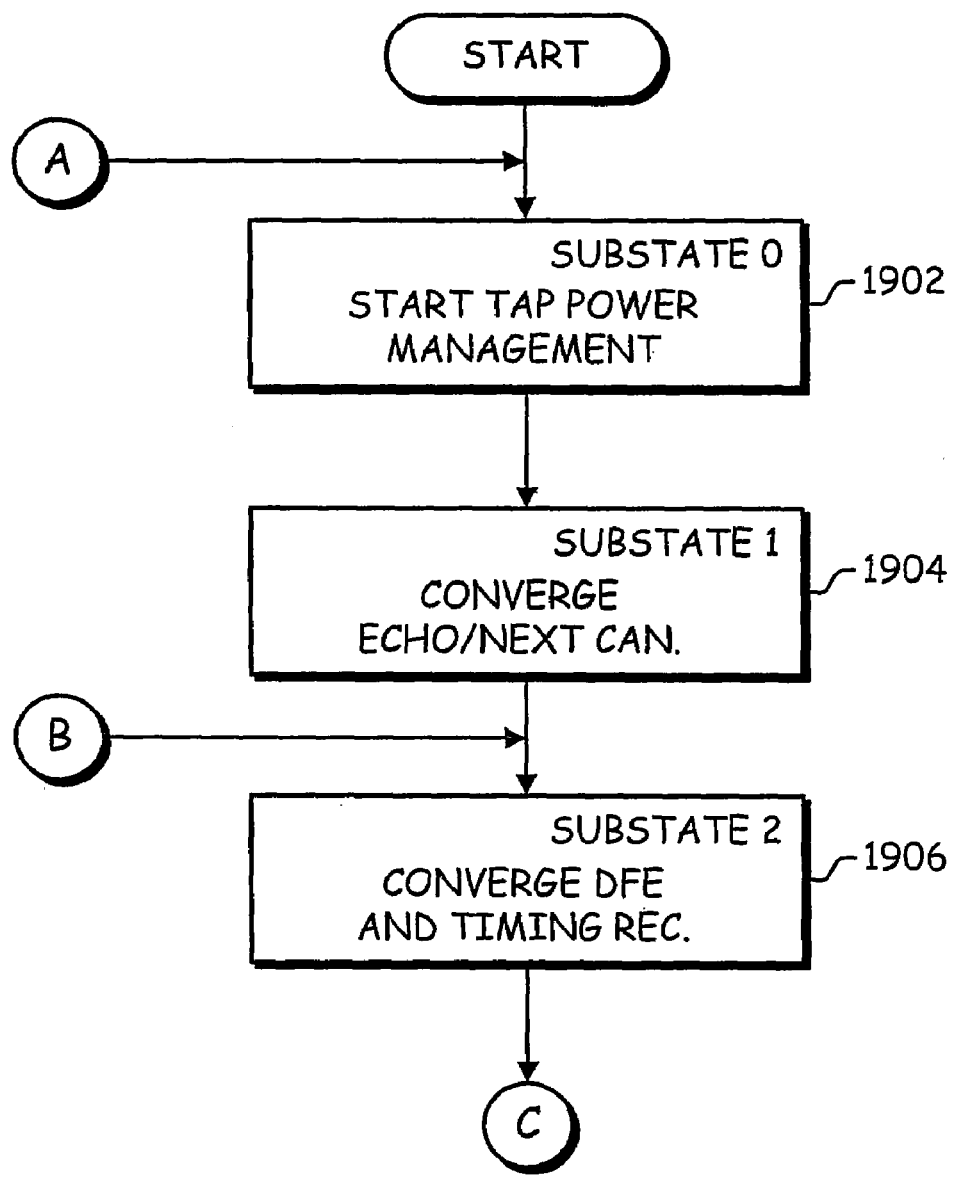
FIGS. 19A and 19B shows a flowchart for the ConvergeSlaveCancellers substate machine.
Figure 19B:
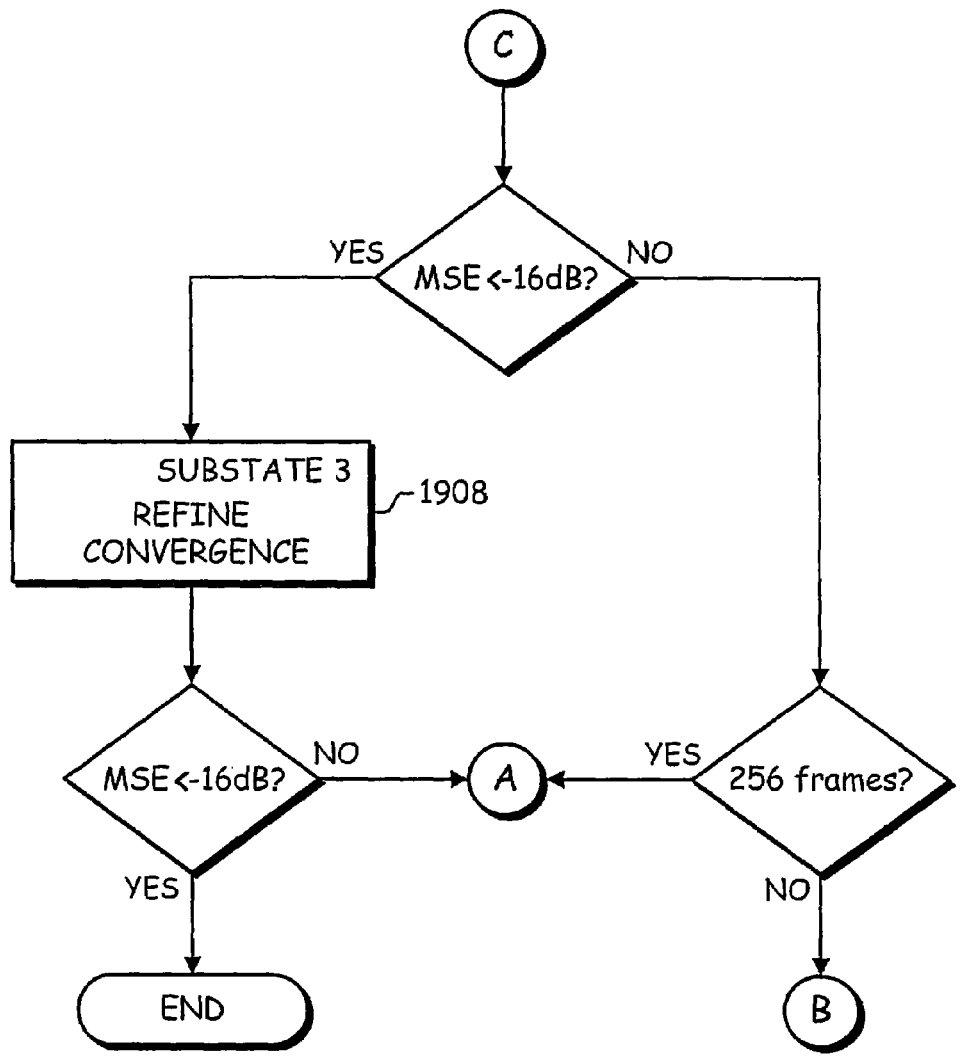

FIGS. 19A and 19B shows a flowchart for the ConvergeSlaveCancellers substate machine. Upon start, the ConvergeSlaveCancellers substate machine starts the Tap Power Management state machine (block 1902). Then it controls convergence of the Echo/NEXT cancellers (block 1904). Then it controls convergence of the DFE and Timing Recovery (block 1906).

If the MSE (FIG. 12) is less than −16 dB then the ConvergeSlaveCancellers substate machine refines the convergence (block 1908). After the convergence is refined, if the MSE stays below −16 dB then the ConvergeSlaveCancellers substate machine terminates, otherwise, it goes back to block 1902 to start over again.

While in block 1906, if the MSE is not less than −16 dB and the convergence process has lasted 256 frames, then the ConvergeSlaveCancellers substate goes back to block 1902 to start over again. If the MSE is not less than −16 dB and the convergence process has lasted less than 256 frames, then the ConvergeSlaveCancellers substate stays in block 1906 to continue the convergence of the DFE and Timing Recovery.

Figure 20A:
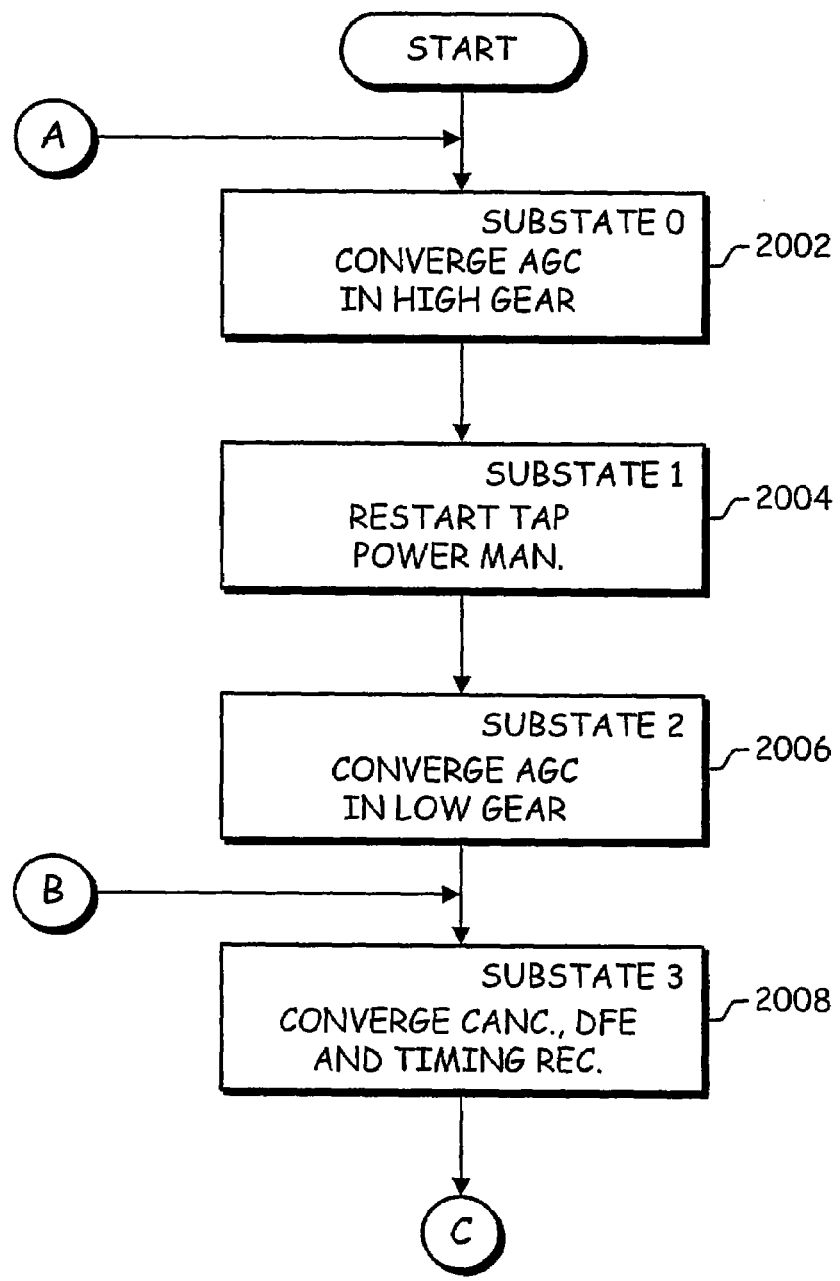
FIGS. 20A and 20B shows a flowchart of the ConvergeMasterDFE substate machine.
Figure 20B:
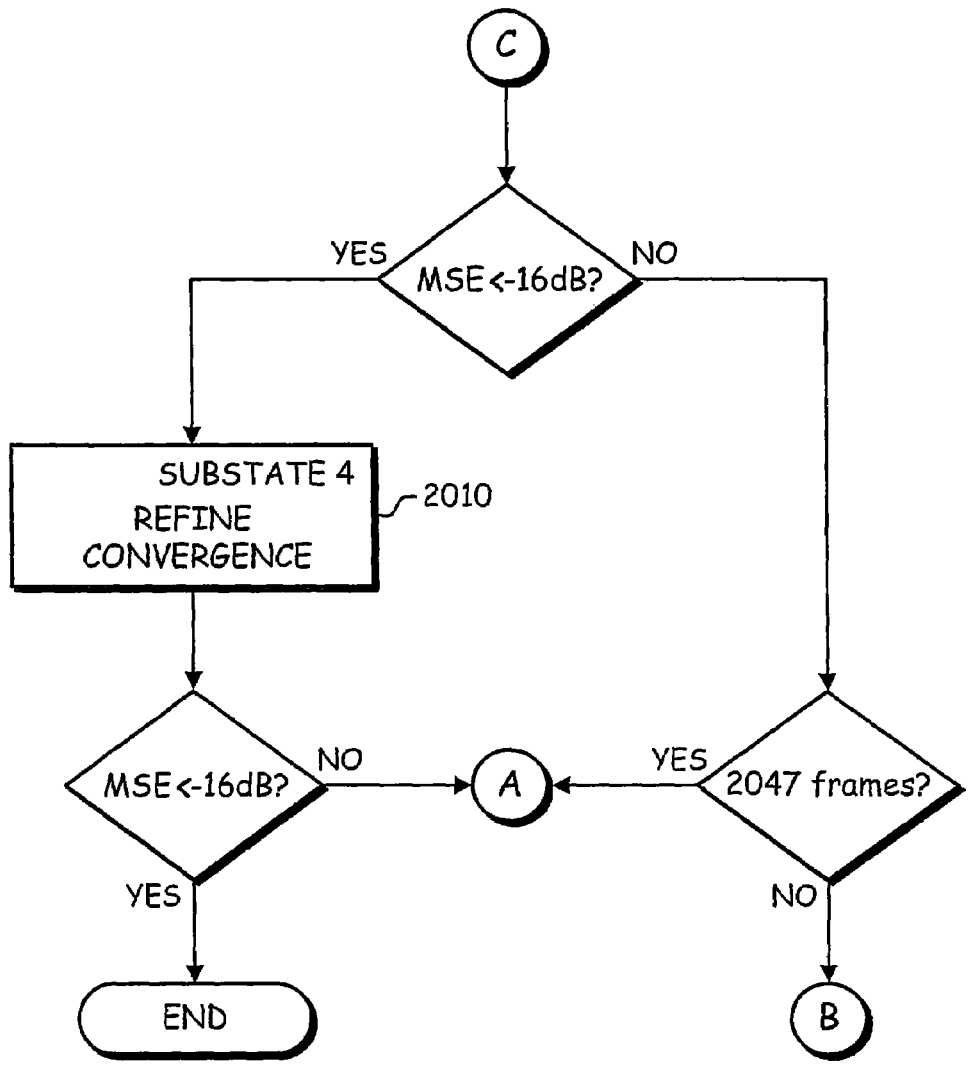

FIGS. 20A and 20B shows a flowchart of the ConvergeMasterDFE substate machine. Upon start, the ConvergeMasterDFE substate machine converges the AGC 220 (FIG. 2) in high gear (block 2002). Then it restarts the Tap Power Management state machine (block 2004). Then it converges the AGC in low gear (block 2006).

Then the ConvergeMasterDFE substate machine controls convergence of the Echo/NEXT cancellers, the DFE and the Timing Recovery (block 2008).

If the MSE (FIG. 12) is less than −16 dB then the ConvergeMasterDFE substate machine refines the convergence (block 2010). After the convergence is refined, if the MSE stays below −16 dB then the ConvergeMasterDFE substate machine terminates, otherwise, it goes back to block 2002 to start over again.

While in block 2008, if the MSE is not less than −16 dB and the convergence process has lasted 2047 frames, then the ConvergeMasterDFE substate machine goes back to block 2002 to start over again. If the MSE is not less than −16 dB and the convergence process has lasted less than 256 frames, then the ConvergeMasterDFE substate machine stays in block 2008 to continue the convergence of the Echo/NEXT cancellers, the DFE and the Timing Recovery.

It is important to note that in block 2003, the ConvergeMasterDFE substate machine tries to converge three different blocks, namely, the cancellers, the DFE and the Timing Recovery. It is very difficult to converge all three at the same time. The DFE and the Timing Recovery are both decision-directed, i.e., directed by the decisions from the decoder 38 (FIG. 2). In addition, the cancellers cannot be decoupled from the DFE and the Timing Recovery because, at the Master, the TCLK signal and the RCLK signals are not in phase lock. Thus, even if the cancellers are converged first, their coefficients will change significantly when the convergence of the DFE and the Timing Recovery starts.

The solution to this problem is an important feature of the ConvergeMasterDFE substate machine. In block 2008, the Timing Recovery is decoupled from the cancellers and the DFE to facilitate the convergence of these two blocks. This is done as follows. The cancellers and the DFE are allowed to converge normally while the phase output of Timing Recovery is ramped up linearly and very slowly (about 2 ppm). In block 2008, the Timing Recovery is running in open loop mode. Because the Timing Recovery phase output is changing very slowly and linearly, the cancellers can converge and reconverge easily. The DFE only converges at the correct phase. Near the correct phase, the signal-to-noise ratio quickly improves. Near the correct phase, the MSE will be less than −16 dB. After the cancellers and the DFE converge, in block 2010, the ConvergeMasterDFE substate machine refines the convergence by allowing the cancellers, the DFE and the Timing Recovery to converge normally. In block 2010, the Timing Recovery is operated in closed loop mode. This novel feature can be used for any transceiver.

Figure 21A:
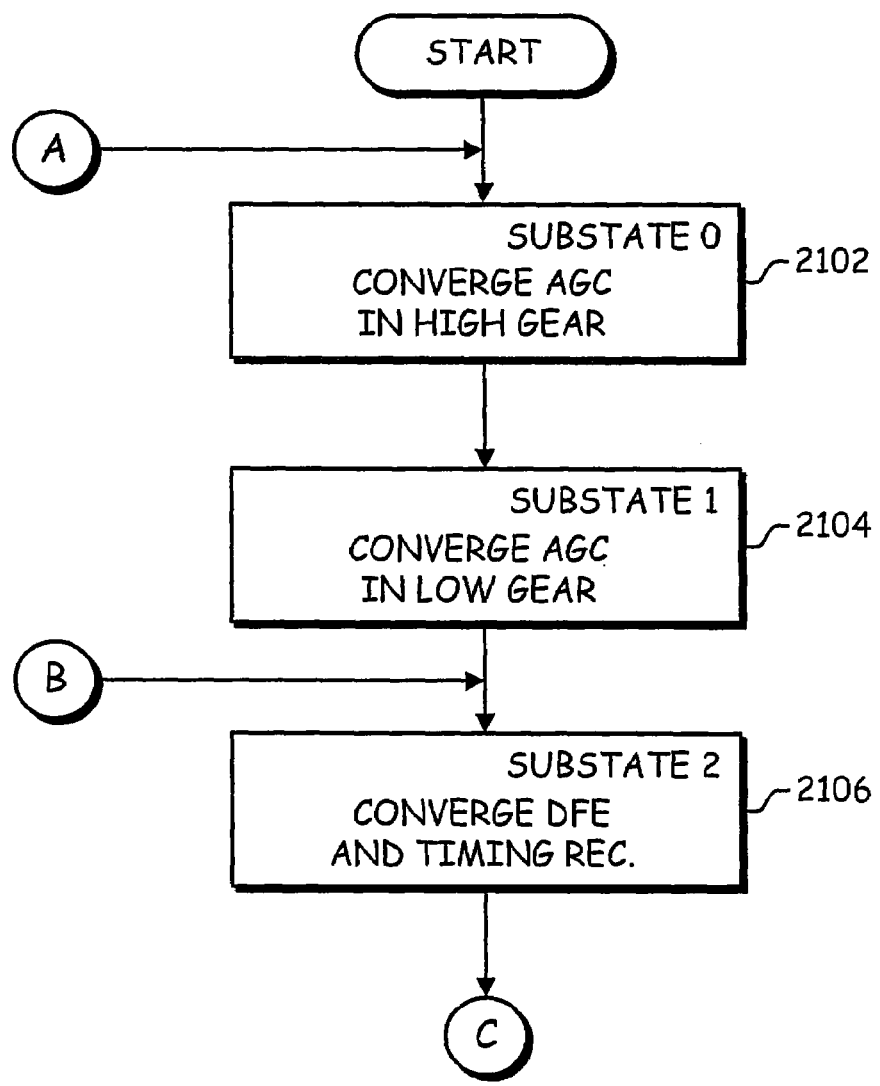
FIGS. 21A and 21B shows a flowchart of the ConvergeSlaveDFE substate machine.
Figure 21B:
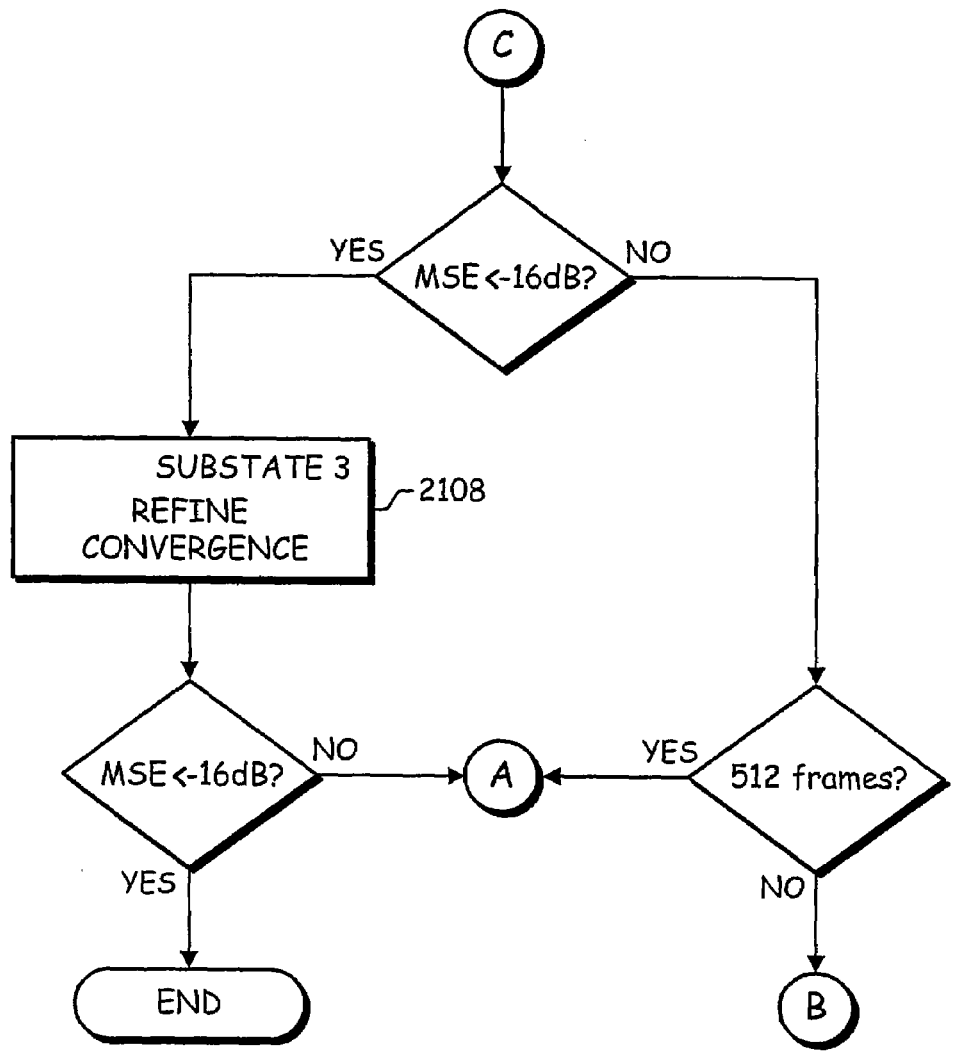

FIGS. 21A and 21B shows a flowchart of the ConvergeSlaveDFE substate machine. Upon start, the ConvergeSlaveDFE substate machine converges the AGC 220 (FIG. 2) in high gear (block 2102). Then it converges the AGC in low gear (block 2104).

Then the ConvergeSlaveDFE substate machine controls convergence of the DFE and the Timing Recovery (block 2106).

If the MSE (FIG. 12) is less than −16 dB then the ConvergeSlaveCancellers substate machine refines the convergence (block 2108). After the convergence is refined, if the MSE stays below −16 dB then the ConvergeSlaveCancellers substate machine terminates, otherwise, it goes back to block 2102 to start over again.

While in block 2106, if the MSE is not less than −16 dB and the convergence process has lasted 512 frames, then the ConvergeSlaveCancellers substate goes back to block 2102 to start over again. If the MSE is not less than −16 dB and the convergence process has lasted less than 256 frames, then the ConvergeSlaveCancellers substate stays in block 2106 to continue the convergence of the Echo/NEXT cancellers, the DFE and the Timing Recovery.

Figure 22:
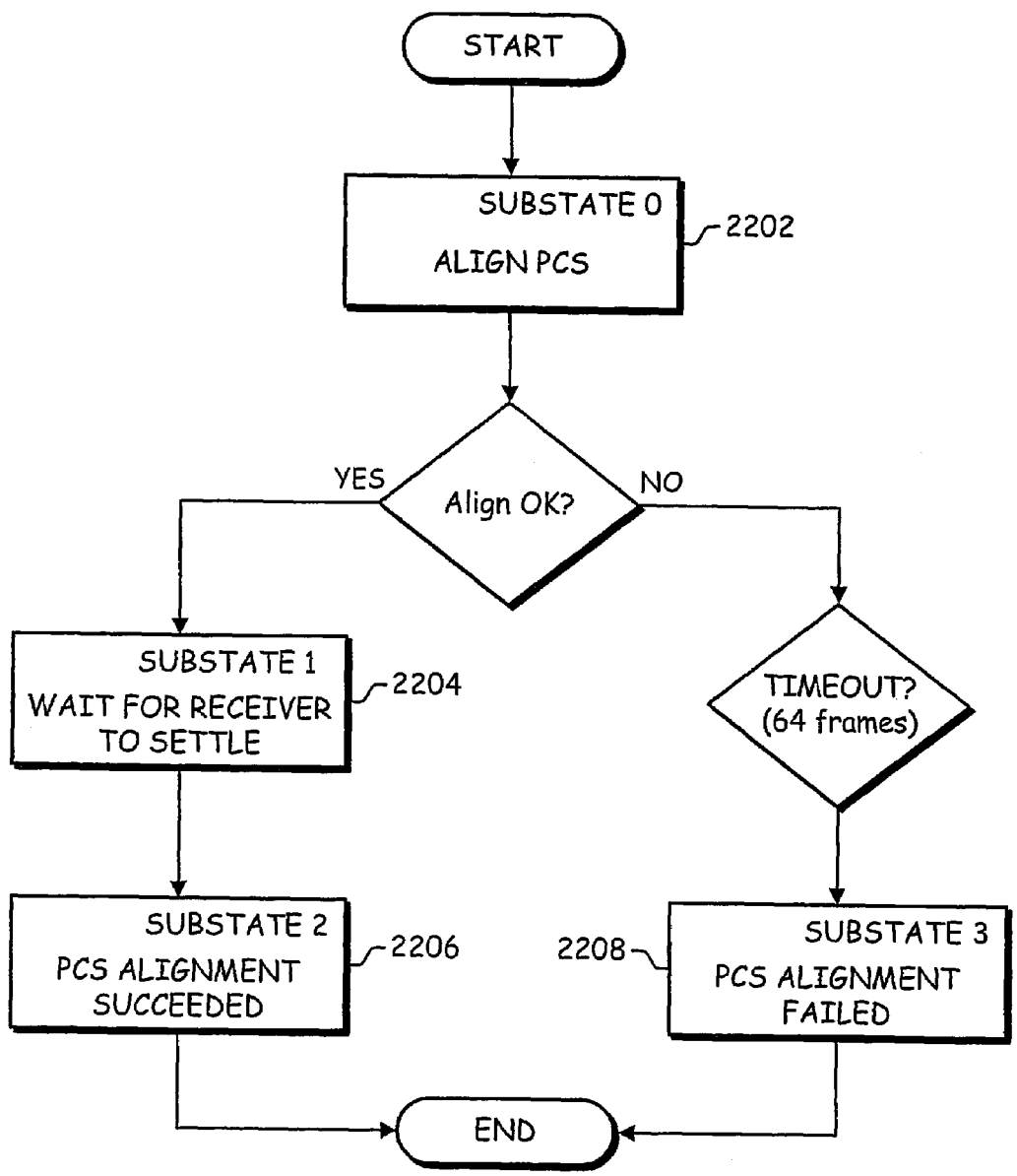
FIG. 22 shows a flowchart of the AlignPCS substate machine.

FIG. 22 shows a flowchart of the AignPCS substate machine. Upon start, the AlignPCS substate machine controls the alignment function of the PCS (block 2202).

If the alignment is good, the AlignPCS substate machine waits for the receiver to settle (block 2204). The reason for the waiting is that any alignment will cause a sudden change in the signal path, thus will cause a delay error. The waiting is for this burst of delay error to flush out. After the waiting period, the AlignPCS substate machine declares that the PCS alignment has succeeded (block 2206) then terminates.

If the alignment is not good and the alignment has lasted the allotted time, e.g., 64 frames, then the AlignPCS substate machine declares that the PCS alignment has failed (block 2208) then terminates.

Figure 23:
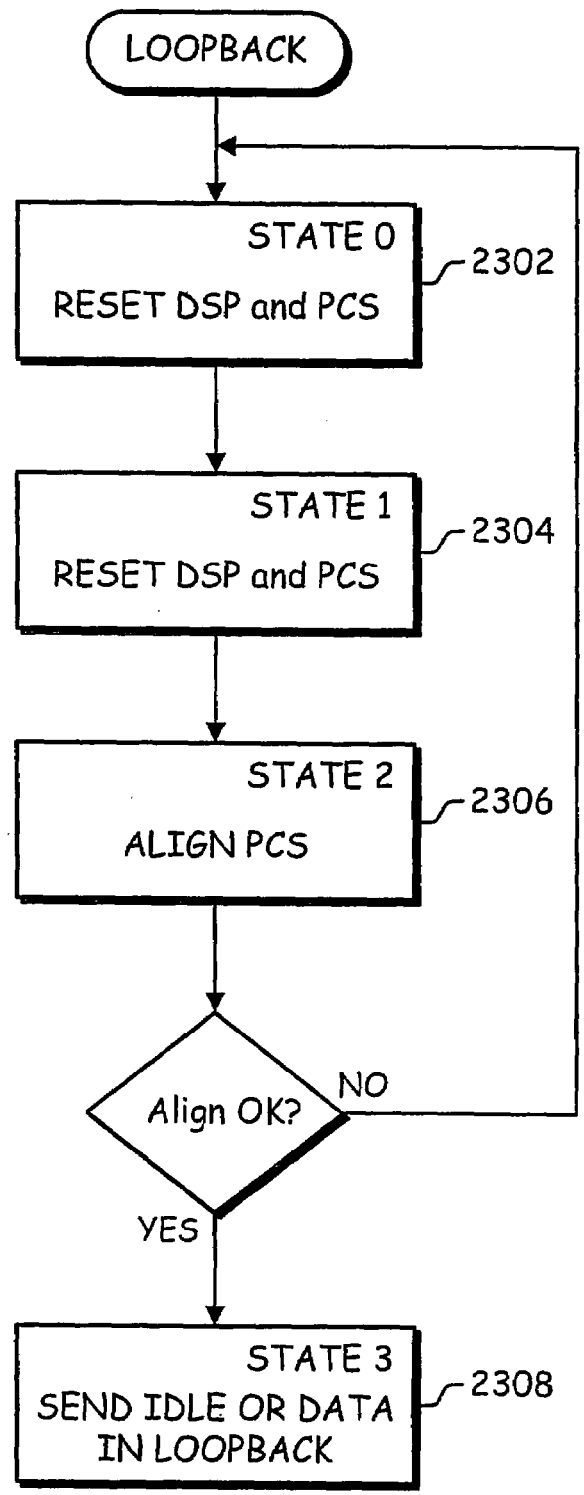
FIG. 23 shows a flowchart of the main state machine when operating in the Loopback test mode.

FIG. 23 shows a flowchart of the main state machine when operating in the Loopback test mode. Upon receiving the Loopback control signal (from Serial Management 1306, FIG. 13), the Loopback main state machine resets the DSP and the PCS modules (block 2302). Then it resets the DSP and PCS again (block 2304). Then it controls alignment function of the PCS (block 2306). If the alignment is not good, the Loopback main state machine goes back to block 2302 to start over again. If the alignment is good, the Loopback main state machine controls the sending of idle or data symbols in loopback mode (block 2308).

Figure 24:
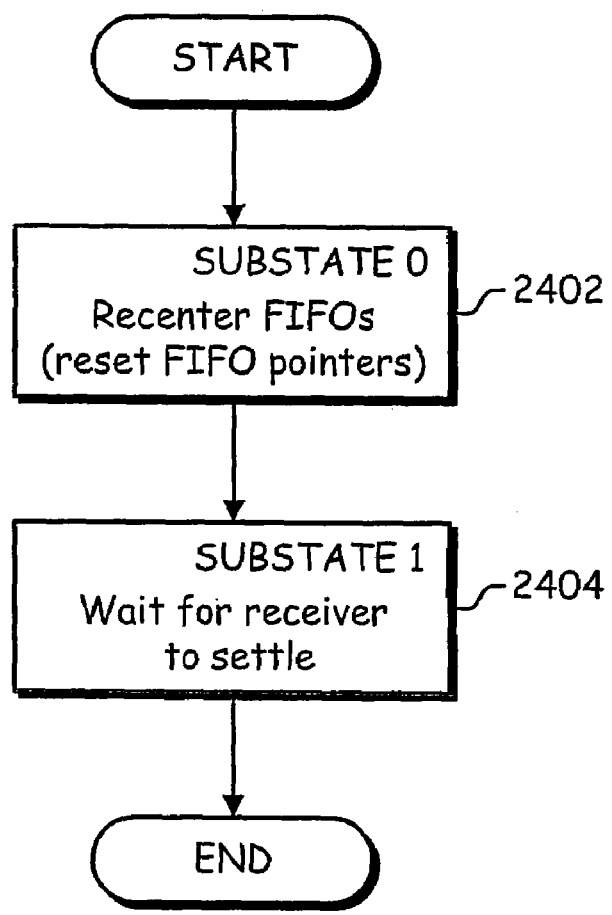
FIG. 24 shows a flowchart of the RecenterMasterFifos and the RecenterSlaveFifos substate machines.

FIG. 24 shows a flowchart of the RecenterMasterFifos and the RecenterSlaveFifos substate machines. Upon start, the substate machine re-centers the FIFOs (block 2402). Each FIFO has a read pointer and a write pointer. Each FIFO is re-centered by setting the 2 pointers such that the margin before overflow or underflow conditions is maximized. The substate machine then waits for the receiver to settle (block 2404), that is, until the burst of delay error caused by the recentering of the FIFOs decreases. During this waiting, the DFE and Timing Recovery are frozen. The substate machine then terminates.

Figure 25:
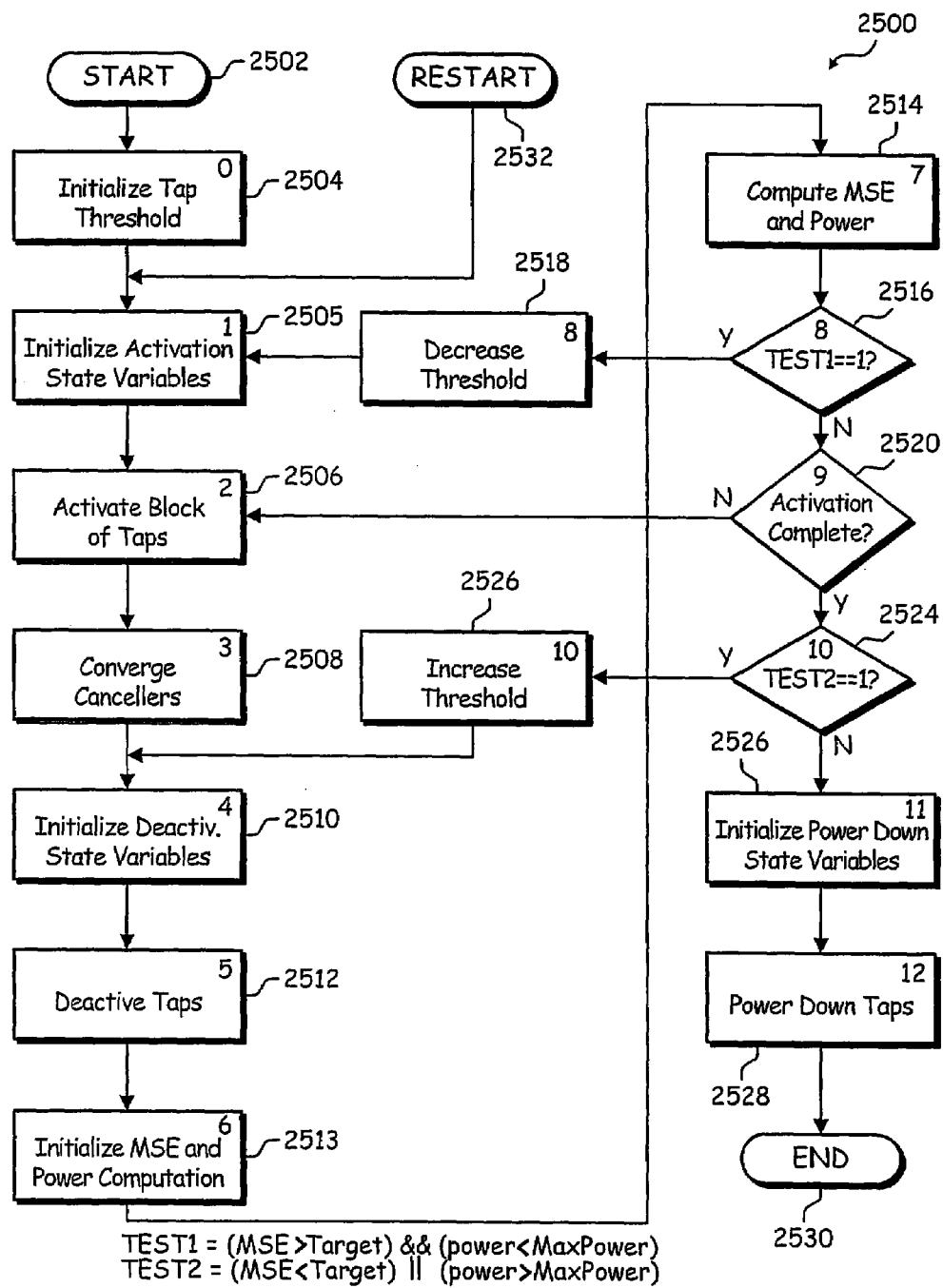
FIG. 25 shows a flowchart of the Tap Power Management state machine (TPM) 2500.

FIG. 25 shows a flowchart of the Tap Power Management state machine (TPM) 2500. Before the start of the TPM 2500, no tap coefficient is active. Upon start (block 2502), process 2500 initializes a threshold to a value (block 2504). This initial value of the threshold can result from a simulation test, or can be equal to the minimum absolute value of a tap coefficient (as known from past experiments). This value is not critical as long as it is sufficiently low to avoid a large degradation of the system performance. The TPM then initialize activation state variables (block 2505). The taps in a first block are activated (block 2506). The size of this first block, i.e., the number of taps in the first block, depends on the application. In one application, this number is 120. The coefficients of the active taps are trained with the LMS algorithm until convergence (block 2508).

The TPM initializes the deactivation state variables (block 2510). The absolute values of the active tap coefficients are compared with the threshold. The taps whose absolute values are less than the threshold are deactivated (block 2512). The TPM initializes the MSE and power metric computation (block 2513) then computes the MSE and power metric (block 2514). The TPM 2500 checks whether a first test is satisfied (block 2516). In the one embodiment of the invention, this first test is satisfied when the error metric is greater than the specified error and the power metric is smaller than the specified maximum power. If the error metric is greater than the specified error, this implies that the threshold has been set too high, causing too many taps to be deactivated, and this has degraded the system performance by more than the specified amount. If the first test is satisfied, then the TPM decreases the threshold (block 2518), initializes the activation state variables (block 2505) and activates all the taps in the block being considered again (block 2506) and proceeds with a lower threshold. Otherwise, the TPM determines whether all the taps of the filter have been considered (block 2520). If not, then the next block of taps is considered, and this new block of taps is activated (block 2506). A typical size of this next block of taps is 20. All of the active tap coefficients, including the new activated tap coefficients, are converged with an LMS algorithm (block 2508) and TPM proceeds as described above.

If all of the taps have been considered, then the TPM 2500 checks whether a second test is satisfied (block 2524). In one embodiment of the invention, the second test is satisfied when the error metric is smaller than the specified error or the power metric is larger than the specified power. If the error metric is smaller than the specified error, this implies that it is possible to increase the threshold to deactivate more taps and still meet the system performance requirement. If the power metric is greater than the specified power, then the threshold must be increased to lower the power consumption, regardless of the system performance requirement. If the second test is satisfied, then the threshold is increased (block 2526) and the TPM 2500 initializes the deactivation state variables (block 2510). Otherwise, the TPM 2500 initializes the power down state variables (block 2526), then activates the PowerDownTaps substate machine which turns off the power on the taps that are subsequent to the tap which has the last highest ordered active coefficient (block 2528). In other words, if $C_k$ is the last highest ordered active coefficient, then all the taps that have the deactivated coefficients $C_{k+1}$ through $C_{N+1}$ are powered down. More details on the PowerDownTaps substate machine in block 2528 are provided below. The TPM 2500 then terminates (block 2530).

When the TPM 2500 is restarted (block 2532), a block of taps is activated (block 2506). Upon restart of the TPM 2500, the threshold is at its last value from the last activation of the TPM 2500. The coefficients that were previously deactivated are activated with their values remaining at their last values before deactivation. Then the TPM 2500 proceeds to block 2505 as described above.

Periodic restart of the TPM 2500 is desirable for the following reason. In some cases, the echo/NEXT path impulse response may change during normal operation. For example, this change may be a result of temperature changes. To correct for this change, the TPM 2500 periodically restarts to turn on the deactivated coefficients in a sequential manner (block 2506), re-converges the coefficients (block 2508), and determines whether the previously deactivated coefficients are still below the threshold (block 2510). If the previously deactivated coefficients are now converged to values above the threshold, they remain active, otherwise they are deactivated (block 2512). Any of the initially active coefficients that now fall below the threshold are also deactivated (block 2512).

The underlying reason for activating the taps a few at a time (block 2506 through 2520) is the following. When the total number of taps is very large, the power consumption can be very large during the initial convergence transient. This peak power consumption is very undesirable, and is unaffected by the tap power regulation process (which can only reduce the average power consumption of the filters). One solution to this peak power consumption problem is to activate and converge the taps in an initial small block of taps (blocks 2506, 2508), deactivate some of the converged taps according to a criterion (block 2510 through block 2520), activate a next block of taps (block 2506), converge all the active taps including the newly activated taps (block 2508), and repeat the process of deactivation, activation and convergence until all the taps of the filter are processed.

The PowerDownTaps substate machine used in block 2528 helps further reduce the power consumption of the adaptive filters. Without block 2528, although the TPM 2500 already achieves a large reduction of the power consumption by reducing the number of active taps, there is still a significant amount of power dissipated by the long delay line of the adaptive filter. By delay line, it is meant the line connecting the delay elements together. Turning a tap off does not necessarily affect the configuration of the delay line. However, in many practical cases, many of the deactivated taps are located contiguously at the highest-ordered end of the filter. An example of such a case is when the cable is short and well behaved. In such cases, the portion of the delay line associated with these contiguously deactivated taps can be completely powered down without affecting the transfer function of the filter. This powering down contributes an additional reduction of power dissipation of the filter. In one exemplary application, this additional reduction of power dissipation is approximately 150 milliWatts (mW) per echo canceller and 20 mW per NEXT canceller, resulting in a power saving of 440 mW for the gigabit transceiver.

An exemplary implementation of block 2528 is as follows. An additional bit, called the delay line enable bit, is associated with each tap of a filter. This bit is initially ON. When the TPM 2500 reaches block 2528, all of the taps are scanned for active status starting from the highest-ordered end of the filter, i.e., the tap including the coefficient $C_{N-1}$, towards the lowest-ordered end, i.e., the tap including the coefficient $C_0$. During scanning, the delay line enable bits of the scanned inactive taps are switched OFF until the first highest-ordered active tap is found. At this point, the scanning for tap active status terminates. Then all the delay line sections corresponding to the taps whose delay line enable bits are OFF are powered down.

Figure 26:
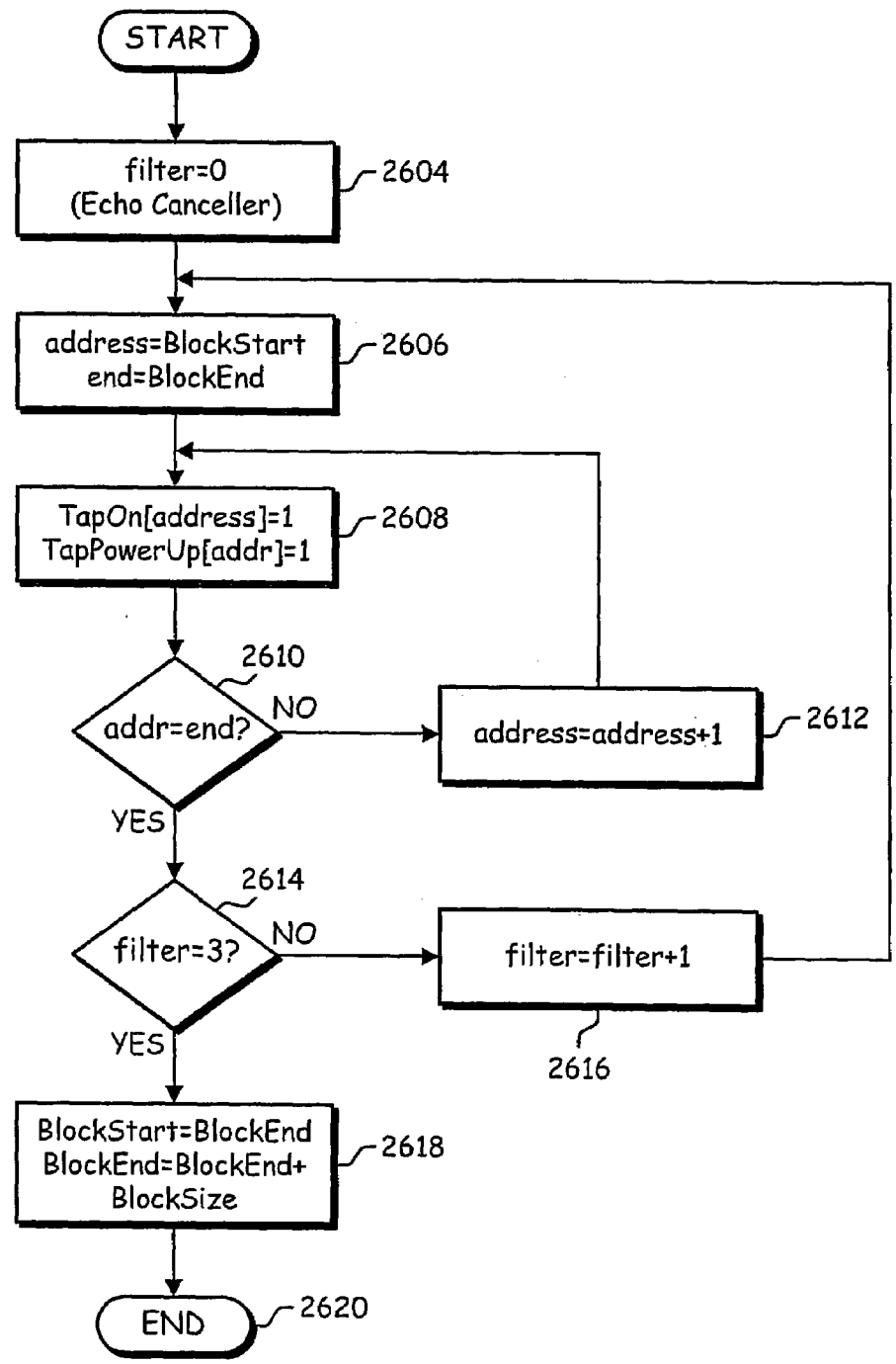
FIG. 26 illustrates the flowchart of the ActivateTaps substate machine.

The ActivateTaps substate machine used in block 2506 of FIG. 25 is applied sequentially to the echo canceller 232 and the 3 NEXT cancellers 230. FIG. 2). FIG. 26 illustrates the flowchart of the ActivateTaps substate machine.

Referring to FIG. 26, upon start, the ActivateTaps substate machine sets the filter number to zero (block 2604) to operate on the echo canceller. The filter number zero represents the echo canceller, while filter numbers 1 through 3 represent the 3 NEXT cancellers, respectively. The ActivateTaps substate machine then sets the address and the end equal to the start address and the end address of the block of taps, respectively (block 2606). The modules TapOn and Tap PowerUp are invoked with the address as argument (block 2608). The module TapOn turns on the circuitry of the tap having the specified address. This circuitry includes a 1-bit storage to indicate the active status of the tap. When the tap is turned on, the tap is included in the computation of the output of the filter, and in the adaptation process, i.e., the training and convergence of the filter coefficients. The module TapPowerUp turns the power on for the delay line section associated with the tap having the specified address. The ActivateTaps substate machine then determines whether the address is equal to the end. If it is not, then the address is increased by one (block 2612), to consider the next tap of the filter. If the address has reached the end address of the block of taps, then the ActivateTaps substate machine determines whether filter number is equal to 3, i.e., whether all the filters in the transceiver have been considered (block 2614). If not, then filter number is increased by one, so that the next filter is considered. If all the filters have been operated on, then the ActivateTaps substate machine sets the start address equal to the old end address, and sets the new end address equal to the sum of the old end address and the block size, the block size being the size of the next block of taps to be activated (block 2618). The ActivateTaps substate machine then terminates (block 2620).

Figure 27:
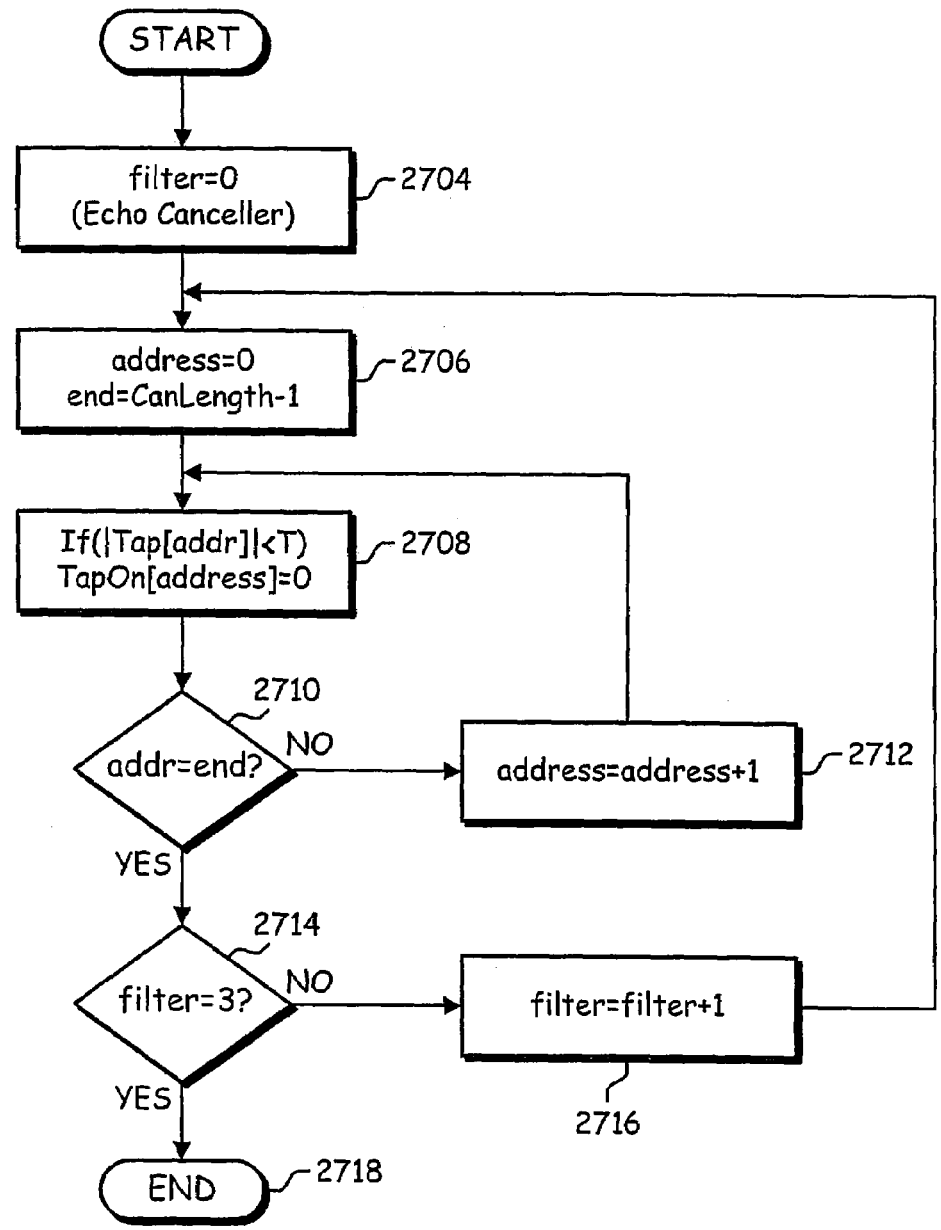
FIG. 27 illustrates the flowchart of the DeactivateTaps substate machine.

The DeactivateTaps substate machine invoked in block 2512 of FIG. 25 operates sequentially on the echo canceller 232 and the 3 NEXT cancellers 230 (of FIG. 2). FIG. 27 illustrates the flowchart of the DeactivateTaps substate machine.

Referring to FIG. 27, upon start, the DeactivateTaps substate machine sets the filter number to zero (block 2704) to operate on the echo canceller. The filter number zero represents the echo canceller, while filter numbers 1 through 3 represent the 3 NEXT cancellers, respectively. The DeactivateTaps substate machine then sets the address equal to zero and the end equal to the length of the filter minus 1 (block 2706). If the absolute value of the tap coefficient at the specified address is less than T, the threshold, then the module TapOn is invoked to turn off the circuitry associated with the tap having the specified address (block 2708). When the tap is turned off, the tap is removed from the computation of the output of the filter, and from the adaptation process, i.e., the training and convergence of the filter coefficients. The DeactivateTaps substate machine then determines whether the address is equal to the end. If it is not, then the tap address is increased by one (block 2712), to consider the next tap of the filter. If the address has reached the end of the filter taps, then the DeactivateTaps substate machine determines whether filter number is equal to 3, i.e., whether all the filters in the transceiver have been considered (block 2714). If not, then filter number is increased by one, so that the next filter is considered (block 2716). If the DeactivateTaps substate machine has operated on all the filters, then process 2512 terminates (block 2718).

Figure 28:
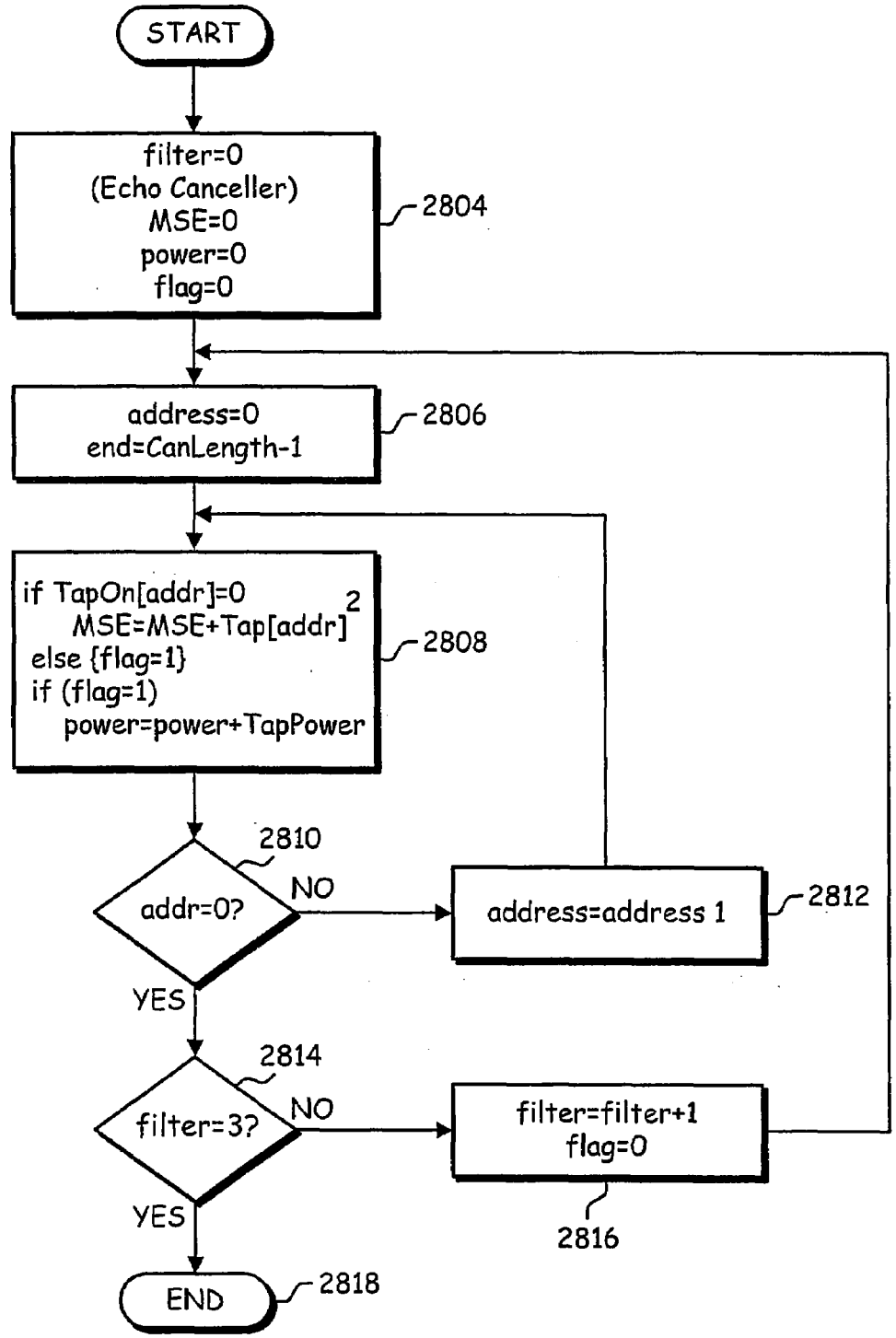
FIG. 28 illustrates a flowchart of the EstimateMSE substate machine.

The EstimateMSE substate machine invoked in block 2514 of FIG. 25 operates sequentially on the echo canceller 232 and the 3 NEXT cancellers 230 (of FIG. 2). FIG. 28 illustrates a flowchart of the EstimateMSE substate machine.

Referring to FIG. 28, upon start, the EstimateMSE substate machine sets the filter number to zero (block 2804) to operate on the echo canceller, and initializes the error metric MSE, the power metric and the flag. The filter number zero represents the echo canceller, while filter numbers 1 through 3 represent the three NEXT cancellers, respectively. The EstimateMSE substate machine then sets the address equal to the length of the filter minus 1 (block 2806) to scan the filter taps from the highest ordered end. The reason for using this scanning order and the flag is to ensure that the taps that will be powered down in block 2528 of FIG. 25 will be excluded from the computation of the power metric. A deactivated tap still consumes a small amount of power if it is not actually powered down because of the associated delay line section. To compute the new power metric such that it can be used to accurately regulate the power consumption of the system, the EstimateMSE substate machine must exclude from the computation the power consumption of a deactivated tap that will be powered down.

If TapOn[addr] is zero, i.e., if the tap at the specified address is turned off, then EstimateMSE substate machine computes the new error metric MSE by adding to the previous value of MSE the squared value of the tap coefficient at the specified address. Otherwise, if the tap at the specified address is on, then the flag is set to 1. If the flag is 1, then EstimateMSE substate machine computes the new power metric by adding to the previous value of the power metric the estimated power consumption TapPower of the tap having the specified address (block 2808). TapPower is chosen from precomputed values stored in a look-up table. These precomputed values are functions of the size of the coefficients and of the active or inactive status of the coefficient.

EstimateMSE substate machine determines whether the address is 0 (block 2810). If it is not, then the tap address is decreased by one (block 2812), to consider the next tap of the filter. If the address has reached 0, then EstimateMSE substate machine determines whether filter number is equal to 3, i.e., whether all the filters in the transceiver have been considered (block 2814). If not, then filter number is increased by one, so that the next filter is considered and the flag is reset to 0 (block 2816). If EstimateMSE substate machine has operated on all the filters, then it terminates (block 2818).

Figure 29:
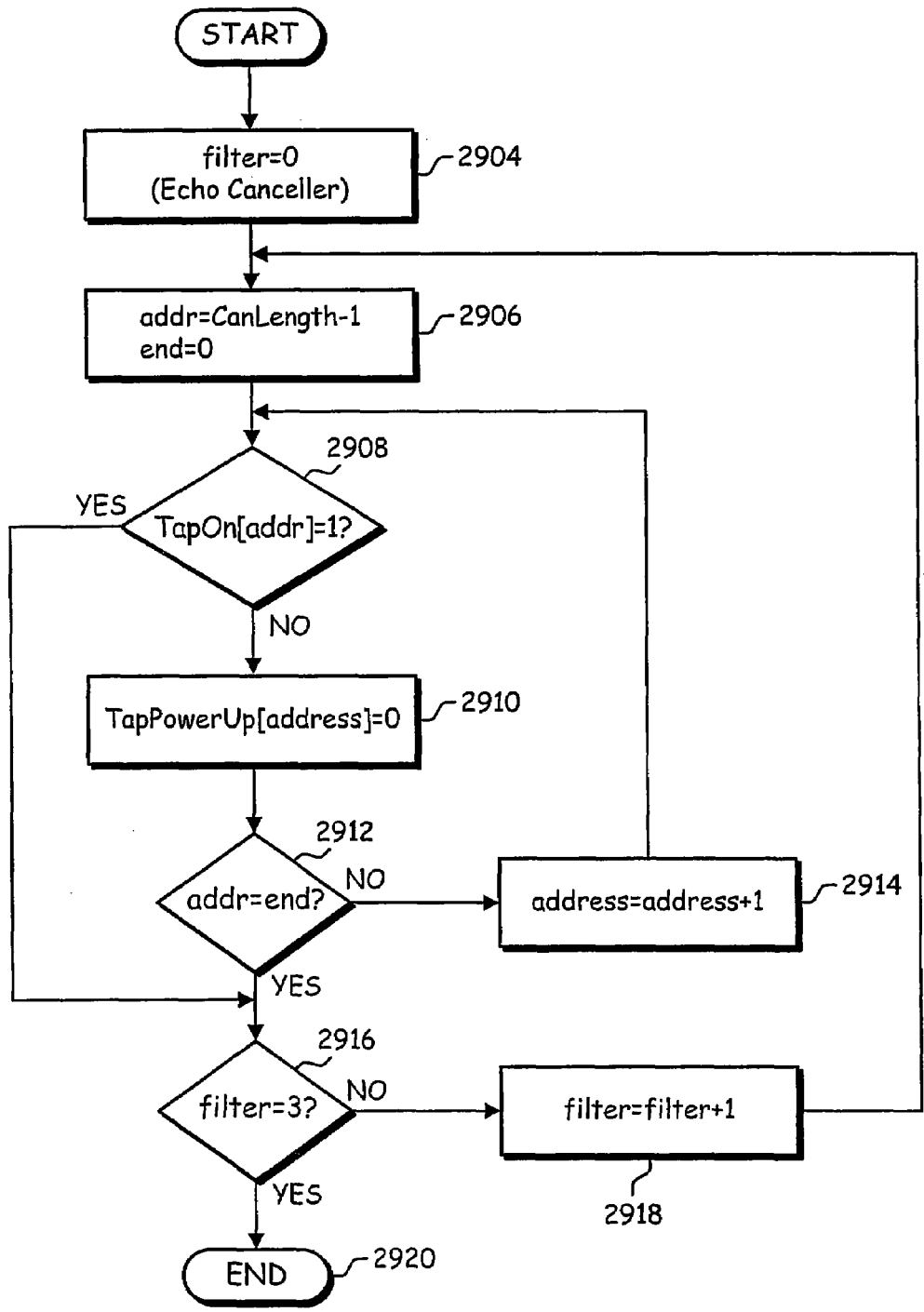
FIG. 29 shows the flowchart of the PowerDownTaps substate machine.

The PowerDownTaps substate machine invoked in block 2528 of FIG. 25 operates sequentially on the echo canceller 232 and the 3 NEXT cancellers 230 (FIG. 2). FIG. 29 shows the flowchart of the PowerDownTaps substate machine.

Referring to FIG. 29, upon start, the PowerDownTaps substate machine sets the filter number to zero (block 2904) to operate on the echo canceller first. The filter number zero represents the echo canceller, while filter numbers 1 through 3 represent the 3 NEXT cancellers, respectively. The PowerDownTaps substate machine then sets the address equal to the length of the filter minus 1 and the end equal to zero (block 2906). This means that the PowerDownTaps substate machine starts from the highest ordered end of the filter towards the lowest ordered end.

The PowerDownTaps substate machine determines whether TapOn[addr] is 1, i.e., whether the tap at the specified address is active (block 2908). If the tap is not active, then PowerDownTaps substate machine turns off the power to the tap (block 2910), then checks whether the address is equal to the end (block 2912). If the address is not equal to the end, the address is decreased by 1 to consider the next lower ordered tap (block 2914). If the address has reached the end, then the PowerDownTaps substate machine determines whether the filter number is 3, i.e., whether all the 4 filters have been considered (block 2916). If the filter is not the last one, then filter number is increased by 1 so that the next filter is considered (block 2918). Otherwise, the PowerDownTaps substate machine terminates (block 2920).

If TapOn[addr] is 1 (block 2908), i.e., if the tap at the specified address is active, then the PowerDownTaps substate machine stops scanning the taps in the filter being considered, and checks the next filter, if any (block 2916). The substate machine then proceeds from block 2916 as described above.

The PowerDownTaps substate machine of FIG. 25 operates on the echo and NEXT cancellers of each of the 4 constituent transceivers of the gigabit transceiver 102 depicted in FIGS. 1 and 2. It is important to note that, if the PowerDownTaps substate machine operates simultaneously on the 4 constituent transceivers there will be a power demand surge in the gigabit transceiver 102. In order to avoid such a power demand surge, the PowerDownTaps substate machine operates on the 4 transceivers in a time-staggered manner.

Some important state machines and substate machines of the PHY Control module have been described in detail above. These serve as illustrations of some of the functions of the PHY Control module, and do not form an exhaustive list of the state machines of the PHY Control module.

While certain exemplary embodiments have been described in detail and shown in the accompanying drawings, it is to be understood that such embodiments are merely illustrative of and not restrictive on the broad invention. It will thus be recognized that various modifications may be made to the illustrated and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope and spirit of the invention as defined by the appended claims.

What is claimed is:

1. A method for controlling convergence of cancellers, a decision feedback equalizer (DFE) and a timing recovery module, the method comprising the operation of:
    (a) decoupling the timing recovery module from the cancellers and the DFE while converging the cancellers and the DFE at the same time.

2. The method of claim 1 further comprises the operation of:

(b) after the cancellers and the DFE have converged, recoupling the timing recovery module with the cancellers and the DFE and converging the cancellers, the DFE and the timing recovery module at the same time.

3. The method of claim 1 wherein the operation (a) comprises the operation of ramping up very slowly and linearly a phase output of the timing recovery module.

4. A control module for controlling convergence of cancellers, a decision feedback equalizer (DFE) and a timing recovery module, the control module comprising a state machine operable to decouple the timing recovery module from the cancellers and the DFE while converging the cancellers and the DFE at the same time.

5. The control module of claim 4 wherein, after converging the cancellers and the DFE at the same time, the state machine is operable to recouple the timing recovery module with the cancellers and the DFE and to converge the cancellers, the DFE and the timing recovery module at the same time.

6. The control module of claim 4 wherein the state machine de-couples the timing recovery module by ramping up very slowly and linearly a phase output of the timing recovery module.

* * * * *